(12) United States Patent
Ni et al.

(10) Patent No.: US 8,241,047 B2
(45) Date of Patent: Aug. 14, 2012

(54) FLASH DRIVE WITH SPRING-LOADED SWIVEL CONNECTOR

(75) Inventors: Jim Chin-Nan Ni, San Jose, CA (US); Abraham C. Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 408 days.

(21) Appl. No.: 12/629,002

(22) Filed: Dec. 1, 2009

(65) Prior Publication Data

US 2010/0075517 A1 Mar. 25, 2010

Related U.S. Application Data

(63) Continuation-in-part of application No. 12/361,772, filed on Jan. 29, 2009, now Pat. No. 7,869,219, and a continuation-in-part of application No. 11/929,857, filed on Oct. 30, 2007, now Pat. No. 8,095,971.

(51) Int. Cl.
*H01R 13/44* (2006.01)
(52) U.S. Cl. ...................................................... 439/131
(58) Field of Classification Search .................. 439/131, 439/135, 660, 752, 76.1; 710/313; 361/684, 361/752
See application file for complete search history.

(56) References Cited

U.S. PATENT DOCUMENTS

| | | |
|---|---|---|
| 4,582,985 A | 4/1986 | Lofberg |
| 4,630,201 A | 12/1986 | White |
| 4,766,293 A | 8/1988 | Boston |
| 4,833,554 A | 5/1989 | Dalziel et al. |
| 4,926,480 A | 5/1990 | Chaum |
| 5,020,105 A | 5/1991 | Rosen et al. |
| 5,180,901 A | 1/1993 | Hiramatsu |
| 5,280,527 A | 1/1994 | Gullman et al. |
| 5,404,485 A | 4/1995 | Ban |
| 5,430,859 A | 7/1995 | Norman et al. |
| 5,479,638 A | 12/1995 | Assar et al. |
| 5,623,552 A | 4/1997 | Lane |
| 5,797,771 A | 8/1998 | Garside |
| 5,835,760 A | 11/1998 | Harmer |
| 5,899,773 A | 5/1999 | Cheng |
| 5,907,856 A | 5/1999 | Estakhri et al. |
| 5,959,541 A | 9/1999 | DiMaria et al. |
| 5,984,731 A | 11/1999 | Laity |
| 6,000,006 A | 12/1999 | Bruce et al. |

(Continued)

FOREIGN PATENT DOCUMENTS

JP 63-163589 A 7/1988
(Continued)

*Primary Examiner* — Beemnet Dada
(74) *Attorney, Agent, or Firm* — Bever, Hoffman & Harms, LLP; Patrick T. Bever

(57) ABSTRACT

A swivel-type computer peripheral device includes a housing and a swivel rack assembly that swivels relative to the housing between a retracted position, in which a PCBA having a plug connector mounted on the swivel rack assembly is disposed inside the housing, and a deployed position, in which the swivel rack assembly is rotated outside of the housing such that the plug connector is positioned for insertion into a host computer socket. A torsion spring is connected between the housing and the swivel rack assembly and arranged to bias the swivel rack assembly either into the deployed position or into the retracted position. A locking mechanism controlled by a push button or another actuating mechanism is used to selectively lock the swinging rack in a retracted position and a deployed position.

16 Claims, 37 Drawing Sheets

U.S. PATENT DOCUMENTS

| | | | |
|---|---|---|---|
| 6,012,636 | A | 1/2000 | Smith |
| 6,044,428 | A | 3/2000 | Rayabhari |
| 6,069,920 | A | 5/2000 | Schulz et al. |
| 6,069,970 | A | 5/2000 | Salatino et al. |
| 6,081,858 | A | 6/2000 | Abudayyeh et al. |
| 6,125,192 | A | 9/2000 | Bjorn et al. |
| 6,132,243 | A | 10/2000 | Hirata et al. |
| 6,148,354 | A | 11/2000 | Ban et al. |
| 6,159,039 | A | 12/2000 | Wu |
| 6,193,152 | B1 | 2/2001 | Fernando et al. |
| 6,202,138 | B1 | 3/2001 | Estakhri et al. |
| 6,230,233 | B1 | 5/2001 | Lofgren et al. |
| 6,275,894 | B1 | 8/2001 | Kuo et al. |
| 6,279,955 | B1 | 8/2001 | Fisher |
| 6,292,863 | B1 | 9/2001 | Terasaki et al. |
| 6,321,478 | B1 | 11/2001 | Klebes |
| 6,334,793 | B1 | 1/2002 | Amoni et al. |
| 6,438,638 | B1 | 8/2002 | Jones et al. |
| 6,456,500 | B1 | 9/2002 | Chen |
| 6,480,390 | B2 | 11/2002 | Matsumiya et al. |
| 6,547,130 | B1 | 4/2003 | Shen |
| 6,554,648 | B2 | 4/2003 | Shi et al. |
| 6,567,273 | B1 | 5/2003 | Liu et al. |
| 6,615,404 | B1 | 9/2003 | Garfunkel et al. |
| 6,618,243 | B1 | 9/2003 | Tirosh |
| 6,636,929 | B1 | 10/2003 | Frantz et al. |
| 6,718,407 | B2 | 4/2004 | Martwick |
| 6,737,591 | B1 | 5/2004 | Lapstun et al. |
| 6,743,030 | B2 | 6/2004 | Lin et al. |
| 6,763,410 | B2 | 7/2004 | Yu |
| D494,969 | S | 8/2004 | Lin |
| 6,778,401 | B1 | 8/2004 | Yu et al. |
| 6,792,487 | B2 | 9/2004 | Kao |
| 6,808,400 | B2 | 10/2004 | Tu |
| 6,854,984 | B1 | 2/2005 | Lee et al. |
| 6,880,024 | B2 | 4/2005 | Chen et al. |
| 7,004,780 | B1 | 2/2006 | Wang |
| 7,021,971 | B2 | 4/2006 | Chou et al. |
| 7,044,802 | B2 | 5/2006 | Chiou et al. |
| 7,069,370 | B2 | 6/2006 | Sukegawa et al. |
| 7,074,052 | B1 | 7/2006 | Ni et al. |
| 7,090,541 | B1 | 8/2006 | Ho |
| 7,097,472 | B2 | 8/2006 | Parker |
| 7,103,684 | B2 | 9/2006 | Chen et al. |
| 7,103,765 | B2 | 9/2006 | Chen |
| 7,104,848 | B1 | 9/2006 | Chou et al. |
| 7,125,287 | B1 | 10/2006 | Chou et al. |
| 7,155,545 | B1 | 12/2006 | Wang |
| 7,182,646 | B1 | 2/2007 | Chou et al. |
| 7,214,075 | B2 | 5/2007 | He et al. |
| 7,249,978 | B1 | 7/2007 | Ni |
| 7,257,714 | B1 | 8/2007 | Shen |
| 7,259,967 | B2 | 8/2007 | Ni |
| 7,264,992 | B2 | 9/2007 | Hsueh et al. |
| 7,359,208 | B2 | 4/2008 | Ni |
| 7,361,059 | B2 | 4/2008 | Harkabi et al. |
| 7,407,393 | B2 | 8/2008 | Ni et al. |
| 7,420,803 | B2 | 9/2008 | Hsueh et al. |
| 8,095,971 | B2 * | 1/2012 | Nguyen et al. ............ 726/9 |
| 2001/0043174 | A1 | 11/2001 | Jacobsen et al. |
| 2002/0036922 | A1 | 3/2002 | Roohparvar |
| 2002/0166023 | A1 | 11/2002 | Nolan et al. |
| 2003/0046510 | A1 | 3/2003 | North |
| 2003/0100203 | A1 | 5/2003 | Yen |
| 2003/0163656 | A1 | 8/2003 | Ganton |
| 2003/0177300 | A1 | 9/2003 | Lee et al. |
| 2003/0182528 | A1 | 9/2003 | Ajiro |
| 2004/0034765 | A1 | 2/2004 | James |
| 2004/0148482 | A1 | 7/2004 | Grundy et al. |
| 2004/0153595 | A1 | 8/2004 | Sukegawa et al. |
| 2004/0255054 | A1 | 12/2004 | Pua et al. |
| 2005/0009388 | A1 | 1/2005 | Chao |
| 2005/0085133 | A1 | 4/2005 | Wang et al. |
| 2005/0102444 | A1 | 5/2005 | Cruz |
| 2005/0114587 | A1 | 5/2005 | Chou et al. |
| 2005/0120146 | A1 | 6/2005 | Chen et al. |
| 2005/0160213 | A1 | 7/2005 | Chen |
| 2005/0182858 | A1 | 8/2005 | Lo et al. |
| 2005/0193161 | A1 | 9/2005 | Lee et al. |
| 2005/0193162 | A1 | 9/2005 | Chou et al. |
| 2005/0216624 | A1 | 9/2005 | Deng et al. |
| 2005/0246243 | A1 | 11/2005 | Adams et al. |
| 2005/0268082 | A1 | 12/2005 | Poisner |
| 2005/0271458 | A1 | 12/2005 | Kui |
| 2006/0065743 | A1 | 3/2006 | Fruhauf |
| 2006/0075174 | A1 | 4/2006 | Vuong |
| 2006/0106962 | A1 | 5/2006 | Woodbridge et al. |
| 2006/0161725 | A1 | 7/2006 | Lee et al. |
| 2006/0184709 | A1 | 8/2006 | Sukegawa et al. |
| 2006/0206702 | A1 | 9/2006 | Fausak |
| 2006/0234533 | A1 | 10/2006 | Lei et al. |
| 2006/0242395 | A1 | 10/2006 | Fausak |
| 2007/0079043 | A1 | 4/2007 | Yu et al. |
| 2007/0094489 | A1 | 4/2007 | Ota et al. |
| 2007/0113067 | A1 | 5/2007 | Oh et al. |
| 2007/0113267 | A1 | 5/2007 | Iwanski et al. |
| 2007/0130436 | A1 | 6/2007 | Shen |
| 2008/0019090 | A1 * | 1/2008 | Zhu et al. ............ 361/684 |

FOREIGN PATENT DOCUMENTS

| | | | |
|---|---|---|---|
| JP | 02-118790 A | 5/1990 | |
| JP | 11-039483 | 2/1999 | |

* cited by examiner

Data structure of PLTPPPUI in Reserved Area of MLC Flash Memory 420

Old physical block (PBK#1000) for storing PLTPPPUI0 422

| | | 427 | 442 | 446 |
|---|---|---|---|---|
| 1st Write (P0) 424a | Entry 0 | Entry 1 | FF | Special Logical Address for PLTPPPUI0 | 1 |
| 2nd Write (P1) 424b | Entry 0 | Entry 1 | ** | | |
| ** | | | | | |
| nth Write (Pn) 424n | Entry 0 | Entry 1 | ** | | |

New physical block (PBK#1012) for storing PLTPPPUI0 432

| | | | | |
|---|---|---|---|---|
| (n+1)th Write (P0) 434 | Entry 0 | Entry 1 | ** | Special Logical Address for PLTPPPUI0 | 2 |
| | | | FF | | |
| | | | | | |
| | | | | | |

FIG. 4C

Data Structure of the PLTPPUI Tracking Table 440

|  | Physical Block Number 444 | Tracking No. (TN) 446 | Highest Page 448 |
|---|---|---|---|
| Special Logical Address for PLTPPUI0 | 1012 | 0 | 0 |
| Special Logical Address for PLTPPUI1 | 1018 | 5 | 1 |
| ⋮ |  |  |  |
| Special Logical Address for PLTPPUIN | 1005 | 4 | 0 |

442 brackets the middle rows.

FIG. 4D

Data Structure of the WL/BB Tracking Table 450

|  | Physical Block Number 454 | Tracking No. (TN) 456 | Highest Page 458 |
|---|---|---|---|
| Special Logical Address for WL/BB0 | 1023 | 1 | 5 |
| Special Logical Address for WL/BB1 | 1020 | 0 | 3 |
| ⋮ |  |  |  |
| Special Logical Address for WL/BBn | 1021 | 3 | 7 |

452 brackets the middle rows.

FIG. 4E

Data Structure of the WL/BB Tracking Table in Reserved Area of Flash Memory 460

| | | | | | 467 452 456 |
|---|---|---|---|---|---|
| 1st White (P0) | BK0 (reserved) | BK1 WL | | | BK7 BB FFFF FFEE | F F | Special Logical Address for WL/BB1 | 1 |
| 2nd White (P1) | | BK1 WL_old | BK3 WL new | | | | | |
| 3rd White (P2) | | BK1 WL_old | BK3 WL old | BK5 WL new | | | | |
| • • | | | | | | | | |
| nth White (Pn) | | | | | | | | |

| | | | | F F | Special Logical Address for WL/BB2 | 1 |
|---|---|---|---|---|---|---|
| 1st White (P0) | BK 1000 WL new | | BK 1003 BB | | | |
| 2nd White (P1) | BK 1000 WL old | BK 1021 WL new | | BK 1000 WL new | | |
| • • | | | | | | |
| nth White (Pn) | | | | | | |

*FIG. 4F*

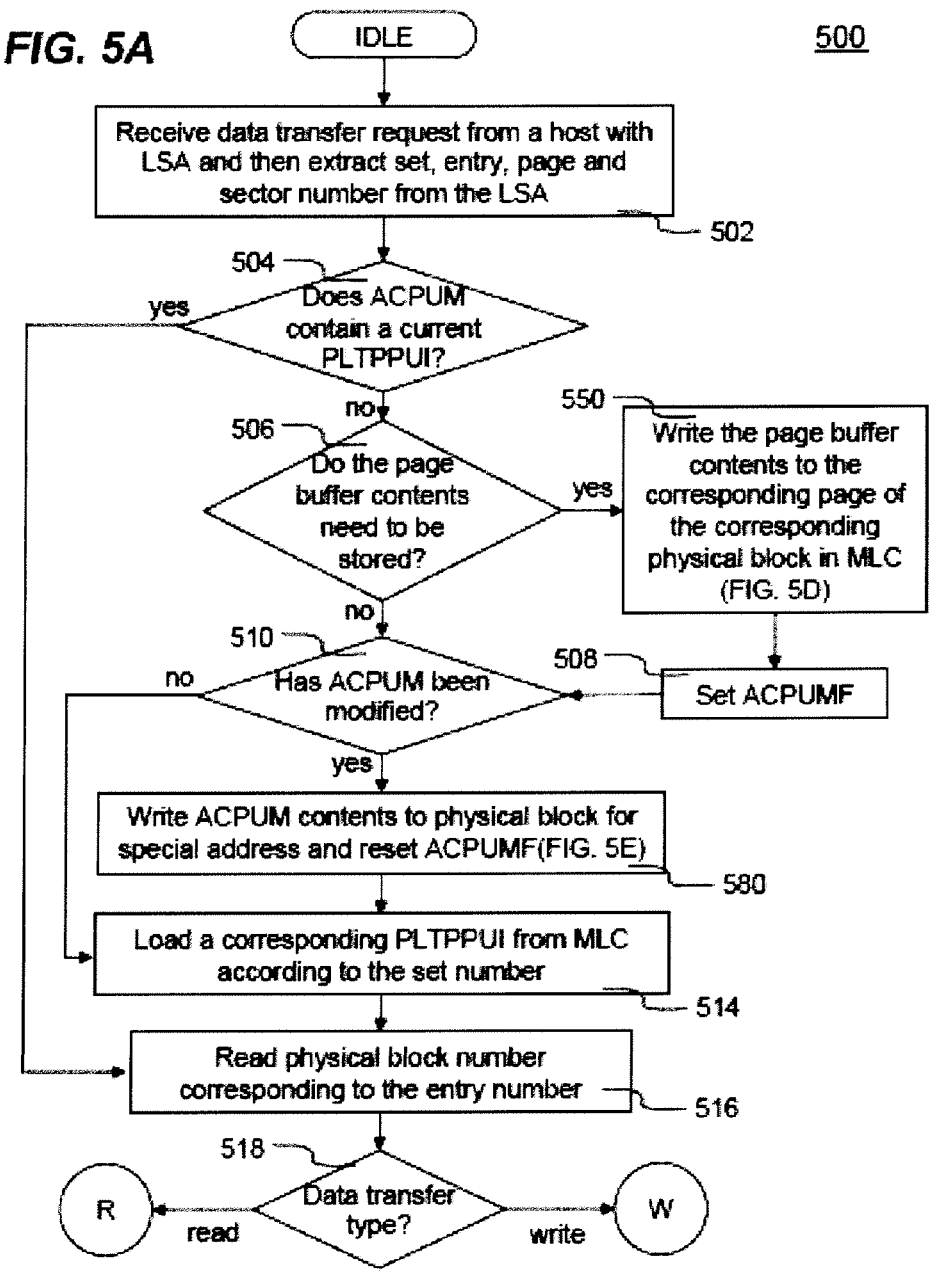

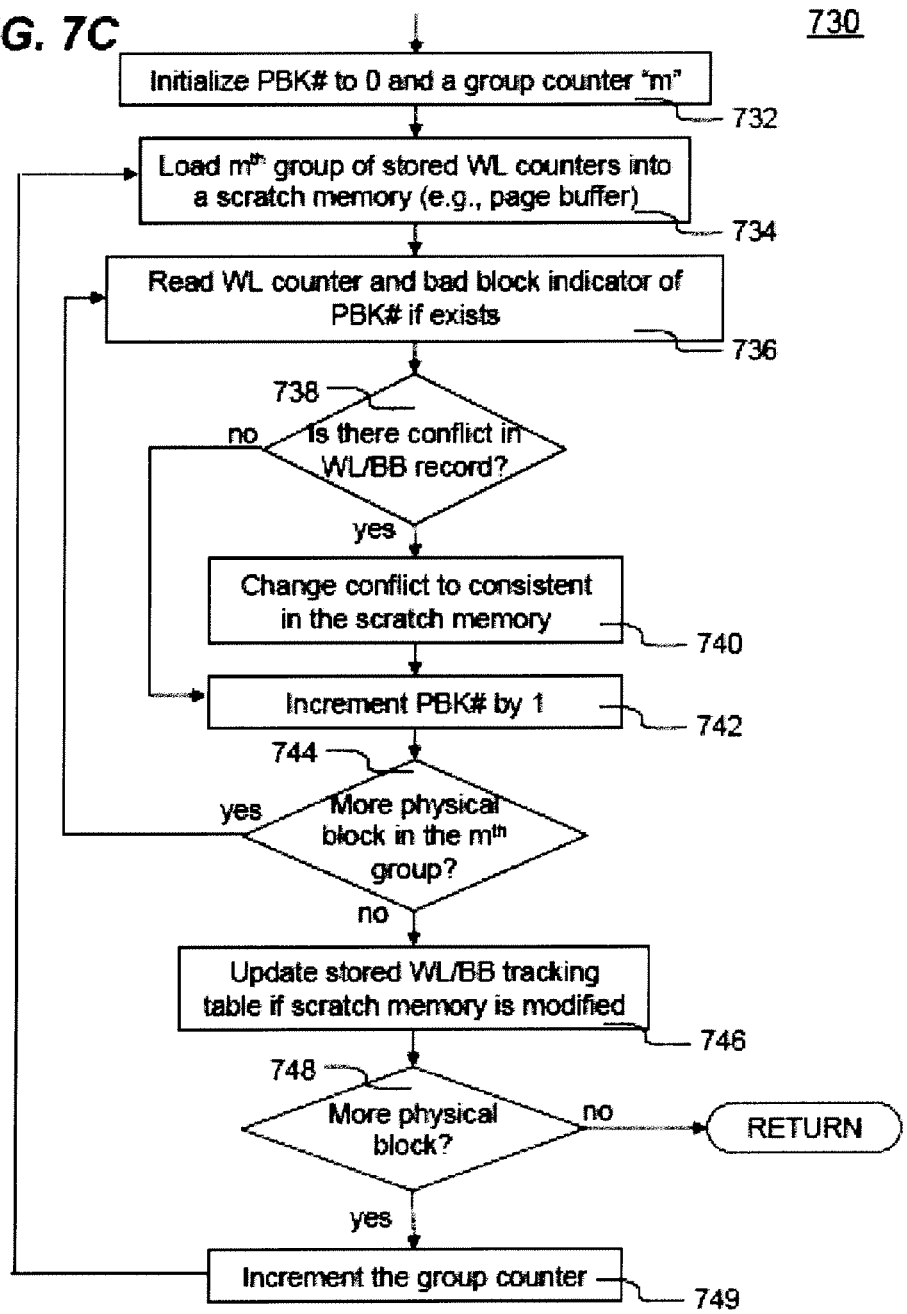

FLASH DRIVE WITH SPRING-LOADED SWIVEL CONNECTOR

RELATED APPLICATIONS

This application is a continuation-in-part (CIP) of co-pending U.S. patent application for "Flash Drive With Spring-Loaded Retractable Connector", Ser. No. 12/361,772, filed Jan. 29, 2009.

This application is also a (CIP) of co-pending U.S. patent application for "Universal Serial Bus (USB) Flash Drive Having Locking Pins and Locking Grooves for Locking Swivel Cap", Ser. No. 11/929,857, filed Oct. 30, 2007.

BACKGROUND OF THE INVENTION

1. Field of the Invention

The invention relates to flash memory devices, more particularly to systems and methods of managing memory addresses in a large capacity multi-level cell (MLC) based flash memory device.

2. Description of the Related Art

As flash memory technology becomes more advanced, flash memory is replacing traditional magnetic disks as storage media for mobile systems. Flash memory has significant advantages over floppy disks or magnetic hard disks such as having high-G resistance and low power dissipation. Because of the smaller physical size of flash memory, they are also more conducive to mobile systems. Accordingly, the flash memory trend has been growing because of its compatibility with mobile systems and low-power feature. However, advances in flash technology have created a greater variety of flash memory device types that vary for reasons of performance, cost and capacity. As such, a problem arises when mobile systems that are designed for one type of flash memory are constructed using another, incompatible type of flash memory.

New generation personal computer (PC) card technologies have been developed that combine flash memory with architecture that is compatible with the Universal Serial Bus (USB) standard. This has further fueled the flash memory trend because the USB standard is easy to implement and is popular with PC users. In addition, flash memory is replacing floppy disks because flash memory provides higher storage capacity and faster access speeds than floppy drives.

In addition to the limitations introduced by the USB standard, there are inherent limitations with flash memory. First, flash memory sectors that have already been programmed must be erased before being reprogrammed. Also, flash memory sectors have a limited life span; i.e., they can be erased only a limited number of times before failure. Accordingly, flash memory access is slow due to the erase-before-write nature and ongoing erasing will damage the flash memory sectors over time.

To address the speed problems with USB-standard flash memory, hardware and firmware utilize existing small computer systems interface (SCSI) protocols so that flash memory can function as mass-storage devices similarly to magnetic hard disks. SCSI protocols have been used in USB-standard mass-storage devices long before flash memory devices have been widely adopted as storage media. Accordingly, the USB standard has incorporated traditional SCSI protocols to manage flash memory.

As the demands for larger capacity storage increase, the flash memory device needs to keep up. Instead of using single-level cell flash memory, which stores one-bit of information per cell, multi-level cell (MLC) flash memory, or hybrid flash memory, which is assembled partially SLC and partially MLC, is used. The MLC flash memory allows at least two bits per cell. However, there are a number of problems associated with the MLC flash memory. First, the MLC flash memory has a low reliability. Secondly, the MLC flash memory data programming rules require writing to an ascending page in the same block or writing to a blank new page if there are data existed in the original page. Finally, a larger capacity requires a large logical-to-physical address look up table. In the prior art approach, the size look up table is in direct portion with the capacity of the flash memory. This creates a huge problem not only to the cost, but also to the physical size of the flash memory device. Furthermore, the traditional usage of the flash memory devices is generally in a very clean and relatively mild environment, thus the packaging design such as enclosure of the flash memory device is not suitable for hostile environment such as military and heavy industrial applications.

Modern portable computer peripheral devices for storing confidential data take many mechanical forms. In most cases, such peripheral devices have been reduced to "pocket size", meaning that they can literally be carried in a user's pocket in the same manner as a wallet or set of keys. One example of particular interest is a pen-type flash device having a USB connector plug that can be connected to a USB port of a standard computer. The USB plug connector is protected by a removable cover when not in use. A problem with convention pen-type peripheral devices is that the removable cover can become inadvertently lost while the device is in use, thereby leaving the USB plug connector exposed to damage or contamination.

An alternative to conventional pen-type peripheral devices is a "press-push" memory device, which provides a connector that retracts into a housing of the memory device for protection when not in use. A device with a retractable connector generally has a button feature on the outside of its housing that allows a user to manually slide the connector between a retracted position and an extended (deployed) position. In the extended position, the connector extends through an opening in the housing so that it may be plugged into a receptacle. In the retracted position, the connector is contained within the housing and is protected by the housing, thereby obviating the need for a separate cap that can be lost.

Although "press-push" memory devices avoid the problems of conventional pen-type peripheral devices, e.g., by avoiding the need for a separate cap, the molded plastic used to produce these devices can become worn over a relatively short amount of time, leading to undesirable resistance or jamming that prevents the desired retraction of the connector when not in use.

Therefore, it would be desirable to have improved methods and systems of managing memory addresses in a large capacity multi-level cell (MLC) flash memory device. What is also needed is a portable computer peripheral apparatus for housing a large capacity multi-level cell (MLC) flash memory device that overcomes the problems associated with conventional press-push memory devices.

SUMMARY OF THE INVENTION

Methods and systems of managing memory addresses in a large capacity multi-level cell (MLC) based flash memory device are disclosed. According to one aspect of the present invention, a MLC based flash memory device comprises a card body with a processing unit, an input/output (I/O) circuit and at least one MLC flash memory chip mounted thereon. The card body may comprise a print circuit board (PCB). The I/O circuits generally are coupled to the processing unit in form of an integrated circuit. The processing unit manages data transfers between a host computing device (e.g., personal computer, consumer electronic device) and the at least one flash memory chip. The MLC based flash memory chip is configured to provide data storage for the host.

The present invention is particularly directed to a swivel-type portable computer peripheral device (apparatus) for safely transporting a MLC based flash memory chip (device) in which a plug connector (e.g., a USB plug connector) is electrically connected to the MLC based flash memory device and is mounted on a swivel rack assembly that is pivotable (swivelable) between a retracted position inside a housing and a deployed position outside the housing through a side opening defined by the housing by way of a torsion spring (resilient torsion member) that biases the swivel rack assembly either into or out of the housing. A locking mechanism is provided to secure the swivel rack assembly in the retracted and deployed positions. The torsion spring, which is preferably a coil wire spring, is coupled to one of the swivel rack assembly and at its other end to the housing. In a spring-loaded extension embodiment, the torsion spring acts to bias the swivel rack assembly from the retracted position to the deployed position upon de-activation of the locking mechanism. Conversely, in a spring-loaded retraction embodiment, the torsion spring acts to bias the swivel rack assembly from the deployed position to the retracted position upon de-activation of the locking mechanism. By utilizing torsion springs to retract or deploy the plug connector in this manner, the present invention provides a computer peripheral device having a desirable spring-loaded deploying/retracting feature that protects the plug connector without the need for a separate cap, and also serves to reduce wear that can lead to jamming by maintaining the plug connector in a proper orientation relative to the housing during the deploying and retracting operation.

In according with several disclosed specific embodiments, the locking mechanism is a top push-button type mechanism in which a push button-type actuating structure includes a hollow cylindrical body, a push-button structure disposed on an upper end of the hollow cylindrical body, and locking tabs extending outwardly from a lower end of the hollow cylindrical body. The actuating structure is mounted in the housing with the push-button structure extending through an actuator opening defined in the upper housing wall, and is biased toward the upper housing by a coil-type actuating spring disposed inside the hollow cylindrical body. When the swivel rack assembly is in either of the deployed position or the retracted position, the locking tabs are pushed by the actuating spring into locking slots defined in the swivel rack assembly, thereby preventing rotation of the swivel rack assembly relative to the housing. When the swivel rack assembly is in the retracted position and the push-button structure is pressed into the housing (against the bias of the actuating spring), the locking tabs are pushed out of locking slots, thereby disengaging the locking mechanism and allowing the potential energy stored in the torsion spring to rotate the swivel rack assembly into the deployed position. Once the swivel rack assembly reaches the deployed position, the locking tabs are again pushed into the locking slots, thereby re-engaging the locking mechanism to prevent unwanted rotation of the swivel rack assembly out of the deployed position. Subsequent return to the retracted position is affected by pressing the push-button structure and manually rotating the swivel rack assembly against the bias of the torsion spring until the locking tabs re-engage the locking slots.

Various specific embodiments of the top push button-type arrangement are disclosed. In one specific embodiment the swivel arm includes a carrier tray having an upper tray portion and a lower tray portion that form a clip-like structure, and the PCBA includes a Chip-On-Board (COB) package mounted between the upper tray portion and the lower tray portion, wherein the plug connector is an elongated metal box-like structure mounted onto the swivel arm over the PCBA. In a second specific embodiment the swivel arm includes a bottom cover and a top cover that collectively form a casing, and the PCBA includes a printed circuit board partially mounted inside the casing formed by the top and bottom covers, with the plug connector attached to a front end of the printed circuit board and extending from a front end of the casing. In a third specific embodiment, the swivel arm includes a carrier tray having an upper tray portion and a lower tray portion that form a clip-like structure, the PCBA comprises a Slim Printed Circuit Board Assembly (Slim PCBA) package including a relatively wide rear PCB section mounted in the clip-like structure, and a relatively narrow front PCB section extending from the rear PCB section, wherein the plug connector is an elongated metal box-like structure including a wide rear plug section mounted over the rear PCB section, and a narrow front plug section mounted over the front PCB section.

In accordance with another embodiment of the invention, a side-push type USB device includes a swivel rack assembly that is rotatably mounted in a housing, and a guide hook is provided that is fixed at one end to the housing and has a second end slidably received in a guide groove having a V-shaped locking structure disposed at one end. A torsion spring is utilized to apply a twist/torque force when the swivel rack assembly is in retracted position, where the sliding end of the guide hook is engaged with the V-shaped locking notch, thereby securing the swivel rack assembly in the retracted position. Deploying the plug connector mounted on the swivel rack assembly involves pushing the swivel rack assembly into the housing, thereby causing the sliding end of the guide hook to be released from the V-shaped locking notch and allowing the sliding end to slide along a curved guide rail pathway until engaged to another end notch when the swivel rack assembly is in the fully deployed position. Once the USB plug is in the deployed position, pushing the swivel rack assembly toward the housing will make the sliding end of the guide hook slide along the curved guide rail pathway until it re-engages the V-shaped locking groove.

BRIEF DESCRIPTION OF THE DRAWING

Other features and advantages of the present invention will become apparent in the following detailed description of the preferred embodiment with reference to the accompanying drawings, of which:

FIGS. 4A, 4B, 4C, 4D, 4E and 4F collectively show exemplary data structures used for managing memory addresses of the flash memory of FIG. 2A in accordance with one embodiment of the present invention;

FIGS. 5A, 5B, 5C, 5D and 5E collectively show a flow chart of an exemplary process of conducting data transfer requests of the flash memory of FIG. 2A in accordance with one embodiment of the present invention;

FIGS. 7A, 7B, 7C, 7D and 7E collectively are a flowchart illustrating an exemplary process of initialization of a large capacity flash memory device in accordance with one embodiment of the present invention;

DETAILED DESCRIPTION OF THE PREFERRED EMBODIMENT

The present invention relates to an improvement in flash memory devices such as USB flash drives. The following description is presented to enable one of ordinary skill in the art to make and use the invention as provided in the context of a particular application and its requirements. As used herein, directional terms such as "upper", "upwards", "lower", "downward", "front", "rear", and "side" are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
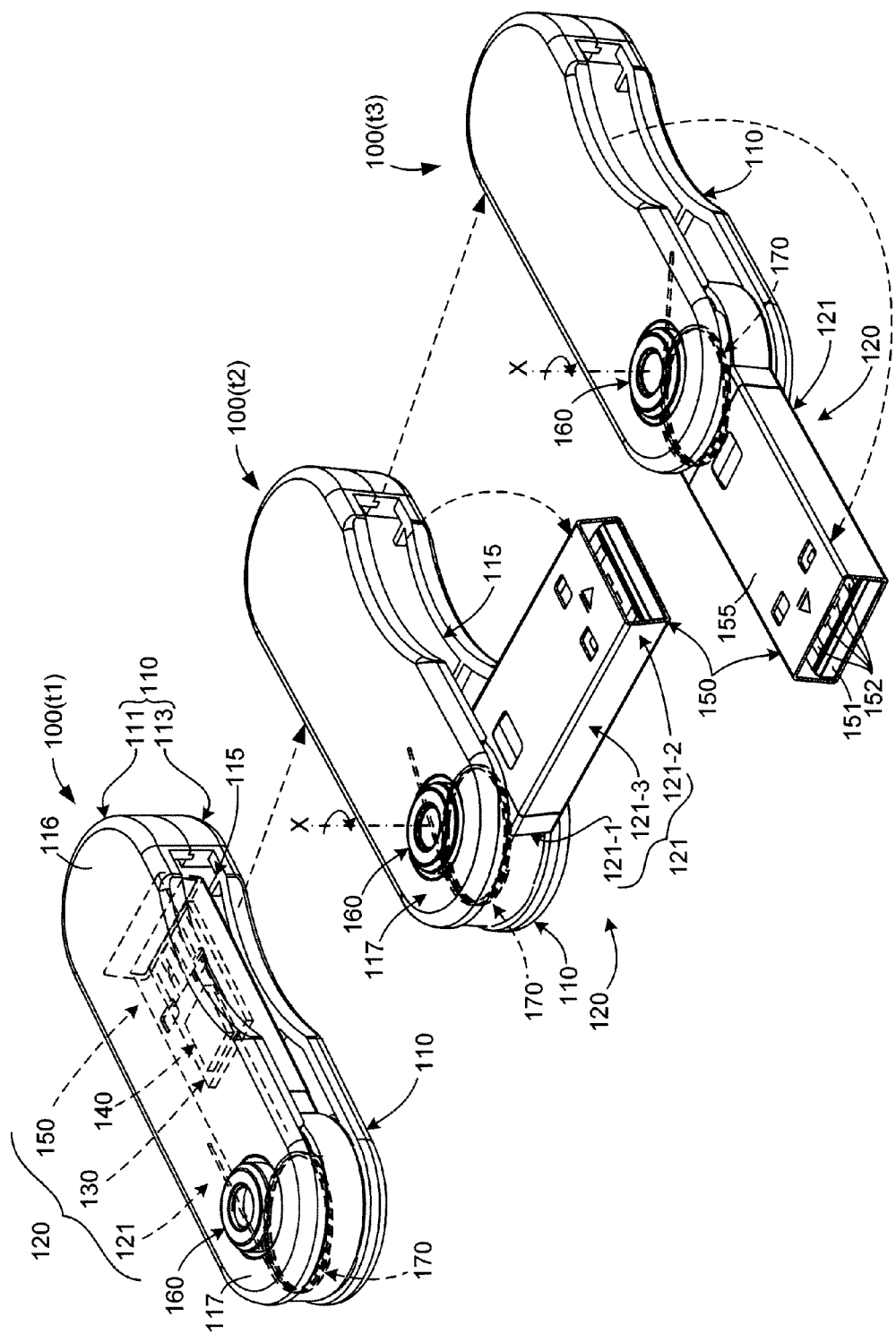
FIG. 1(A) includes sequential perspective views showing an exemplary swivel-type portable computer peripheral apparatus (USB device) according to a generalized embodiment of the present invention.

FIG. 1(A) includes sequential perspective views showing an exemplary swivel-type USB device (portable computer peripheral apparatus) 100 according to a generalized embodiment of the present invention. Referring to the left side of FIG. 1, swivel-type USB device 100 generally includes a housing 110, a swivel rack assembly 120 pivotably connected to the housing, a lock/release mechanism 160, and a torsion spring 170.

Housing 110 is an elongated molded plastic or metal structure including an upper wall portion 111 and a lower wall portion 113 that define an elongated side opening 115 therebetween, wherein side opening extends between a closed (rear) end portion 116 and an open (front) end portion 117.

As indicated in the upper left corner of FIG. 1(A), swivel rack assembly 120 generally includes a swivel arm 121, a PCBA 130, and a standard USB plug connector 150. As indicated in the middle portion of FIG. 1(A), swivel arm 121 includes a fixed end 121-1 that is rotatably (pivotably) connected to front end portion 117 of housing 110 such that swivel rack assembly 120 is pivotable (rotatable) around an axis X, a free end 121-2, and a central section 121-3 extending between fixed end 121-1 and free end 121-2. Fixed end 121-1 of swivel arm 121 is rotatably connected to front end 117 of housing 110 such that when swivel arm 121 is rotated around rotational axis X, free end 121-2 and central section 121-3 of swivel arm 121 are rotated into or out of housing 110 in the manner described below. Card body 130 is mounted onto central section 121-3 of swivel arm 130, and is described in more detail below with reference to FIG. 1(B) and FIGS. 2A to 7E. Plug connector 150 is fixedly connected to free end 121-2 of the swivel arm 121, and electronically connected to PCBA 130 in the manner set forth below. Referring to the bottom right portion of FIG. 1, plug connector 150 includes a substrate 151 having four of metal contacts 152 formed thereon, and an optional metal plug shell 155 that extends over substrate 151. Metal contacts 152 are shaped and arranged in a pattern established by the USB specification, and are electronically coupled to PCBA 130 according to known techniques.

According to an aspect of the present invention, swivel-type USB device 100 further includes a spring-loaded locking mechanism 160 for securing plug connector 150 in one of a retracted (first) position, in which the swivel arm is rotated such that the plug connector is positioned inside of housing 110 (e.g., as indicated at the top left section of FIG. 1(A)), and a deployed (second) position, in which the swivel arm is rotated such that the plug connector is exposed outside of housing 110 for operable coupling to a host system position (e.g., as indicated at the bottom right section of FIG. 1(A)). Spring-loaded locking mechanism 160 generally includes an actuating mechanism that is operably connected between housing 110 and swivel arm 121 such that swivel rack assembly 120 is secured (i.e., non-rotatable relative to housing 110) when swivel arm 121 is in either the retracted position or the deployed position, and is freely rotatable when swivel arm 121 is disposed between the retracted position and the deployed position. As indicated in FIG. 1, in one embodiment spring-loaded locking mechanism 160 includes a push button or other manually-controlled actuating structure that is operably connected to a locking mechanism (not shown) connected between swivel rack assembly 120 and housing 110.

According to an aspect of the present invention, swivel-type USB device 100 further includes a torsion spring (or other resilient member) 170 that is operably connected between housing 110 and swivel arm 121 such that swivel rack assembly 120 is biased to rotate relative to housing 110 around rotational axis X, whereby plug connector 150 is either biased from the retracted position to the deployed position, or from the deployed position to the retracted position.

The arrangement shown in FIG. 1(A) operates as follows. Upon release of the locking mechanism, torsion spring 170 applies a torque to swivel arm 121, causing swivel arm to rotate out of elongated side opening 115 around rotational axis X, as indicated in the middle of FIG. 1(A). When torsion spring 170 causes swivel rack assembly 120 to rotate relative to housing 110 into the fully deployed position, the locking mechanism of spring-loaded locking mechanism 160 re-secures swivel arm 121 to housing 110. According to various embodiments described below, one or more locking mechanisms and actuating mechanisms are utilized to perform the deploying/retracting operation.

FIG. 1(A) shows various operating positions illustrating the deploying/retracting operation produced by spring-loaded locking mechanism 160. For example, USB device 100 is shown at the top left portion of FIG. 1 at a first time t1 (indicated by reference designation "100(t1)") in a fully retracted position (i.e., swivel rack assembly 120 is subject to 0° rotation around rotational axis X). Spring-loaded locking mechanism 160 maintains swivel rack assembly 120 in this fully retracted position until a user manually actuates the push button or other actuating mechanism that releases the lock mechanism securing swivel rack assembly to housing 110. Upon manual depression of the actuating mechanism of spring-loaded locking mechanism 160 while housing 110 is maintained in a stationary position releases torsion spring 170, causing torsion spring to apply a torque to swivel arm 121 that causes swivel rack assembly 120 to rotate out of elongated side opening 115 into the partially deployed position at time t2, which is depicted by USB device 100(t2) shown in the center of FIG. 1(A). At time t2, torsion spring 170 continues to apply torque to swivel arm 121, causing further rotation of swivel rack assembly 120 around axis X until swivel arm 121 reaches the fully deployed position at time t3, which is depicted by USB device 100(t3) shown in the lower right of FIG. 1(A). When USB device 100 reaches the fully deployed position, the locking mechanism of spring-loaded locking mechanism 160 re-secures swivel rack assembly 120 to housing 110, thereby preventing unwanted rotation of housing 110 when plug connector is inserted into a socket of a host device. As described below, subsequent manual rotation of swivel rack assembly 120 relative to housing 110 requires manually manipulating the actuating mechanism to disengage the locking mechanism, and pivoting swivel rack assembly 120 in the opposite rotational direction to place plug connector 150 back into the retracted position inside housing 110. By providing such a swivel-type actuating mechanism in which plug connector 150 is deployed by torsion spring 170, the present invention provides a convenient, reliable and easy to use retractable USB device that avoids fouling or jamming after repeated use, thereby avoiding the loss of valuable information by preventing failure of the USB device to deploy. In addition, by utilizing highly efficient plastic molding techniques to form the various parts, the present invention provides a high quality retractable USB device that has a very low production cost, and provides a reliable deploying mechanism that allows a user to comfortably apply a greater actuating force than is available in conventional devices.

According to another aspect of the present invention, swivel rack assembly 120 and housing 110 remain rotatably connected together at all times (i.e., such that swivel rack assembly 120 remains secured to housing 110 (a) at time t1 when plug connector 150 is in the retracted position shown at the upper left of FIG. 1(A), (b) in the fully deployed position when plug connector 150 extends straight in front of housing 110 as shown in the lower right portion of FIG. 1(A), and (c) during movement of plug connector 150 between the deployed and retracted positions, as indicated in the center of FIG. 1(A)), thereby preventing the loss of a cap or other detachable part during operation as in conventional pen-type devices.

Figure 1B:
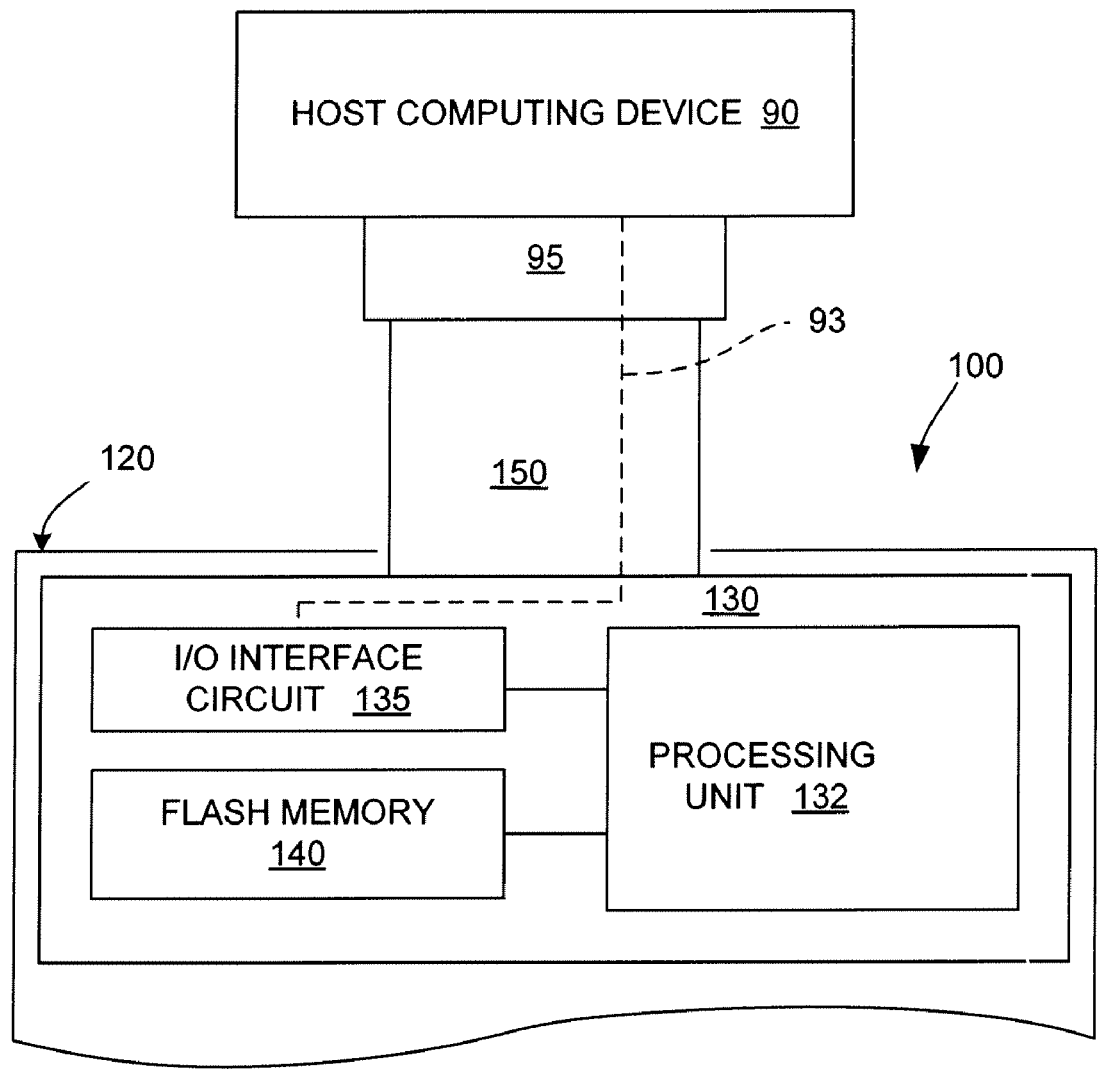
FIG. 1(B) is a simplified diagram showing electronic flash memory devices and associated components of the apparatus of FIG. 1 in additional detail.

FIG. 1(B) is a simplified diagram illustrating an electronic environment in which swivel-type USB device 100 may be deployed in accordance with an exemplary embodiment of the present invention. In particular, FIG. 1(B) shows the front portion of swivel rack assembly 120 including PCBA 130 and plug connector 150 during communications with an external computer 90.

According to another aspect of the present invention, PCBA 130 generally includes a processing unit 132, a flash memory device 140, and an input/output interface circuit 135 that are configured to operate in the manner set forth below with reference to FIG. 1(B), and further with reference to FIGS. 2A to 7E.

PCBA 130 is configured for providing electrical and mechanical connection for the processing unit 132, the flash memory device 140, the I/O interface circuit 135, and all of the optional components. PCBA 130 may comprise a printed circuit board (PCB) or an equivalent substrate such that all of the components as integrated circuits may be mounted thereon. The substrate may be manufactured using surface mount technology (SMT) or chip on board (COB) technology.

Processing unit 132 and the I/O interface circuit 135 are collectively configured to provide various control functions (e.g., data read, write and erase transactions) of the flash memory device 140. Processing unit 132 may also be a standalone microprocessor or microcontroller, for example, an 8051, 8052, or 80286 Intel® microprocessor, or ARM®, MIPS® or other equivalent digital signal processor. Processing unit 132 and the I/O interface circuit 135 may be made in a single integrated circuit, for application specific integrated circuit (ASIC).

The at least one flash memory device 140 may comprise one or more flash memory chips or integrated circuits. The flash memory chips may be single-level cell (SLC) or multi-level cell (MLC) based. In SLC flash memory, each cell holds one bit of information, while more than one bit (e.g., 2, 4 or more bits) are stored in a MLC flash memory cell. A detail data structure of an exemplary flash memory is described and shown in FIG. 2A and corresponding descriptions thereof. Flash memory device 140 stores, in a known manner therein, one or more data files and an optional reference password. In one embodiment, only authorized users can access the stored data files. The data file can be a picture file, a text file or any other file.

Input/output interface circuit 135 is mounted on the PCBA 130, and can be activated so as to establish communication with the host computing device 90 by way of a socket 95 via an interface bus 93 that is established when a connector 150 attached to PCBA 130 is coupled with socket 95. Input/output interface circuit 135 may include circuits and control logic associated with a Universal Serial Bus (USB) interface structure that is connectable to an associated socket connected to or mounted on the host computing device 90.

Processing unit 132 is controlled by a software program module (e.g., a firmware (FW)), which may be stored partially in a ROM (not shown) such that processing unit 132 is operable selectively in: (1) a data programming or write mode, where processing unit 132 activates input/output interface circuit 135 to receive data from the host computing device 90 under the control of the host computing device 90, and store the data in the flash memory device 140; (2) a data retrieving or read mode, where the processing unit 122 activates the input/output interface circuit 135 to transmit data stored in the flash memory device 140 to the host computing device 90; or (3) a data resetting or erasing mode, where data in stale data blocks are erased or reset from the flash memory device 140. In operation, host computing device 90 sends write and read data transfer requests to the first flash memory device 100-1 via the interface bus 93, then input/output interface circuit 135 to the processing unit 132, which in turn utilizes a flash memory controller (not shown or embedded in the processing unit) to read from or write to the associated at least one flash memory device 140. In one embodiment, for further security protection, the processing unit 132 automatically initiates an operation of the data resetting mode upon detecting a predefined time period has elapsed since the last authorized access of the data stored in flash memory device 140.

Figure 2A:
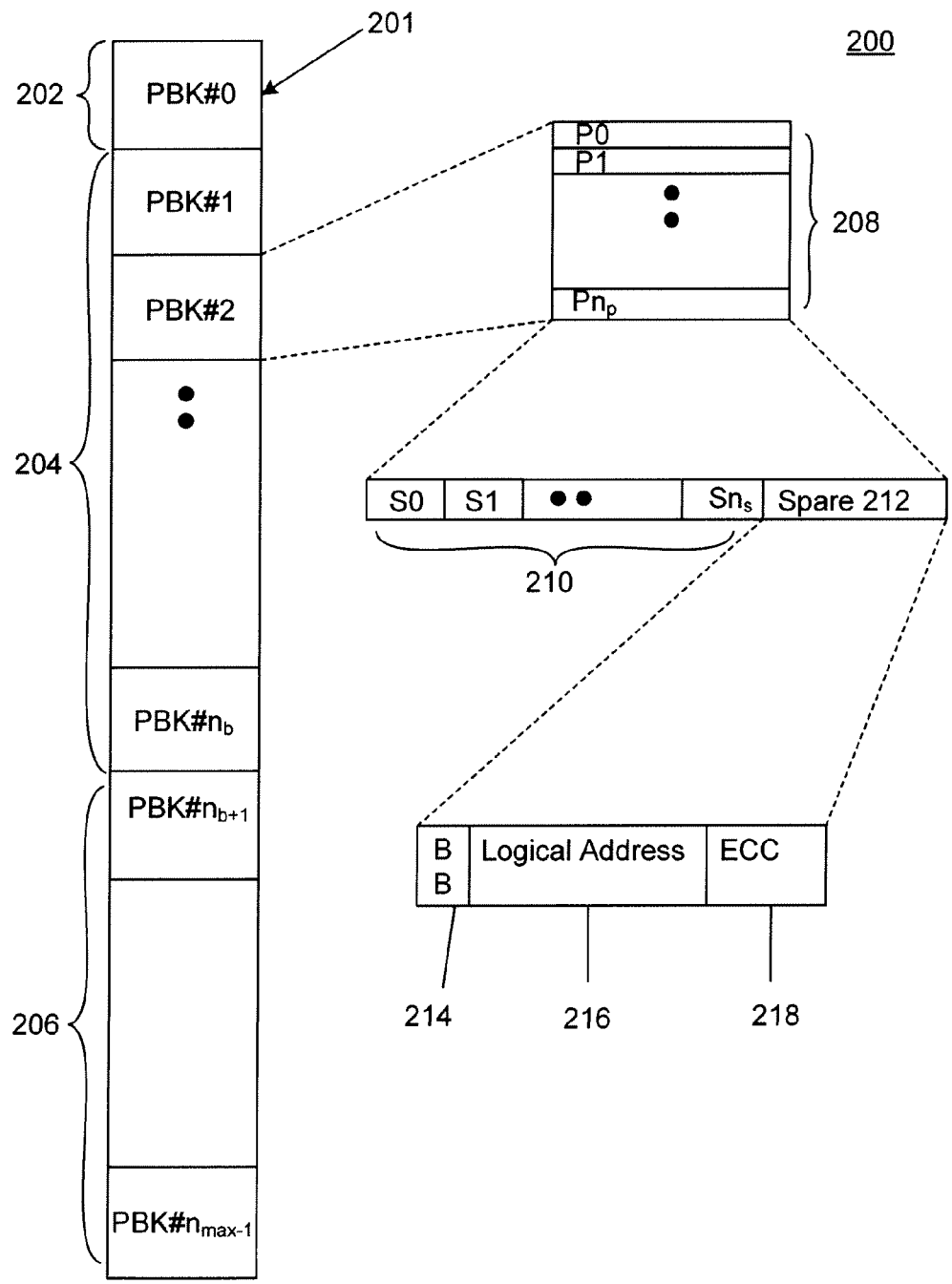
FIG. 2A is a diagram depicting a data structure of an exemplary large capacity flash memory, according one embodiment of the present invention.

Referring now to FIG. 2A, which is a diagram depicting an exemplary data structure 200 of a flash memory module 201 (e.g., flash memory device of FIG. 1(B)) in accordance with one embodiment of the present invention. The flash memory module 201 is divided into a plurality of physical blocks e.g., PBK#0, PBK#1, PBK#2, . . . ). In general, there are three categories of physical blocks: 1) the first block 202 (i.e., PBK#0); 2) normal usage data blocks 204 (i.e., PBK#1, PBK#2, . . . , PBK#$n_b$); and 3) reserved blocks 206 (i.e., PBK#$n_{b+1}$, . . . PBK#$n_{max-1}$). The first block (PBK#0) 202 is guaranteed to be a good block and used by the manufacturer to store certain information such as Flash Timing Parameter (FTP), and other information by Initial Manufacturing Program (IMP), which cannot be alter by users. The manufacturer may define a percentage (e.g., 95%) of the total capacity as normal usage data blocks and the rest as reserved. The normal usage data blocks 204 are configured for user to store user data, although the first block (i.e., PBK#1) of the normal usage data blocks 204 is generally used for storing Master Boot Record (MBR), which contains critical data for operation of a computing device. Lastly, the reserved blocks 206 are configured to be accessed by a program module (e.g., FW) via special memory addresses in accordance with one embodiment of the present invention. Examples of the special memory address are 0xFFFF0000, 0xFFFF0001, 0xFFFFFF00, 0xFFFFFF01, etc.

Each block is further divided into a plurality of pages 208 (e.g., P0, P1, Pn$_p$). Each of the pages 208 includes a data area 210 and a spare area 212. The data area is partitioned into a plurality of sectors (e.g., S0, S1, . . . , Sn$_s$). In one embodiment, each sector stores 512-byte of data. The spare area 212 is configured to provide three different fields: 1) a block indicator (BB) 214, a logical address area 216 and an error correction code (ECC) area 218. When a block is tested no good by the manufacturer, the block indicator 214 of that block is set to a special code to indicate a bad block that cannot be used. The logical address area 216 is configured for identifying of that particular physical block for initialization of the flash memory device. More details are described in FIG. 4E and FIG. 4F for the reserved physical blocks as used by an embodiment of the present invention. Detailed processes of initialization are shown in FIGS. 7A-7E. The ECC area 218 is configured to store the ECC for ensuring data integrity.

In order to access the data stored in the normal usage blocks 204 of the flash memory module 201, the host computing device 90 transmits a data transaction request (e.g., data read or write) along with a logical sector address (LSA) to the flash memory device. The processing unit 102 of the flash memory device converts the received LSA into a physical address (i.e., specific block, page and sector numbers) before any data transaction can be performed. Traditionally, the conversion is performed by an address look up table with a one-to-one relationship to the physical address. This solution works for a flash memory device with relatively small capacity, because the address look up table is implemented with a static random access memory (SRAM). It would not be feasible in terms of cost and physical space to include SRAM that grows linearly as the capacity of the flash memory device especially for a large capacity MLC based flash memory device. For example, a large capacity (say 32 Giga-Byte (GB)) MLC based flash memory device using 2112-byte page (i.e., 2048-byte data plus 64-byte spare) and 128 pages per block, it would require more than 2 MB bytes of SRAM to hold the entire address look up table.

Figure 2B:
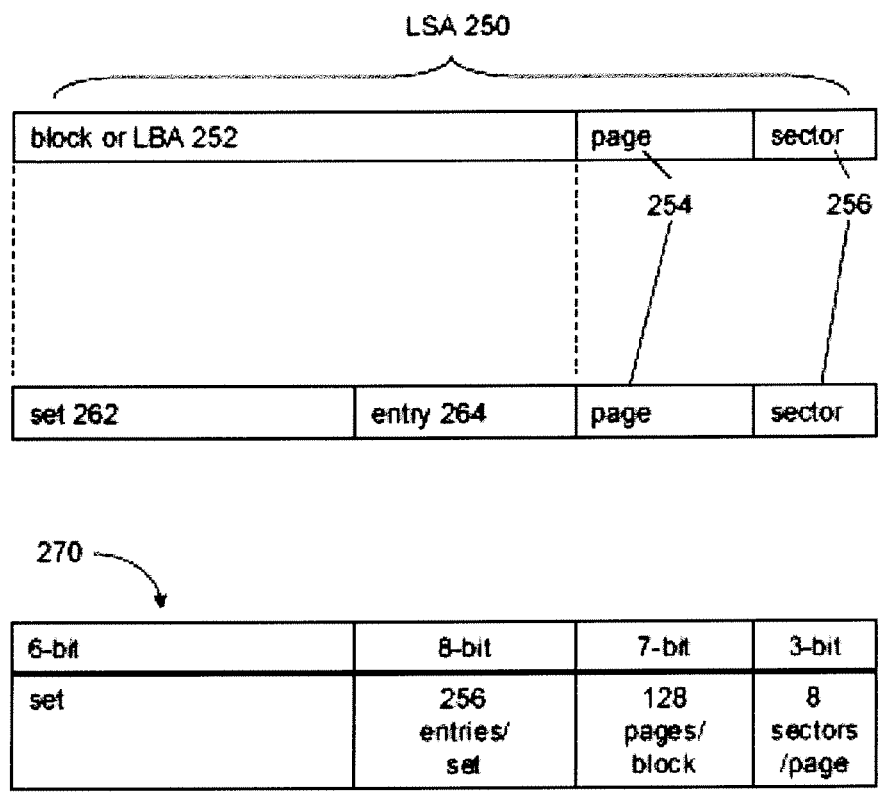
FIG. 2B is a diagram showing an exemplary scheme for partitioning a logical sector address in accordance with one embodiment of the present invention.

FIG. 2B is a diagram showing an exemplary scheme for partitioning a logical sector address in accordance with one embodiment of the present invention. A logical sector address (LSA) 250 is traditionally partitioned as three parts: block 252, page 254 and sector 256. The block portion 252 is also referred to as logical block address (LBA). According to one aspect of the present invention, the LSA 250 is partitioned into four parts: set 262, entry 264, page 254 and sector 256. The page 254 and sector 256 remain the same. And the block 252 is further partitioned into two parts: the set 262 and the entry 264. In other words, instead of just using block 252 as basic unit, the blocks are divided into a plurality of sets 262. Each of the sets 262 includes a plurality of entries 264. For example, if a 24-bit LSA 270 is partitioned in the following manner: 6-bit for set, 8-bit for entry, 8-bit for page and 3-bit for sector, the LSA 270 could represent up to 64 sets of 256 entries (i.e., 16,384 blocks) with each block containing 128 pages and each page containing 8 sectors of 512-byte of data. In this document, the number of the plurality of sets is N, where N is a positive integer.

To carry out the address partition scheme of the present invention, the manufacturer may predefine number of sets and entries in the first physical block (i.e., PBK#0) by the IMP. Instead of mapping all of the logical sector addresses (LSA) to a physical address in a memory, only a portion of the LSA (i.e., a set) is included such that only a limited size of memory is required for address correlation and page usage information. In other words, a limited size memory is configured to hold one set of entries with each entry including an address of the corresponding physical block and a plurality of corresponding page usage flags (see FIG. 4A for details). For example, 18-byte (i.e., 2-byte for the physical block address plus 128-bit or 16-byte for 128 page usage flags) is required for each entry, hence a total of 4608-byte of memory is required for a set with 256 entries.

However, in order to correlate a logical block address to a unique physical block, every entry in each of the plurality of sets must correlate to a unique physical address and a set of page usage flags. Since the limited size memory only has capacity of holding one set of such information, an embodiment of the present invention requires that information of all of the plurality of sets be stored in reserved area 206 of the flash memory 201. Only a relevant set of the plurality of sets is loaded into the limited size memory in response to a particular data transfer request from a host computing system 109. The relevant set is defined as the set with one of the entries matches the entry number derived from the LSA associated with the received data transfer request.

Since there are N sets of address correlation and page usage information stored in the flash memory, each of the N sets is referred to as a partial logical-to-physical address and page usage information (hereinafter 'PLTPPUI') appended with a set number (e.g., 'PLTPPUI0', 'PLTPPUI1', . . . 'PLTPPUIN').

In order to simplify the examples and drawings in the Specification, an example with small numbers is used for demonstrate the relationship between LSA, LBA, sector, page, entry and set numbers. Those of ordinary skill in the art will understand implementation of an embodiment of the present invention can be with larger numbers. The following example uses a flash memory with four sectors per page, four pages per block and four entries per set and a logical sector address 159 (i.e., LSA=159) is represented by a binary number "10 01 11 11". As a result, the least significant four bits of LSA represent sector and page numbers with the two lowest bits for the sector number and the next two for the page number, as each two-bit represents four distinct choices—0, 1, 2 and 3. After truncating the four least significant bits of LSA, the remaining address becomes the corresponding logical block address (LBA). In this example, LBA has a binary value of '1001'. Because there are four entries per set in this example, two least significant bits of LBA represent the entry number (i.e., offset number in each set). The remaining high bits of LBA represent the set number. A summary of this example is listed in Table 1.

TABLE 1

| 10 | 01 | 11 | 11 |
|---|---|---|---|
| Set Number | Entry Number | Page Number | Sector Number |

According to one aspect of the present invention, an indexing scheme enables the processing unit 102 to translate logical sector addresses (LSAs) and/or logical block addresses (LBAs) provided, in conjunction with a data transfer request, by the host computing device 109 to physical block numbers or addresses (PBK#) in the flash memory device 140. The indexing scheme comprises a plurality of sets of PLTPPUI and physical characteristics of the flash memory such as total number of sets, entries, pages and sectors. And ratios among the set, entry, page and sector. The processing unit 102 can utilize the indexing scheme to determine which sectors of the flash memory are available for each particular data transfer request.

Figure 3:
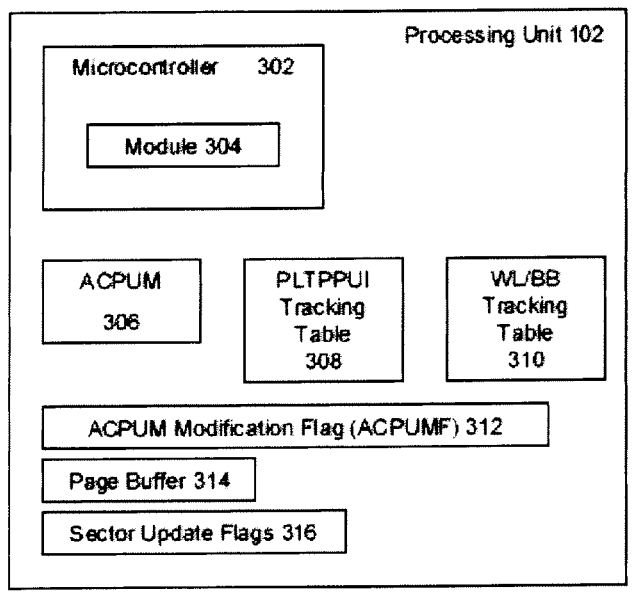
FIG. 3 is a simplified block diagram illustrating salient components of an exemplary processing unit of each of the electronic flash memory devices of FIGS. 1(A) and 1(B), according to an embodiment of the present invention.
Figure 4A:
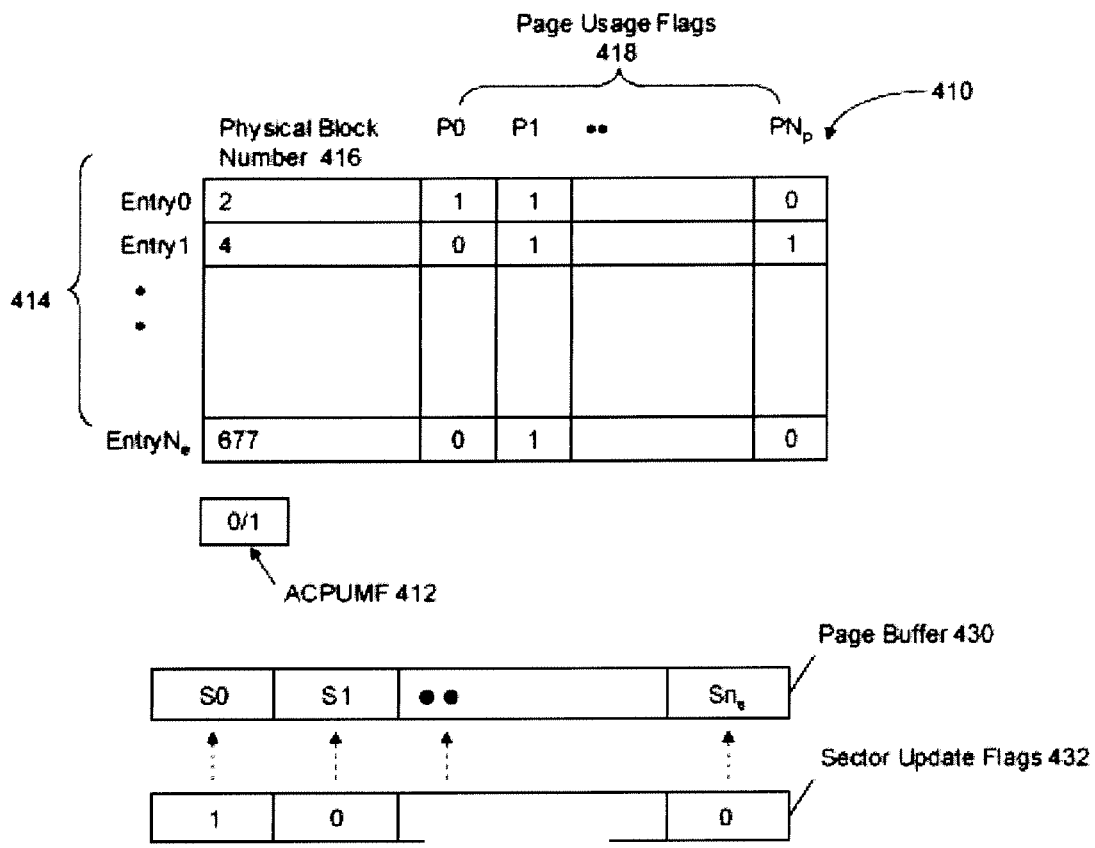
Figure 4B:
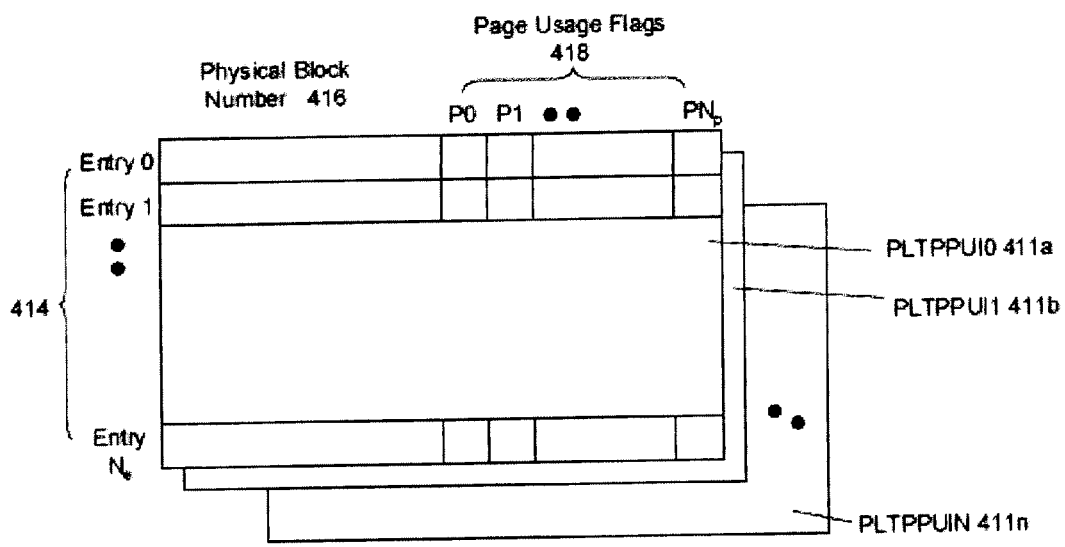

FIG. 3 is a simplified block diagram showing salient components of the process unit 102 of an electronic flash memory device in accordance with one embodiment of the present invention. The processing unit 102 comprises a microcontroller or microprocessor 302, an address correlation and page usage memory (ACPUM) 306, a PLTPPUI tracking table 308, a wear leveling and bad block (WL/BB) tracking table 310, a ACPUM modification flag (ACPUMF) 312, a page buffer 314 and a set of sector update flags 316.

The microcontroller 302 with a flash memory controlling program module 304 (e.g., a firmware (FW)) installed thereon is configured to control the data transfer between the host computing device 109 and the at least one flash memory module 103. The ACPUM 306 is configured to provide an address correlation table, which contains a plurality of entries, each represents a correlation between a partial logical block address (i.e., entries) to the corresponding physical block number. In addition, a set of page usage flags associated with the physical block is also included in each entry. The ACPUM 306 represents only one of the N sets of PLTPPUI, which is stored in the reserved area of the flash memory. In order to keep tracking the physical location (i.e., physical block number) of each of the N sets of PLTPPUI, the physical location is stored in the PLTPPUI tracking table 308. Each item is the PLTPPUI tracking table 308 corresponds a first special logical address to one of the N sets of PLTPPUI. The wear leveling counters and bad block indicator for each physical block is stored in a number of physical blocks referred by corresponding second special logical addresses (e.g., '0xFFFFFF00'). The WL/BB tracking table 310 is configured to store physical block numbers that are assigned or allocated for storing these physical block wear leveling counters and bad blocks. The ACPUM modification flag (ACPUMF) 312 is configured to hold an indicator bit that tracks whether the ACPUM 306 has been modified or not. The page buffer 314 is configured to hold data in a data transfer request. The page buffer 314 has a size equaling to the page size of the flash memory 201. The sector update flags 316 are configured to hold valid data flag for each of the corresponding sectors written into data area of the page buffer 314. For example, four sector update flags are be required for a page buffer comprising four sectors. The page buffer 314 also includes a spare area for holding other vital information such as error correction code (ECC) for ensuring data integrity of the flash memory.

FIGS. 4A-4F collectively show exemplary data structures used for managing memory addresses of the flash memory of FIG. 2A in accordance with one embodiment of the present invention. The ACPUM data structure 410 contains $N_e$ rows of entries 414, where $N_e$ is a positive integer. Each row contains a physical block number or address (PBK#) 416 and a plurality of page usage flags 418 associated with the PBK#. The number of pages ($N_p$) is determined by the physical flash memory cell structure and defined by the IMP. ACPUMF 412 contains one bit, which is a toggle switch representing whether the ACPUM 306 has been modified or not. The ACPUMF 412 may be implemented as a register containing either 0 (not modified) or 1 (modified). The page buffer 430 includes a data area containing plurality of sectors (S1, S2, . . . , $Sn_s$) and a spare area (not shown in FIG. 4A) containing other information such as ECC. A set of sector update flags 432 is configured to represent respective sectors in the page buffer 430. Each of the sector update flags 432 indicates either a corresponding sector contains a valid data or not. In one implementation, valid data is represented as "1", while initial or stale state as "0". These flags may be implemented in a different logic such as reversing the binary representation. As discussed in the prior sections and shown in FIG. 4B, there are N sets of PLTPPUI 411a-n, where N is a positive integer. The N sets of PLTPPUI 411a-n represent all of the logical blocks in correlation with physical blocks. Only one of the N sets is loaded into the ACPUM 306 at one time.

Each set of the PLTPPUI is stored in the reserved area 206 of the flash memory 201 of FIG. 2A in a data structure 420 shown in FIG. 4C. The contents of each set of PLTPPUI are stored in one page of a physical block. For example, the PLTPPUI0 is stored at one of a plurality of first special logical addresses "0xFFFF0000", which corresponds to the first page (P0) 424a of a physical block 'PBK#1000' 422 initially. Due to the MLC flash memory data programming rules, each page can only be programmed or written once (i.e., NOP=1) and data programming within one block can only be in a ascending page order. The second data programming or write can only be into the second page (P1) 424b until the $n^{th}$ write to the last page (Pn) 424n of the block 'PBK#1000' 422. After that, the next data programming, the $(n+1)^{th}$ write, must be written to the first page (P0) 434 of a new physical block (PBK#1012) 432 just assigned or allocated according to the WL rules. In storing ACPUM 306 into the flash memory, each entry of the ACPUM 306 is written sequentially in the data area 425 of the page. When a first page of a new block is programmed, after the data area has been written, other vital information is written into the spare area 426. The other information include at least the following: a bad block indicator 427, the special logical address 428 issued by the FW for each of the N sets of PLTPPUI and a tracking number 429 for each special logical address. The bad block indicator 427 showing 'FF' means a good block. The first special logical address 442 may be '0xFFFF0000'. And the tracking number (TN) 446 is set to zero for an initial physical block corresponding to each of the first special logical addresses. The tracking number 446 is incremented by one as a new block is assigned or allocated for storing a particular set of PLTPPUI.

FIG. 4D is a diagram illustrating an exemplary data structure 440 of the PLTPPUI tracking table 308 of FIG. 3. The PLTPPUI tracking table 308 contains a plurality of rows representing a plurality of first special logical addresses 442, one for each of the N sets of PLTPPUI. Each of the N rows contains a physical block number 444, a tracking number (TN) 446 and highest page number 448. The first row of the PLTPPUI tracking table 308 corresponds to the example shown in FIG. 4C.

Similar to the data structure of the PLTPPUI tracking table, an exemplary data structure 450 of a WL/BB tracking table 310 is shown in FIG. 4E. Instead of first special logical addresses for each of the N sets of PLTPPUI, each row is for a second special address 452 of a block of the WL/BB tracking table 310. In one implementation, the second special address 452 may be '0xFFFFFFF0'. An exemplary data structure 460 for storing the WL/BB tracking table in the reserved area of a flash memory is shown in FIG. 4F. Similarly, the MLC flash memory data programming rules dictate the data to be written to a new page for each update. The spare area stores the block indicator 467, the second special logical address 452 and tracking number 456.

Referring now to FIGS. 5A-5E, which collectively show a flowchart illustrating an exemplary process 500 of conducting data transfer requests of the flash memory of FIG. 2A in accordance with one embodiment of the present invention. The process 500 is preferably understood in conjunction with previous figures and examples shown in FIGS. 6A-6D. The process 500 is performed by the microcontroller 302 with a flash memory controller program module 304 installed thereon.

The process 500 starts in an 'IDLE' state until the microcontroller 302 receives a data transfer request from a host (e.g., the host computing device 90 of FIG. 1(B)) at 502. Also received in the data transfer request is a logical sector address (LSA), which indicates the location the host wishes to either read or write a sector of data (i.e., 512-byte sector). Based on the parameters defined by the IMP and the physical characteristics of the MLC based flash memory, the received LSA is processed to extract the set, entry, page and sector numbers (see Table 1 for an example) included therein. After the received LSA has been processed, the process 500 moves to decision 504. It is determined whether the ACPUM 306 has been loaded with a set of PLTPPUI that covers the received LSA. If 'yes', the process 500 reads out the physical block number (PBK#) corresponding to the entry number of the received LSA at 516 before moving to another decision 518, in which it is determined whether the data transfer request is read or write (i.e., program).

If the decision 504 is 'no', the process 500 moves to decision 506. The process 500 checks whether the contents of the page buffer 430 need to be stored. In one implementation, the process 500 checks the sector update flags 432 that correspond to sectors in the page buffer 430. If any one of the flags 432 has been set to 'valid', then the contents of the page buffer 430 must be stored to the corresponding page of the corresponding physical block of the MLC flash memory at 550 (i.e., the decision 506 is 'yes'). Detailed process of step 550 is shown and described in FIG. 5D. After the contents of the page buffer 430 have been stored, the process 500 sets the ACPUM modification flag (ACPUMF) 412 to a 'modified' status at 508. In other words, the ACPUM 306 has been modified and needs to be stored in the flash memory in the future. Then the process 500 moves to yet another decision 510.

Otherwise if 'no' at decision 506, the process 500 moves the decision 510 directly. It is then determined if the ACPUM 306 has been modified. If 'yes', the process 500 moves to 580, in which, the process 500 writes the contents of the ACPUM 306 to one of a plurality of first special logical addresses (e.g., '0xFFFF0000' for PLTPPUI0, or '0xFFFF0001' for PLTPPUI1, etc.) for storing corresponding set of PLTPPUI in the reserved area of the flash memory. The ACPUM modification flag 412 is reset at the end of 580. Detailed process of step 580 is shown and described in FIG. 5E. Then, at 514, the process 500 loads a corresponding set of PLTPPUI to the ACPUM 306 from the flash memory based on the set number extracted from the received LSA. Once the ACPUM 306 has been loaded, the process 500 reads the physical block number that corresponds to the entry number at 516 before moving to decision 518. If 'no' at decision 510, the process 500 skips step 580 and goes directly to 514.

Figure 5B:
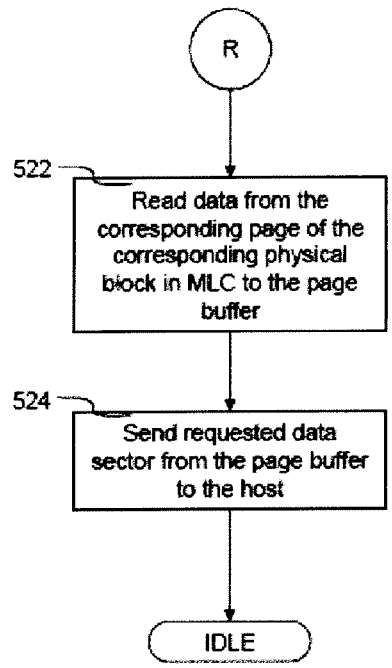

Next, at decision 518, if the data transfer request is a data read request, the process 500 continues with a sub-process 520 shown in FIG. 5B. The process 500 or sub-process 520 reads data from the corresponding page of the physical block in the flash memory to the page buffer 430. The corresponding page number is derived from the received LSA, and the physical block number is obtained through the ACPUM 306 for the entry numbers at 516. Finally, the process 500 sends the requested data sector from the page buffer 430 to the host 109 before going back the 'IDLE' status waiting for another data transfer request.

Figure 5C:
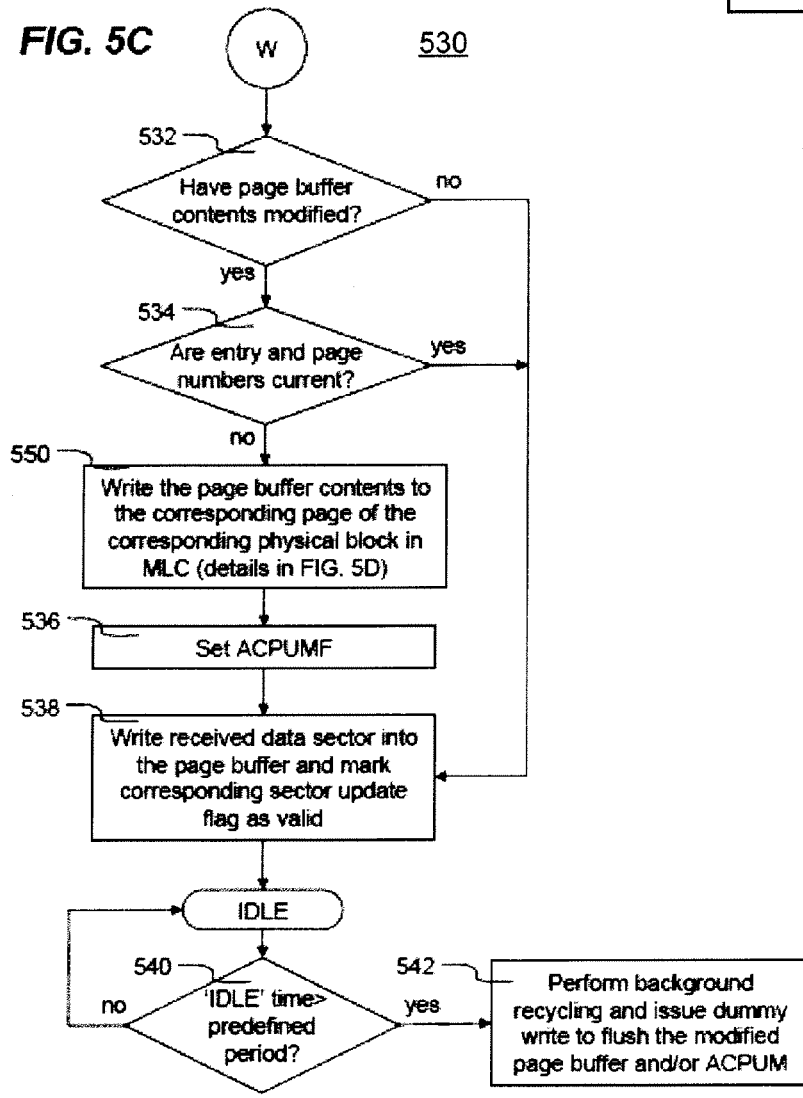

If the data transfer request is a data write or program request, the process 500 continues with a sub-process 530 shown in FIG. 5C. The process 500 or sub-process 530 moves to decision 532, in which it is determined whether the contents of the page buffer 430 have been modified. If 'no', the process 500 writes received data sector into the page buffer 430 according to the sector number derived from the received LSA, and marks the corresponding sector of the sector update flags 432 to indicate valid data in that particular sector has been written in the page buffer 430 at 538. The process 500 then moves back to the 'IDLE' state waiting for another data transfer request.

If 'yes' at decision 532, the process 500 moves to decision 534. It is determined if the received data sector is in the same entry and page numbers. If 'yes', the process 500 writes the received data sector to the page buffer 430 at 538 before going to the 'IDLE'. If 'no' at decision 534, the process 500 writes the page buffer contents to the corresponding page of the physical block of the flash memory at 550. Next, the process 500 sets the ACPUM modification flag 412 to a 'modified' status at 536. Next, at 538, the process 500 writes the received data sector to the page buffer before going back to the 'IDLE' state.

Finally, in additional to managing data read and write requests, the process 500 regularly performs a background physical block recycling process so that the blocks containing only stale data can be reused later. When the process 500 is in the 'IDLE' state, it performs test 540, in which it is determined if the idle time has exceeded a predefine time period. If 'yes', the process 500 performs the background recycling process, which may include issuing a dummy data write request to force the page buffer 430 and/or modified ACPUM 306 to be written to corresponding locations of the flash memory at 542. In one embodiment, the dummy data write/program command may be issued to rewrite some of seldom touched physical blocks, for example, physical blocks used for storing user application or system program modules.

Figure 5D:
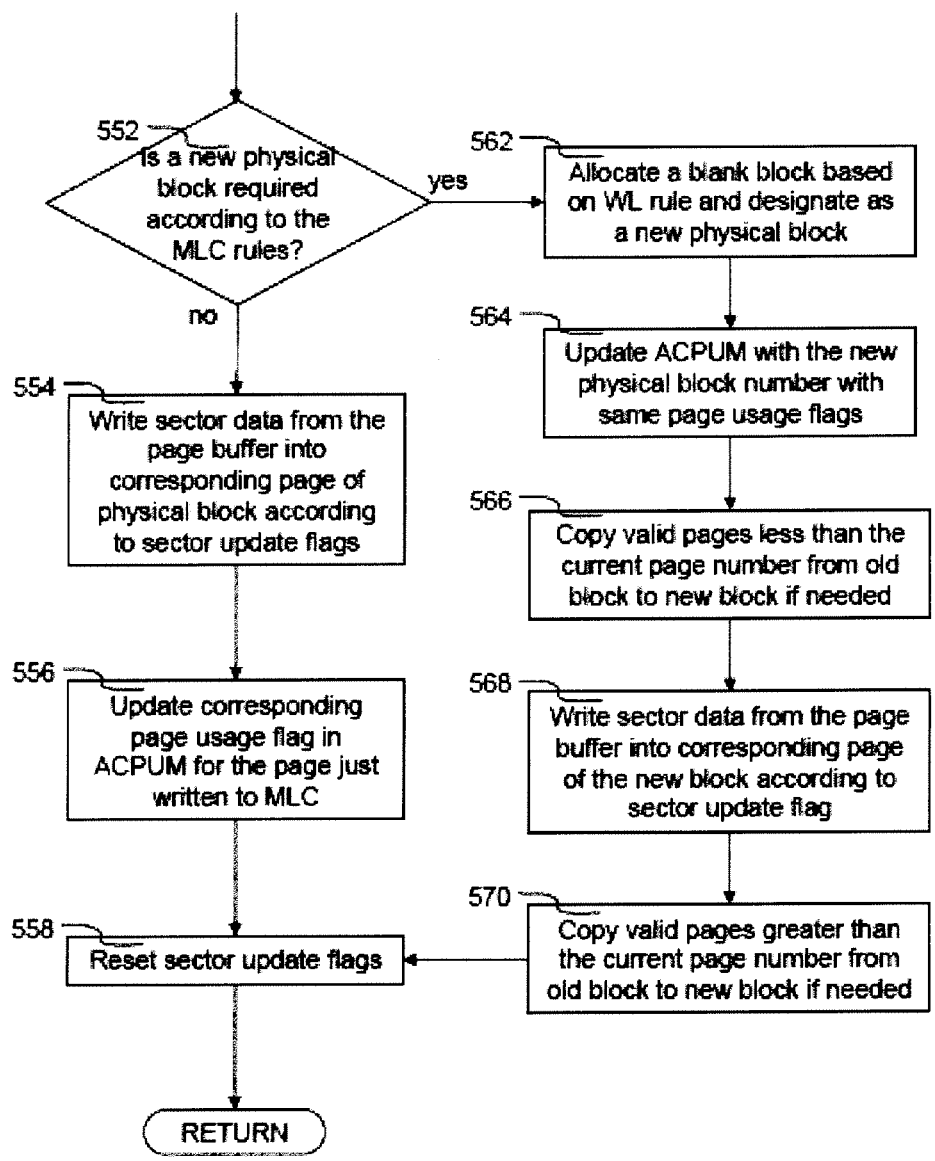

Referring to FIG. 5D, a detailed process of step 550 is shown. First, the process 500 is at decision 552, in which it is determined if a new blank physical block is required for storing the contents of the page buffer 430 based on the MLC based flash memory data programming rules. The rules are as follows: 1) each page can only be programmed once (conventionally referred to as 'NOP=1'); and 2) data programming is performed to a page of a same block in the ascending or sequential order, or each new page must have a high page number in the same block. If 'no' at decision 552, the process 500 writes valid data sectors based on the sector update flags 432 from the page buffer 430 to the page register of the corresponding page of the corresponding physical block of the flash memory at 554. Next, at 556, the process 500 updates the corresponding one of the page usage flags in the ACPUM 306 for the page just written to the flash memory. The process 500 then resets the sector update flags at 558 before returning.

If 'yes' at decision 552, the process 500 searches for a blank physical block based on the wear leveling (WL) rule; once found, the process 500 designates it as a new block at 562. Then, the process 500 updates the ACPUM 306 with the new physical block number for the entry number and keeps the page usage flags the same. It is noted that the entry number is derived from the received LSA. Next, at 566, the process 500 copies all valid pages with page number less than the current page number from the old to the new physical block if needed. The current page number if the page number derived from the received LSA. Then, the process 500 writes the valid data sectors based on the sector update flags 432 from the page buffer 430 to the page register of the corresponding page of the new physical block at 568. Finally if necessary, the process 500 copies all valid pages with page number greater than the current page number from the old to the new physical block at 570. The process 500 resets the sector update flags at 558 before returning.

Figure 5E:
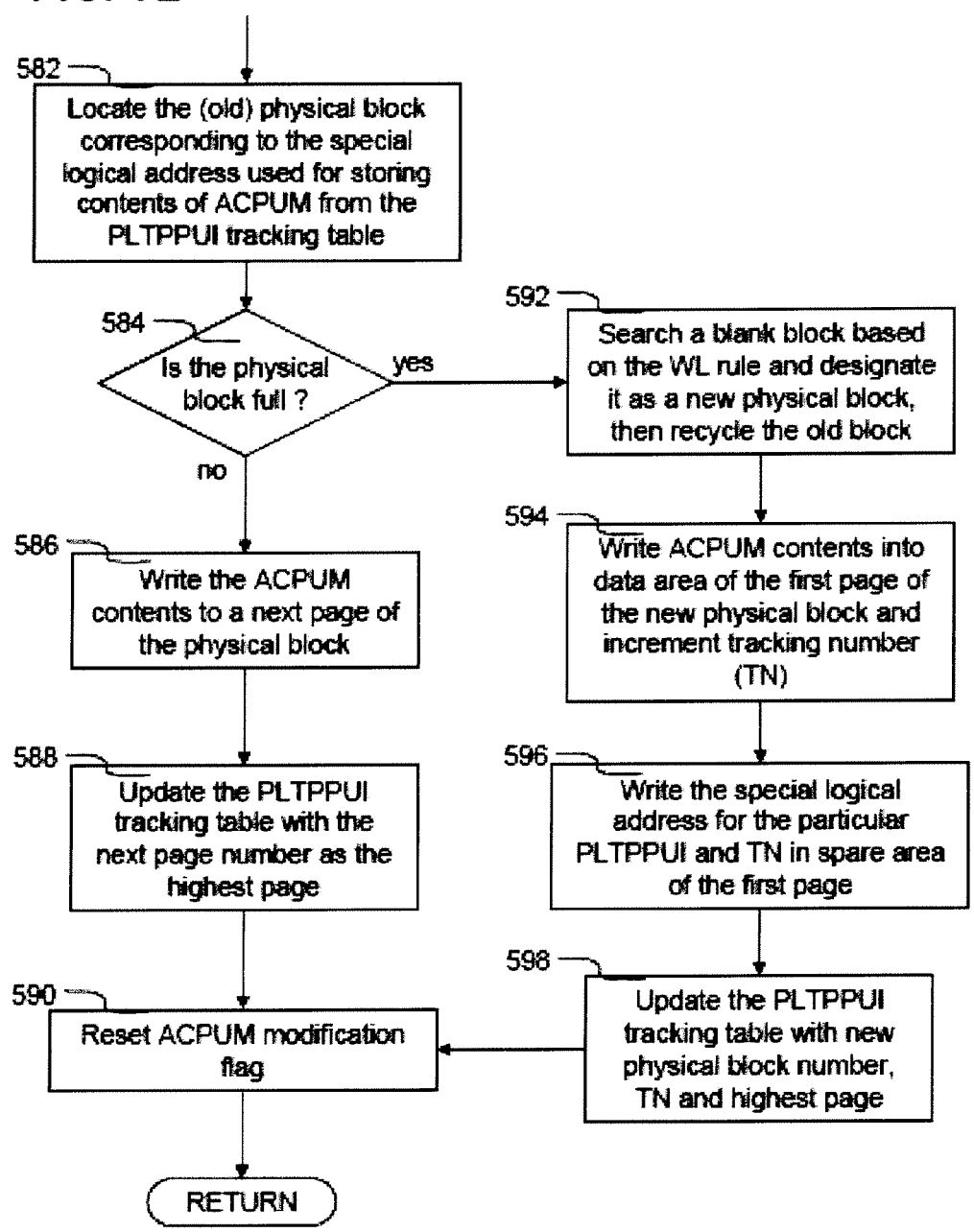

FIG. 5E is a flowchart illustrating step 580 of the process 500. First, in step 580, the process 500 locates the corresponding physical block in the reserved area of the flash memory using a particular one of the first special logical addresses from the PLTPPUI tracking table 308. The corresponding physical block is configured to store the contents of the current ACPUM 306, which is associated with the first special logical address, for example, '0xFFFF0000' for 'PLTPPUI0', '0xFFFF0001' for 'PLTPPUI1', etc. Next, at decision 584, it is determined whether the physical block is full or not. If 'no', the process 500 writes the contents of the ACPUM 306 to the next page in the physical block at 586. It is noted that the MLC based flash memory data programming rule dictates that only a new higher page in the same block is allowed to be programmed or written. Then the process 500 updates the PLTPPUI tracking table 308 to reflect that a new page has been written into the physical block by incrementing the highest page count 448 at 588. Finally, before returning at 590, the process 500 resets the ACPUM modification flag 412 to a 'not modified' status as the contents of the ACPUM 306 have been stored to the flash memory.

Referring back to decision 584, if 'yes', the process 500 searches a blank physical block as a new physical block (e.g., new physical block (PBK#1012) in FIG. 4C) in the reserved area of the flash memory based on the WL rule, and the old physical block (e.g. old physical block (PBK#1000) in FIG. 4C) is sent to a recycling queue for reuse at 592. Next, at 594, the process 500 writes the contents of the ACPUM 306 to the first page (e.g., 'P0' of FIG. 4C) of the new block. After the contents of the ACPUM have been stored in to the data area of the first page, the tracking number (TN) is incremented by one. Next, at 596, the first special logical address for this particular set of PTLPPUI and the new tracking number (TN) are written into the spare area of the first page. The process 500 then updates the PLTPPUI tracking table 308 with the new physical block number, the tracking number and the highest page number for the current set of PLTPPUI at 598. Before returning, the process 500 resets the ACPUM modification flag 412 to a 'not modified' status at 590.

FIGS. 6A-6D collectively show a sequence of data write or program requests to demonstrate the exemplary process 500 of FIGS. 5A-5E. In order to simplify the drawings and description, the sequence of the data write requests is perform on an exemplary flash memory with four sectors per page, four pages per block, and four entries per set. As a result of the simplified assumption, the logical sector address (LSA) 602 received along with the data write request can be processed in a scheme corresponding to Table 1. In other words, two least significant bits of the LSA represent the sector number, next two the page number, next two the entry number, and the remaining bits the set number.

The sequence of the data write requests starts with (a) writing to LSA=0, which corresponds to set 0 (i.e., PLTPPUI0), entry 0, page 0 and sector 0. PLTPPUI0 is loaded into ACUPUM 604, in which the first entry (i.e., entry 0) corresponds to physical block 'PBK#2' and page usage flags 606 are not set. The ACPUMF 614 is set to a 'un-modified' status. The sector data (S0) is written to the first sector of the page buffer 610 and the corresponding flag in the sector update flags 612 is set to a 'V' for valid data. The corresponding path in the process 500 for writing LSA=0 is as follows:

(1) receiving an LSA=0 and extracting set, entry, page and set numbers at 502;

(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (no);
(6) writing received data sector (S0) into the page buffer and marking corresponding sector ($1^{st}$) update flag at 538; and
(7) going back to 'IDLE' for next data transfer request.

The next data write request (b) is to write to LSA=1. The corresponding path is the process 500 is as follows:
(1) receiving an LSA=1 and extracting set, entry, page and set numbers at 502;
(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (yes);
(6) determining whether page and block number current at 534 (yes);
(7) writing received data sector (S1) into page buffer and marking corresponding sector ($2^{nd}$) update flag at 538; and
(8) going back to 'IDLE' for next data transfer request.

Figure 6A:
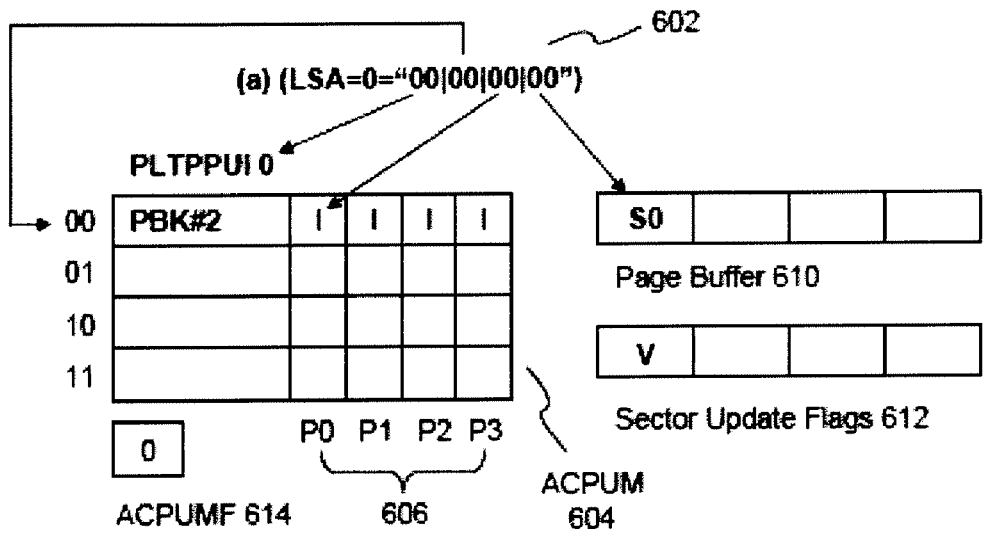
FIGS. 6A-6E collectively show a sequence of data write requests to demonstrate the exemplary process 500 of FIGS. 5A-5E.
Figure 6A:
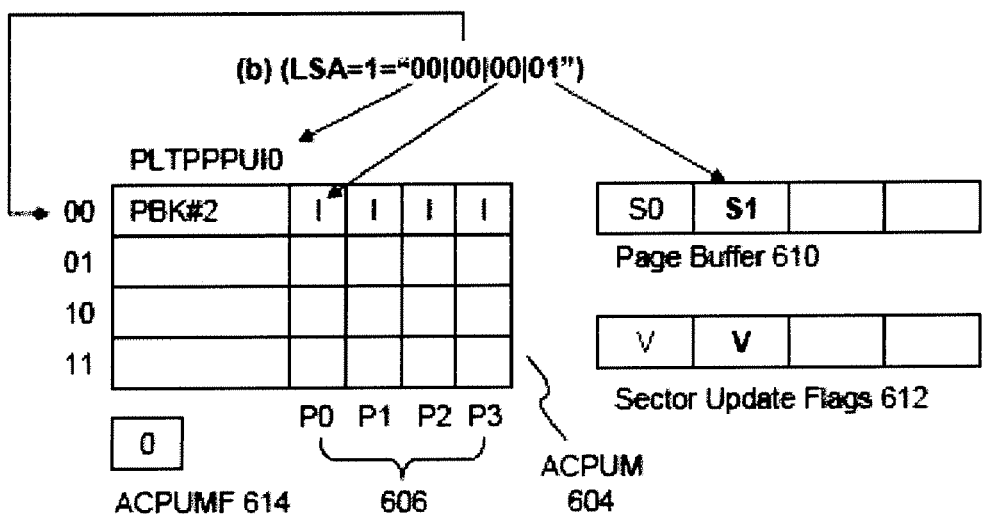
Figure 6B:
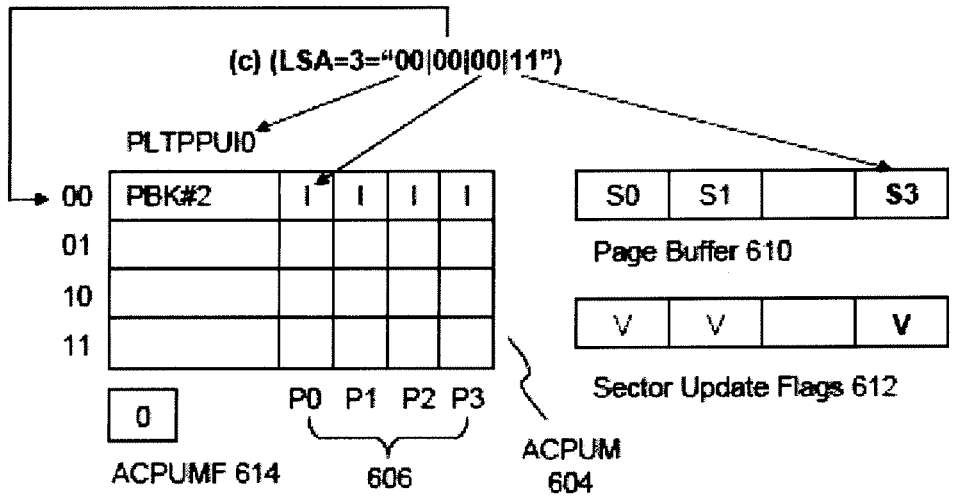
Figure 6B:
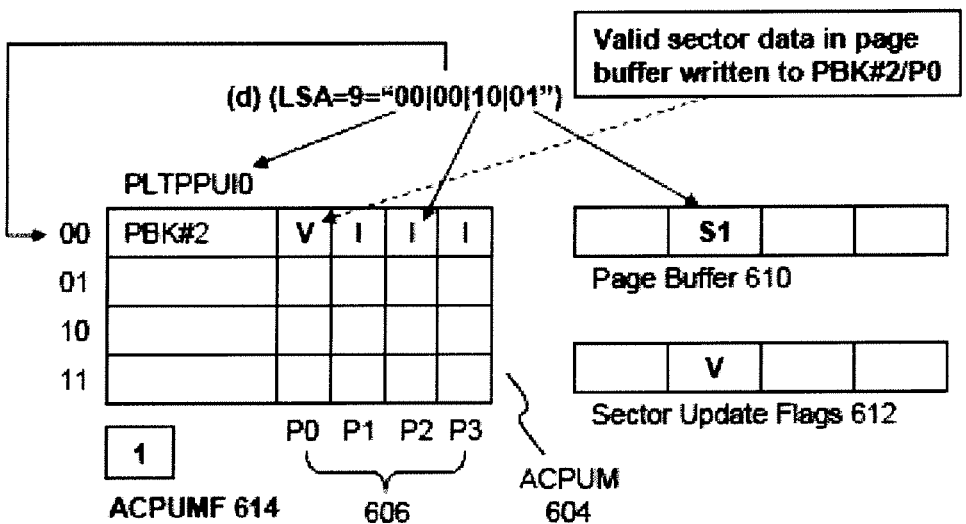

The next data write request (c) is to write to LSA=3 (FIG. 6B). The corresponding path is the process 500 is as follows:
(1) receiving an LSA=3 and extracting set, entry, page and set numbers at 502;
(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (yes);
(6) determining whether page and block number current at 534 (yes);
(7) writing received data sector (S3) into the page buffer and marking corresponding sector ($4^{th}$) update flag at 538; and
(8) going back to 'IDLE' for next data transfer request.

The next data write request (d) is to write to LSA=9 (FIG. 6B). The corresponding path is the process 500 is as follows:
(1) receiving an LSA=9 and extracting set, entry, page and set numbers at 502;
(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (yes);
(6) determining whether page and block number current at 534 (no, same block but different page);
(7) writing the page buffer contents to the corresponding page (first page of PBK#2) at 550, which includes determining a new block is required at 552 (no); writing sector data to the first page of PBK#2 at 554; updating at the corresponding page usage flag (P0) in ACPUM at 556 and resetting sector update flags at 558;
(8) setting the ACPUMF (i.e., 1 for 'modified') at 536; and
(9) writing received data sector (S1) into the page buffer and marking corresponding sector ($2^{nd}$) update flag at 538 before going back to "IDLE".

Figure 6C:
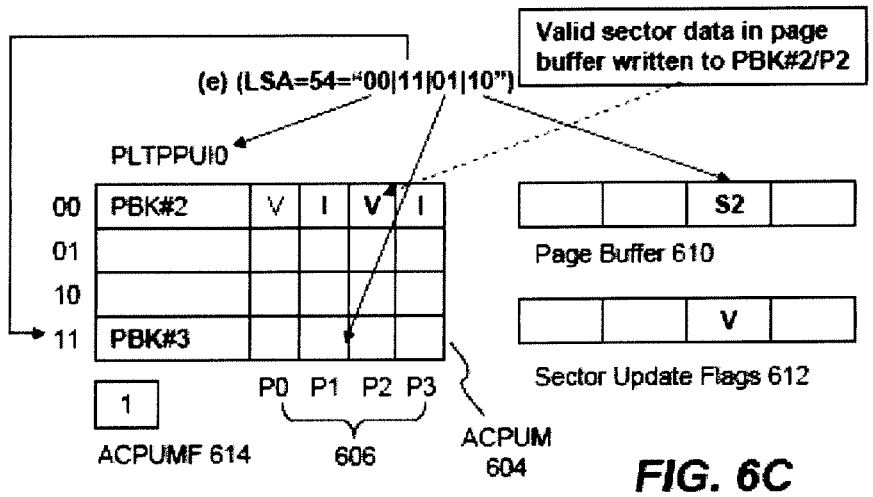

The next data write request (e) is to write to LSA=54 (FIG. 6C). The corresponding path is the process 500 is as follows:
(1) receiving an LSA=54 and extracting set, entry, page and set numbers at 502;
(2) determining whether ACPUM contains a current set of PLTPPUI at 504 (yes, PLTPPUI0);
(3) reading physical block number (PBK#3) at entry 3 (i.e., binary '11') at 516;
(4) determining data transfer request type at 518 (write);
(5) determining whether page buffer contents have been modified at 532 (yes);
(6) determining whether page and block number current at 534 (no, different block);
(7) writing the page buffer contents to the corresponding page (third page of PBK#2) at 550, which includes determining a new block is required at 552; writing sector data to the third page of PBK#2 at 554 (no); updating at the corresponding page usage flag (P2) in ACPUM at 556 and resetting sector update flags at 558;
(8) setting the ACPUMF (i.e., 1 for 'modified') at 536; and
(9) writing received data sector (S2) into the page buffer and marking corresponding sector ($3^{rd}$) update flag at 538 before going back to "IDLE".

Figure 6D:
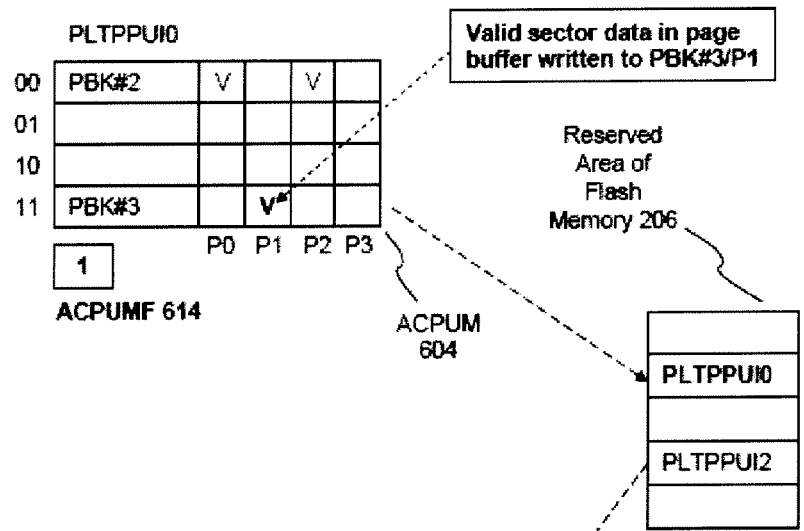
Figure 6D:
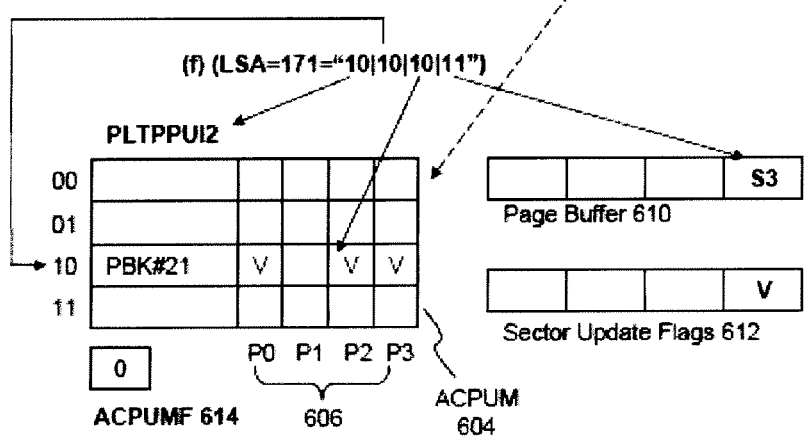

Finally, the next data write request (f) is to write to LSA=171 (FIG. 6D). The corresponding path is the process 500 is as follows:
(1) receiving an LSA=171 and extracting set, entry, page and set numbers at 502;
(2) determining whether ACPUM contains a current set of PLTPPUI at 504 (no, PLTPPUI0 does not match PLTPPUI2);
(3) determining whether the page buffer contents need to be stored at 506 (yes);
(4) writing the page buffer contents to the corresponding page (second page of PBK#3) at 550, which includes determining a new block is required at 552; writing sector data to the second page of PBK#3 at 554; updating at the corresponding page usage flag (P1) in ACPUM at 556 and resetting sector update flags at 558 and setting the ACPUMF (i.e., 1 for 'modified') at 508; (shown in upper half of FIG. 6D)
(5) determining whether ACPUM has bee modified at 510 (yes);
(6) writing the ACPUM contents to corresponding physical block corresponding to the first special logical address for particular one of the N sets of PLTPPUI (PLTPPUI0), which includes locating the physical block from the PLTPPUI tracking table at 582; determining if the physical block is full at 584 (no); writing the ACPUM contents to a next page in the physical block at 586; updating the PTLPPUI tracking table with the next page number as the highest page number at 588; and resetting the ACPUMF at 590 (i.e., 0 for 'un-modified');
(7) loading a corresponding set of PLTPPUI (PLTPPUI2) from MLC to ACPUM at 514;
(8) reading physical block number (PBK#21) at entry 2 (i.e., binary '10') at 516;
(9) determining data transfer request type at 518 (write);
(10) determining whether page buffer contents have been modified at 532 (no);
(11) writing received data sector into the page buffer ad marks the corresponding one of the sector update flags at 538 before going back to the 'IDLE' state;

(12) determining whether the 'IDLE' time has exceeded a predefined period at 540 (yes); and

Figure 6E:
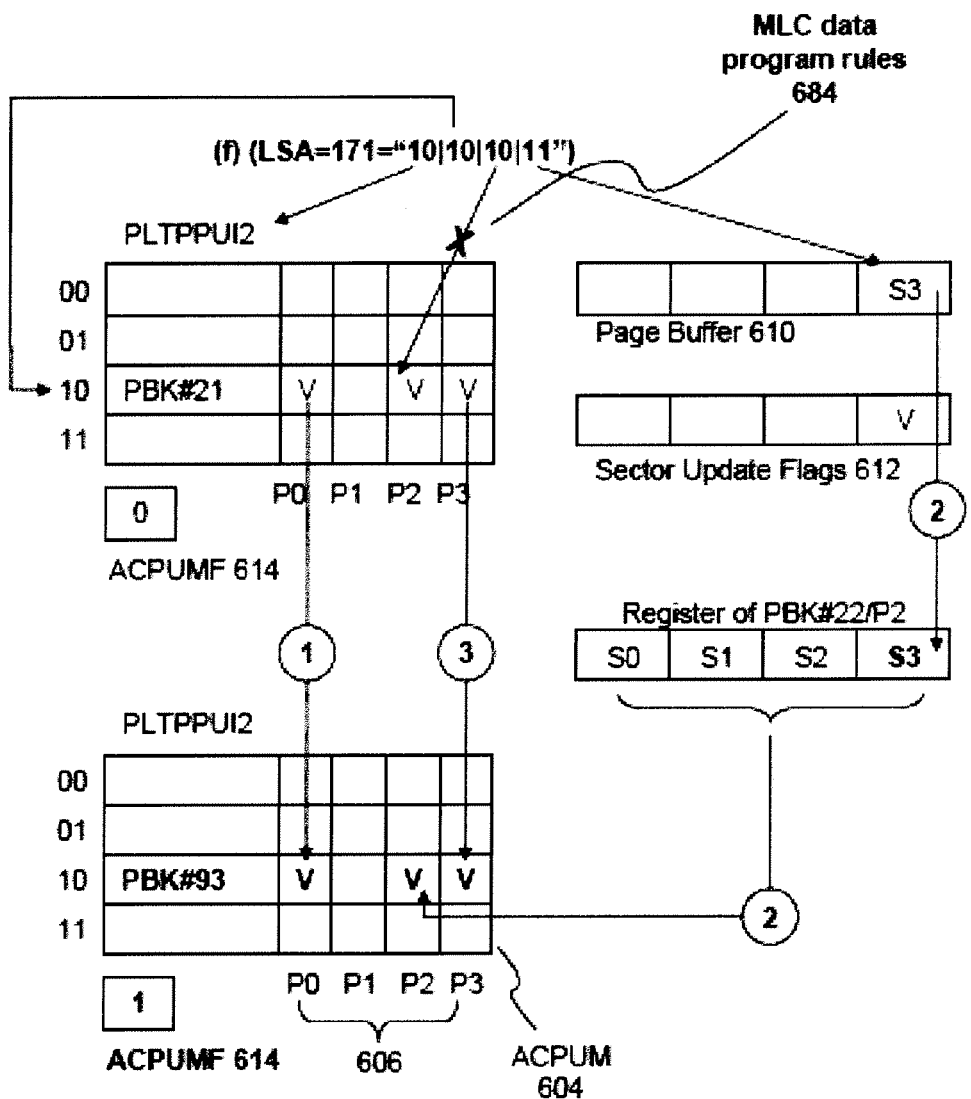

(13) performing background recycling of old blocks with stale data and writing the modified page buffer and ACPUM to MLC at 542 (more details in FIG. 6E).

FIG. 6E is a diagram showing a complicated data program or write involving a physical block containing data that prevents another data program operation directly in accordance with the MLC data programming rules. Using the sequence of data write requests shown in FIGS. 6A-6D, after the final data write request (f) has been completed. Both the page buffer 610 and ACPUM 604 have been modified, but yet to be stored in the flash memory. Due to data already existed in certain pages of the physical block (i.e. PBK#21), the MLC data program rules 684 prevent the modified page buffer 610 be written to PBK#21. A new blank block (i.e., PBK#93) is allocated and assigned to hold the data in the old block (PBK#21) including updates from the modified page buffer 610. The corresponding path in the step 550 of the process 500 is as follows:

(1) determining a new physical block is required according to the MLC rules at 552 (yes);

(2) allocating and assigning a new block based on the wear leveling rule at 554;

(3) updating the ACPUM 604 with the new block number (PBK#93) and same page usage flags at 564;

(4) if required, copying the valid pages with page number smaller than the current page number (i.e., P2 or $3^{rd}$ page derived from LSA) from the old block (PBK#21) to the new block PBK#93 at 566 (see STEP 1 in circle in FIG. 6E);

(5) writing sector data (S3) from the page buffer to the register of the corresponding page of PBK#93 and thus updating the page in PBK#93 at 568 (see STEP 2 in circle in FIG. 6E);

(6) if required, copying the valid pages with page number greater than the current page number (i.e., P2 or $3^{rd}$ page derived from LSA) from the old block (PBK#21) to the new block PBK#93 at 570 (see STEP 3 in circle in FIG. 6E); and (7) resetting the sector update flags at 558 before following the remaining data write steps of the process 500.

Referring now to FIGS. 7A-7E, which collectively are a flowchart illustrating an exemplary process 700 of initialization of a large capacity flash memory device in accordance with one embodiment of the present invention. The process 700 starts with a power up, for example, a flash memory device is plugged into a host 109. Next, the process 700 recreates the PLTPPUI tracking table 308 of FIG. 3 from stored N sets of PLTPPUI in the reserved area of the flash memory at 710. Then the process 700 validates the stored wear leveling and error correction code information with actual state of all of the physical blocks at steps 730 and 750, respectively. At 770, the process 700 verifies and validates the store PLTPPUI records against actual state of the physical blocks associated with a plurality of first special logical addresses. Finally, the process loads one of the N sets of PLTPPUI into ACPUM 306 at 790 before the initialization ends. The details of steps 710, 730, 750 and 770 are shown and described in respective FIGS. 7B, 7C, 7D and 7E.

Figure 7A:
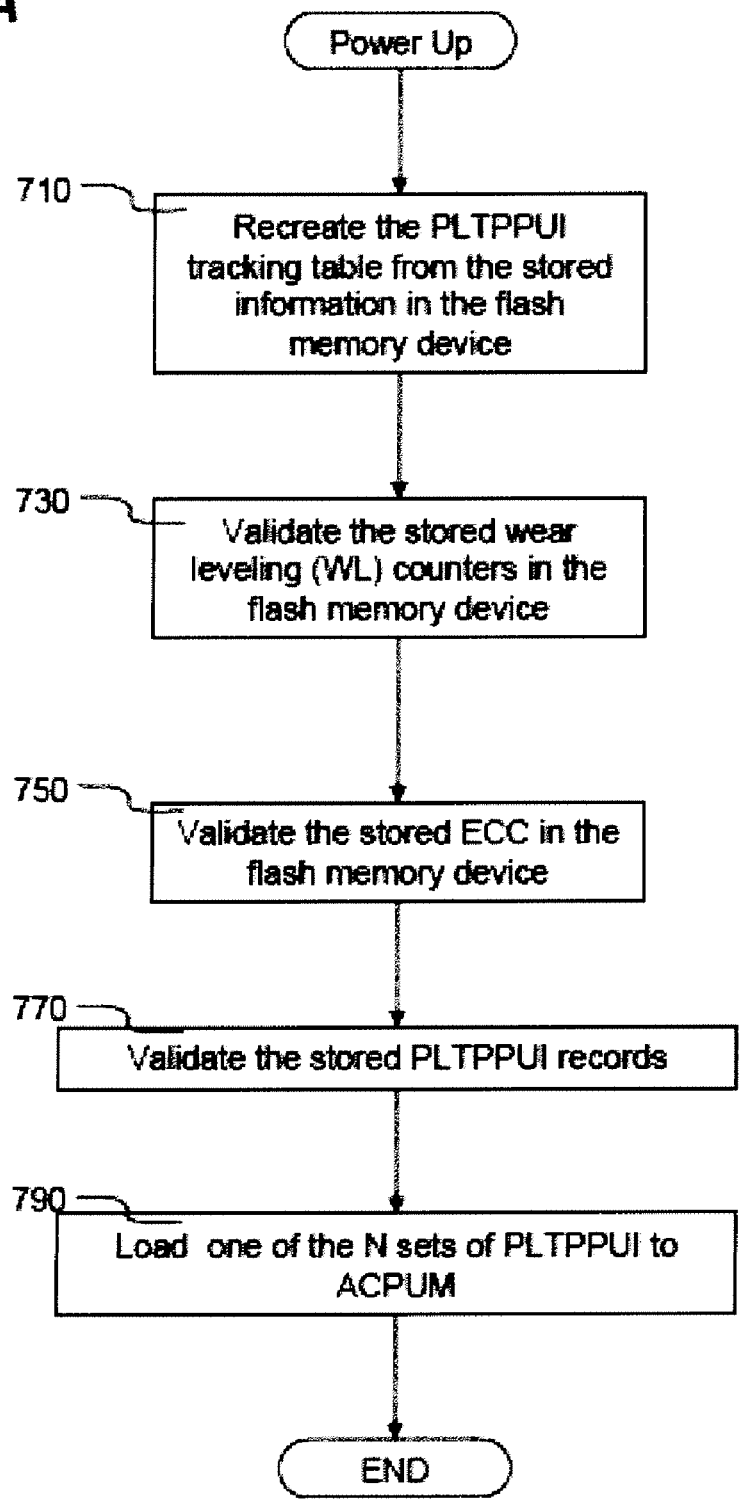
Figure 7B:
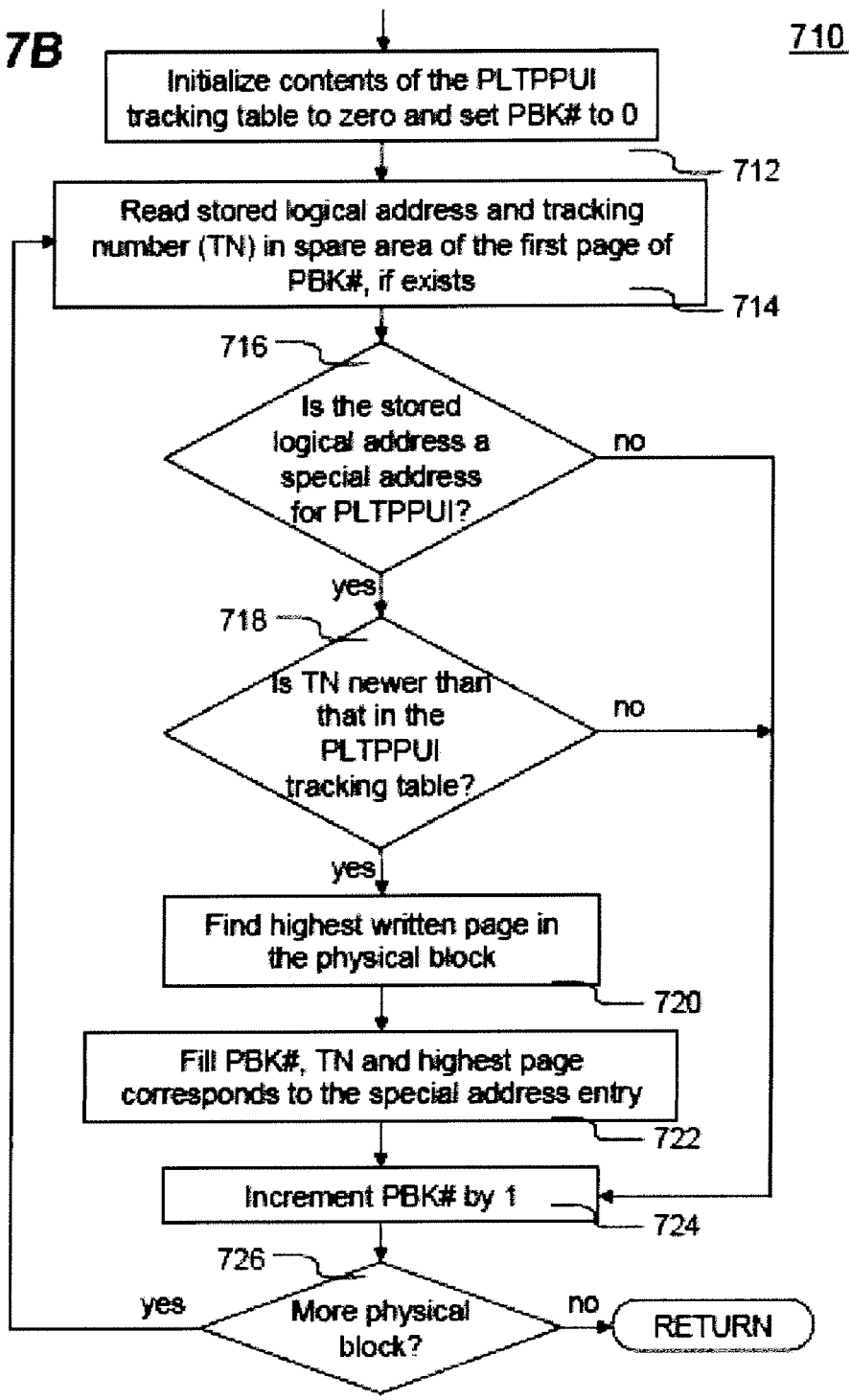

Shown in FIG. 7B, the process 700 initializes contents of the PLTPPUI tracking table 308 to zero and a physical block counter (PBK#) to 0 at 712. Next, the process 700 reads stored logical address and tracking number (TN) in the spare area of the first page of the physical block 'PBK#' at 714. Then the process 700 moves to decision 716, in which it is determined whether the stored logical address is one of the first special addresses for storing PLTPPUI issued by the FW and microcontroller. If 'no', the process 700 simply skips this physical block by incrementing the physical block counter 'PBK#' by one at 724. Next if additional physical block determined at decision 726, the process 700 moves back to step 714 for processing the next physical block, otherwise the step 710 is done.

If 'yes' at the decision 716, the process 700 follows the 'yes' branch to another decision 718. It is then determined whether the stored tracking number is newer than the one listed in the PLTPPUI tracking table 308. For example, the contents in the PLTPPUI tracking table is initialized to zero, any stored tracking number (TN) greater than zero indicates that the stored records are newer. If 'no' at decision 718, the process 700 skips this physical block similar to the 'no' branch of decision 716. However, if 'yes' at decision 718, the process 700 searches and locates a highest written page in this physical block 'PBK#' at 720. Next, at 722, the process 700 writes the 'PBK#', TN and highest page number in the PLTPPUI tracking table corresponding to the first special logical address. Finally, the process 700 increments the physical block count 'PBK#' by one at 724, then moves to decision 726 to determine either moving back to 714 for processing another physical block or ending the step 710.

Details of step 730 are shown in FIG. 7C. At 732, the process 700 initializes a physical block counter 'PBK#' and a group counter 'm' to zero. Next, the process 700 loads a '$m^{th}$' group of stored WL/BB tracking table into a scratch memory space (e.g., the page buffer 314 of FIG. 3) at 734. Then the process 700 reads the wear leveling (WL) counter and bad block indicator for the physical block 'PBK#' at 736. The process 700 moves to decision 738, in which it is determined whether the stored information is in conflict with the physical state of 'PBK#'. If 'yes', the process 700 corrects the conflict information to be consistent with the physical state in the scratch memory at 740. If 'no' at decision 738, there is no need to correct the conflict.

Next, at 742, the physical block counter 'PBK#' is incremented by one. The process 700 moves to another decision 744, it is determined if there is additional block in the '$m^{th}$' group. If 'yes', the process 700 goes back to step 736 reading another WL counters of another physical block to repeat the above steps until the decision 744 becomes 'no'. The process 700 updates the stored WL/BB tracking table 310 at 746. At next decision 748, it is determined if there is any more physical block. If 'yes', the process 700 increments the group counter at 749 then goes back to 734 for repeating the above steps for another group. Otherwise, the step 730 returns when the decision 748 is 'no'.

Figure 7D:
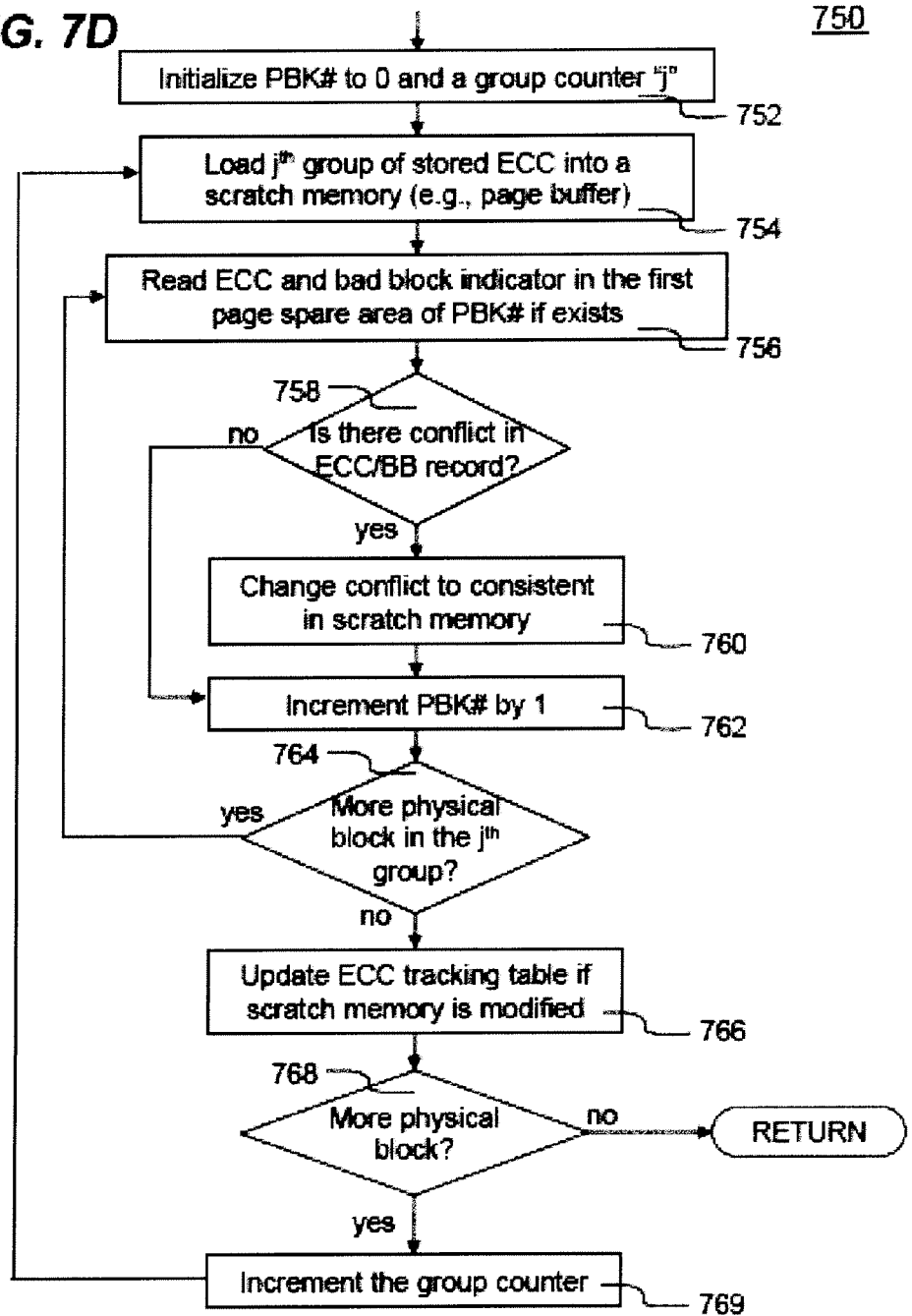

FIG. 7D shows details of step 750, which is substantially similar to the step 730. Instead of checking and correcting conflict WL/BB information, the step 750 validates and corrects the stored error correction code (ECC) for all physical blocks. The number of group is related to the size of the scratch memory. For example, a 2048-byte page buffer can provide space for holding a group of 1024 WL counters, if each of the WL counters is a 16-bit number. As to the 8-bit ECC, the same 2048-byte page buffer may hold a group of 2048 ECC codes.

Figure 7E:
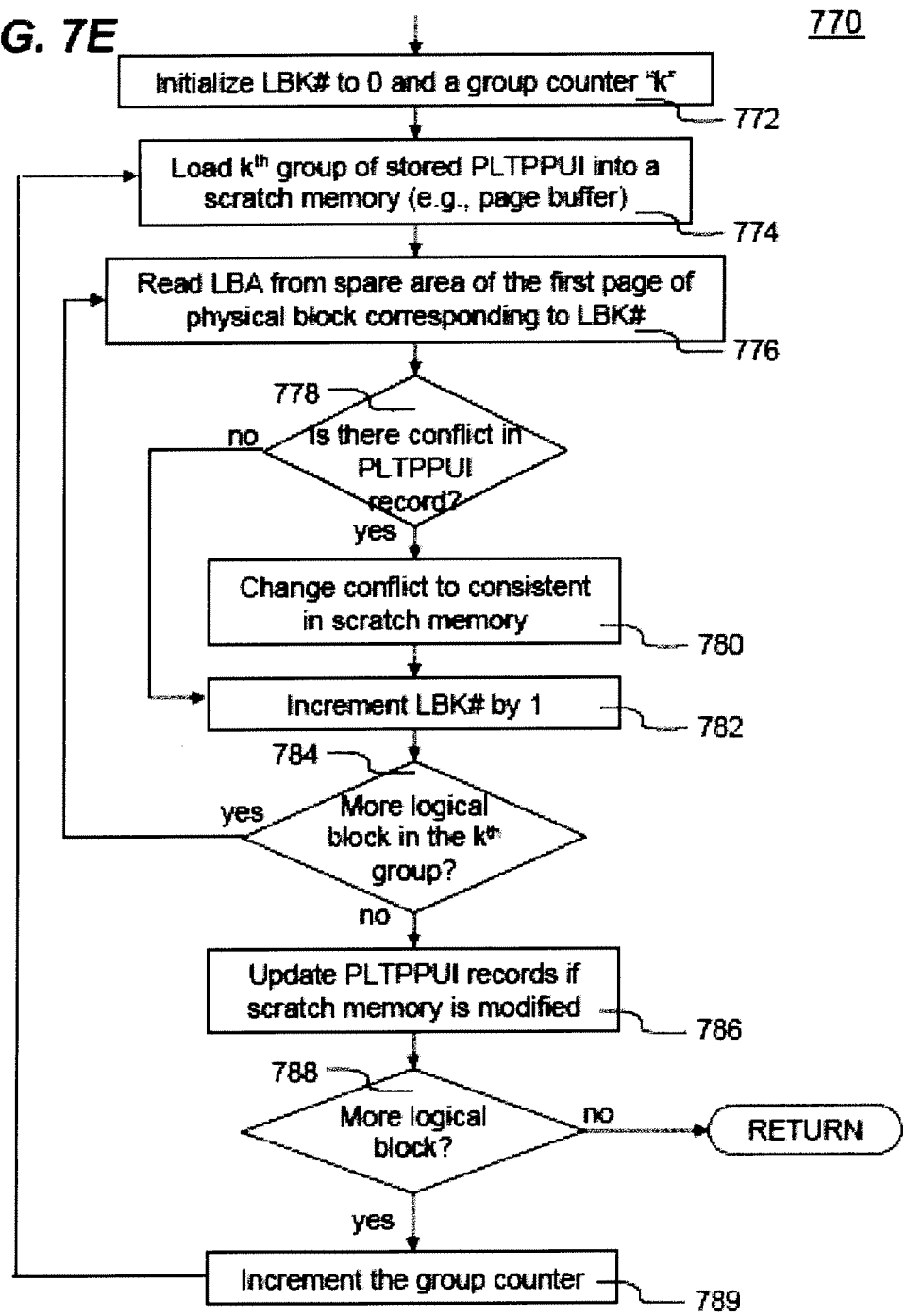

FIG. 7E shows details of step 770. At 772, the process 700 initializes a logical block counter 'LBK#' and a group counter 'k' to zero. The process 700 loads a '$k^{th}$' group of stored PLTPPUI into a scratch memory space (e.g., a page buffer or other available memory) at 774. The process 700 reads logical block address from the spare area of the first page of a physical block corresponding to the 'LBK#' at 776. Next, at decision 778, it is determined whether there is conflict between the stored PLTPPUI and the physical page usage of the physical block. If 'yes', the conflict is corrected with the physical state in the scratch memory at 780. Otherwise, the process 700 skips step 780. Next, at 782, the process 700 increments the logical block counter 'LBK#' by one. The process 700 then moves to another decision 784, in which it is determined if there is more block in the 'k$^{th}$' group. If 'yes', the process 700 moves back the step 776 repeating the process until the decision 784 becomes 'no'. Then the process 700 updates the stored PLTPPUI records if the scratch memory has been altered at 786. Next, at decision 788, if there is more logical block, the process 700 follows the 'yes' branch to step 789 by incrementing the group counter and repeating the process from step 774 until the decision 788 becomes 'no', in which the step 770 ends.

Each entry record of PLTPPUI is 18-byte, which is a sum of 2-byte physical block number plus 128-bit (i.e., 16-byte) of page usage flags (i.e., 128 pages per block). Using 2048-byte page buffer as a scratch memory can only hold a group of 113 entry records. One may use a larger memory such as ACPUM 306 as the scratch memory, which may hold more entry records thereby reducing the initialization time.

Various specific embodiments of the present invention will now be described with reference to FIGS. 8-21, where FIGS. 8-17 depict top press button embodiments of the present invention, and FIGS. 18-21 depict a side-push embodiment of the present invention. In the top press button embodiments, the actuator portion of the spring-loaded locking mechanism protrudes through an opening in the housing. In contrast, in the side-push embodiment of the present invention, actuation of the spring-loaded locking mechanism involves pressing the swivel rack assembly when the swivel rack assembly is in the fully retracted position. Those skilled in the art will recognize that modifications to the disclosed spring-loaded locking mechanisms and associated device structures are possible without falling outside the spirit and scope of the present invention. Therefore, the features associated with the various specific embodiments are intended to be exemplary, and not to limit the scope of the appended claims unless specifically recited.

Figure 8:
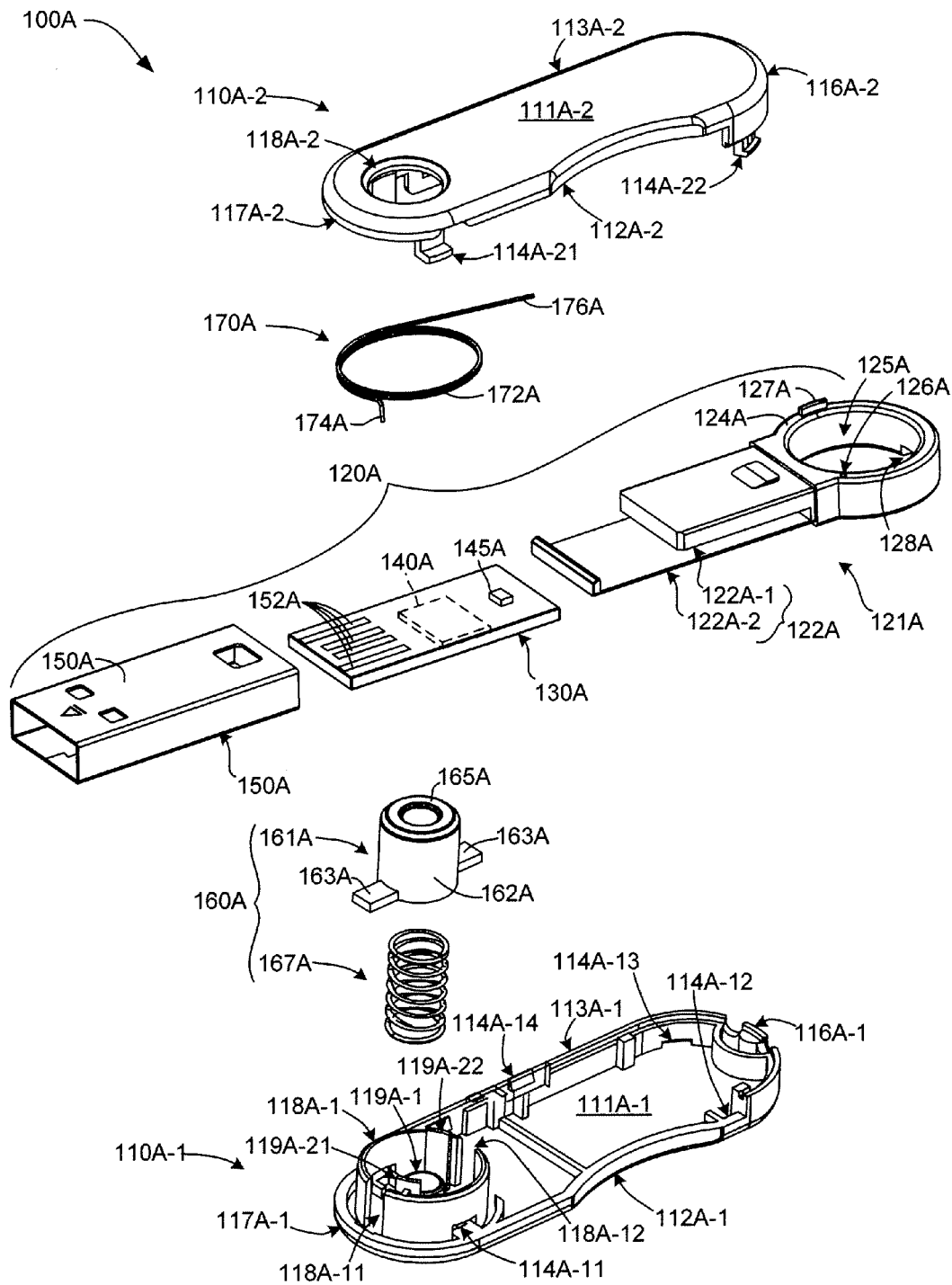
FIG. 8 is an exploded perspective view showing a swivel-type USB device according to a specific embodiment of the present invention.

FIG. 8 is an exploded perspective view showing a swivel-type USB device 100A according to a first specific embodiment of the present invention. USB device 100A generally includes a two-part housing including an upper housing portion 100A-2 and a lower housing portion 100A-1, a swivel rack assembly 120A, a spring-loaded locking mechanism 160A, and a torsion spring 170A.

Lower and upper housing portions 110A-1 and 110A-2 are molded plastic structures that fit together as described below to form housing 110A (as described below). According to an aspect of the present embodiment, lower housing portion 110A-1 and upper housing structure 110A-2 include corresponding male and female snap-coupling structures that cooperate to facilitate snap-coupling of lower housing portion 110A-1 to upper housing portion 110A-2. In an alternative embodiment, ultrasonic welding may be used in place of the snap-coupling mechanism described above to secure housing structure.

Lower housing portion 110A-1 includes a lower wall 111A-1 that extends between open side wall 112A-1 and closed side wall 113A-1, and between rear end wall section 116A-1 and front end wall section 117A-1. Locking slots 114A-11 and 114A-12 are defined on open side wall 112A-1, and locking slot 114A-13 is formed on closed side wall 113A-1. A locking structure 114A-14 is also disposed on closed side wall 113A-1. A cylindrical mounting structure 118A-1 is integrally molded onto lower wall 111A-1 adjacent front end 117A-1, and defines two vertical slots 118A-11 and 118A-12. A central post 119A-1 is integrally molded onto lower wall 111A-1 and is centrally positioned inside cylindrical mounting structure 118A-1, and positioning structures 119A-21 and 119A-22 disposed on cylindrical mounting structure 118A-1 and extending inward toward central post 119A-1.

Upper housing portion 110A-2 includes an upper wall 111A-2 that extends between open side wall 112A-2 and closed side wall 113A-2, and between rear end wall section 116A-2 and front end wall section 117A-2. Locking pawls 114A-21 and 114A-22 are disposed on open side wall 112A-1, and are positioned to align with and snap-couple into locking slots 114A-11 and 114A-12 when upper housing portion 110A-2 is mounted onto lower housing portion 110A-1. Additional slots and locking structures are disposed on upper housing portion 110A-2 that operably engage and snap-couple onto corresponding structures provided on lower housing portion 110A-2 (e.g., locking slot 114A-13 and locking structure 114-14). An actuator opening 118A-2 is defined in upper wall 111A-2 adjacent front end 117A-1.

Referring to the center of FIG. 8, swivel rack assembly 120A generally includes a swivel aim 121A including a carrier tray 122A, a molded, single piece chip-on-board (COB) type PCBA 130A, and an elongated metal connector plug shell 150A. Swivel aim 121A includes a plastic carrier tray 122A and an annular pivot ring 124A that is fixedly connected or integrally molded to a rear portion of carrier tray 122A. Annular pivot ring 124A includes a central opening 125A defined in the central area of pivot ring 124A that receives a pivot structure therein as described below. Pivot ring 124A defined a torsion spring connection hole 126A and a guide rib 127A for supporting torsion spring 170A in the manner described below, and a pair of locking slots 128A (one shown) that serve as part of a locking/positioning mechanism as described below. Carrier tray 122A includes an upper tray portion 122A-1 and a lower tray portion 122A-2 that form a clip-like structure for receiving and securing PCBA 130A. PCBA 130A includes standard USB metal contacts 152A formed on a first (e.g., upper) surface of a PCB, and IC components (e.g., flash memory chip 140A) mounted on the opposite (e.g., lower) surface of the PCB. A molded casing is then mounted or otherwise formed over the IC components (i.e., over the lower surface of the PCBA). The casing has a planar surface that is parallel to the PCB and extends along the entire length of the PCBA (e.g., from a front edge of the plug structure to a rear edge of the PCB). Accordingly, PCBA 130A is a flat, low-profile (thin) structure that can be easily incorporated into USB device 100A, e.g., using carrier 121A, by mounting PCBA 130A between upper tray portion 122A-1 and lower tray portion 122A-2 of carrier tray 122A. Plug connector 150A includes an elongated metal box-like structure that is fixedly connected to a front end of carrier tray 122 over PCBA 130A such that metal contacts 152A are exposed in a gap according to USB standards. An optional light emitting diode (LED) 145A is then surface mounted on the upper surface of PCBA 130A.

Referring to the lower middle portion of FIG. 8, spring-loaded locking mechanism 160A includes an actuating structure 161A and a coil-type actuating spring 167A. Actuating structure 161A includes a hollow cylindrical body 162A, locking tabs 163A extending outwardly from a lower end of cylindrical body 162A, and a push-button structure 165A mounted over a top end of cylindrical body 162A. Coil-type actuating spring 167A is sized to fit over central post 119A-1 on lower housing portion 110A-1 and inside hollow cylindrical body 162A.

Torsion spring 170A is a wire bent to include a coil spring body 172A, a vertical (first) end portion 174A, and a horizontal (second) end portion 176A. Torsion spring 170A is formed according to known techniques.

FIGS. 9(A) to 9(D) illustrate a simplified process for assembling USB device 100A according to an embodiment of the present invention.

Figure 9A:
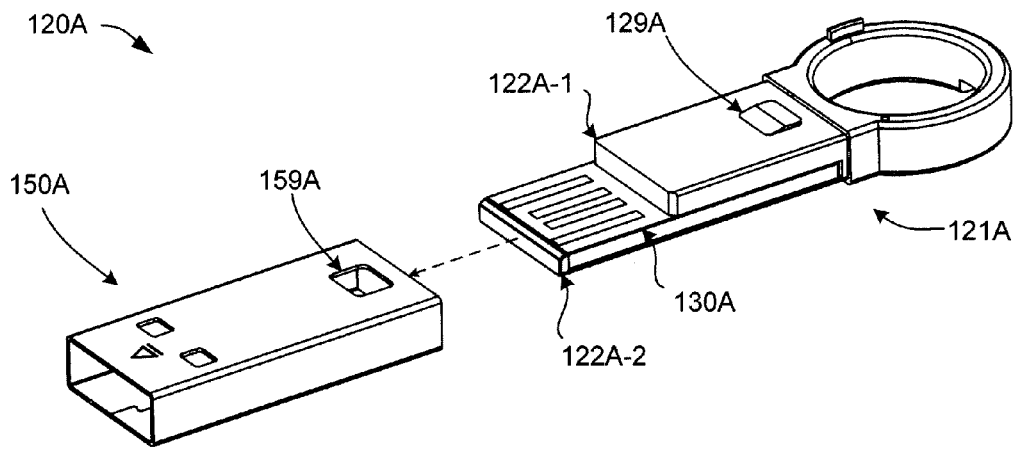
FIGS. 9A), 9(B), 9(C) and 9(D) are exploded perspective views showing the USB device of FIG. 8 during assembly.

Referring to FIG. 9(A), swivel rack assembly 120A is assembled by mounting COB PCBA 130A between upper tray portion 122A-1 and lower tray portion 122A-2 of carrier 121A, and then this sub-assembly is inserted into a rear opening defined in plug connector 150A until a coupling structure 129A disposed on upper tray portion 122A-1 is received in a lock opening 159A defined in plug connector 150A.

Figure 9B:
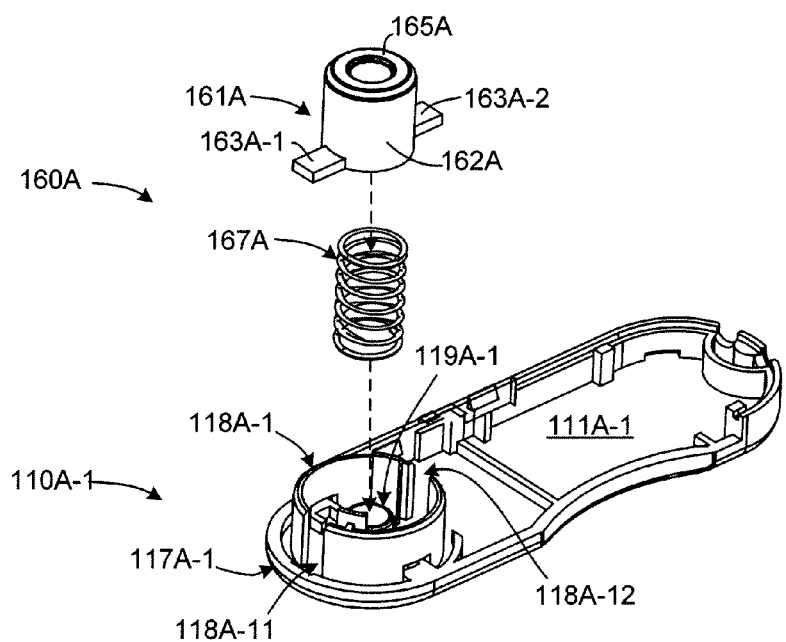

Referring to FIG. 9(B), coil-type actuating spring 167A is then mounted over central post 119A-1 on lower housing portion 110A-1 and is held in place by a portion of lower wall 111A-1. Actuating structure 161A is then mounted onto lower housing portion 110A-1 such that coil-type actuating spring 167A and central post 119A-1 are received inside hollow cylindrical body 162A, and locking tabs 163A-1 and 163A-2 extending outwardly from a lower end of cylindrical body 162A are received inside vertical slots 118A-11 and 118A-12, respectively, with a push-button structure 165A extending above the upper edge of cylindrical mounting structure 118A-1.

Figure 9C:
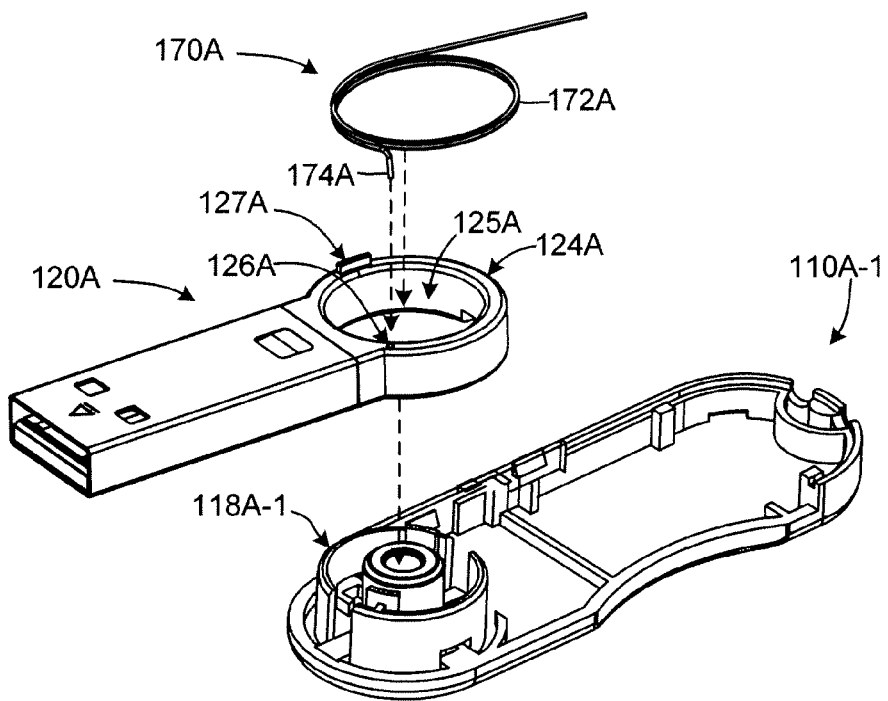

Referring to FIG. 9(C), swivel rack assembly 120A and torsion spring 170A are then mounted onto lower housing portion 110A-1. To facilitate easy assembly, torsion spring 170A is mounted onto swivel rack assembly 120A such that vertical end portion 174A is inserted into torsion spring connection hole 126A, and coil spring body 172A of torsion spring 170A in mounted on the upper surface of pivot ring 124A and held in place by guide rib 127A. This sub-assembly is then mounted onto lower housing portion 110A-1 such that cylindrical mounting structure 118A-1 is inserted inside central opening 125A.

Figure 9D:
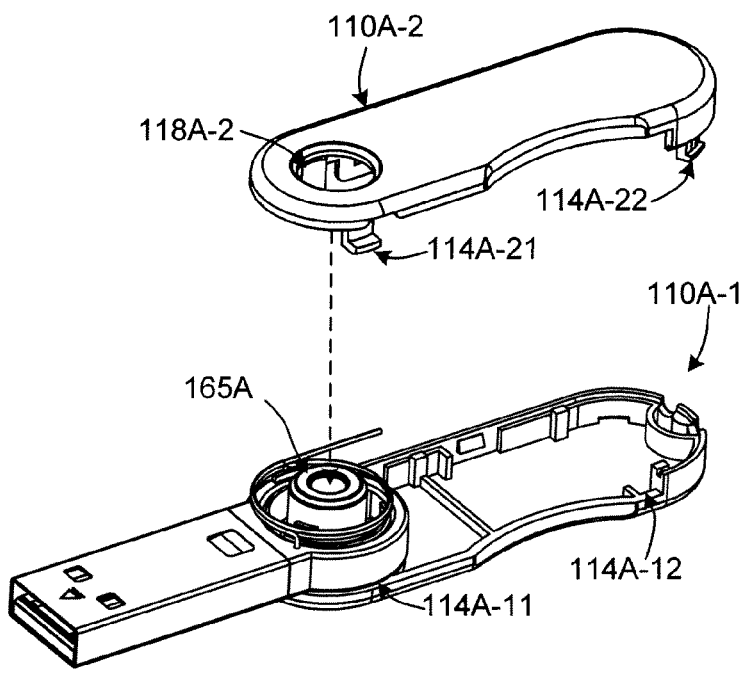
Figure 10:
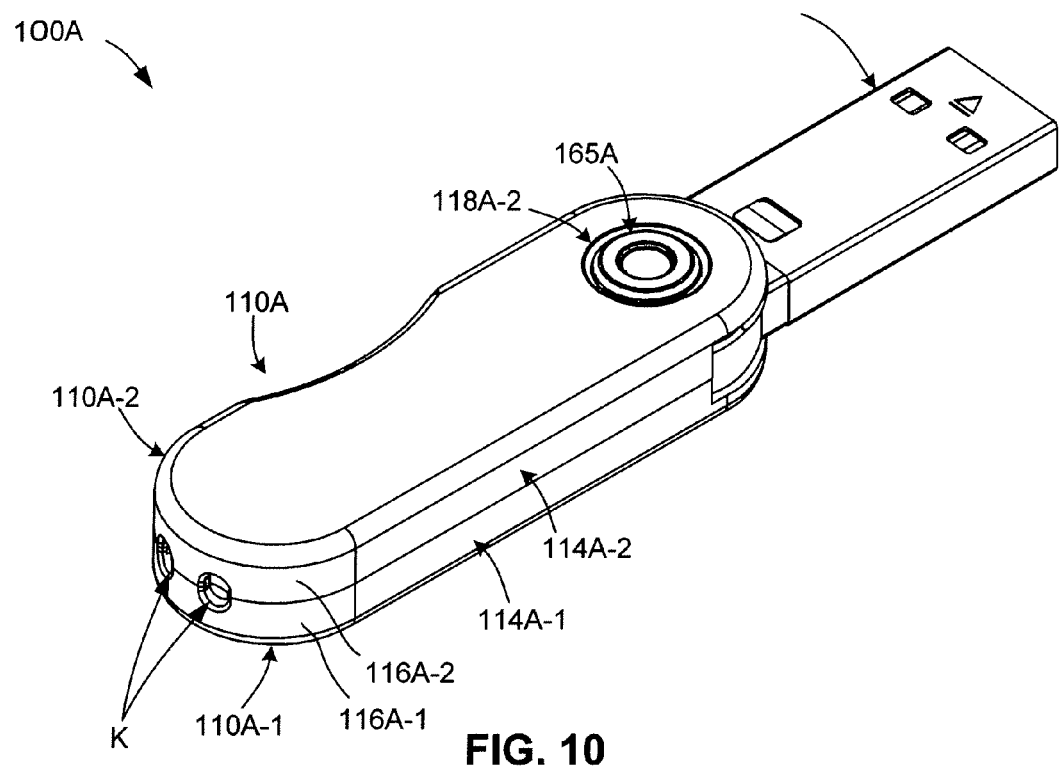
FIG. 10 is a rear top perspective view showing the USB device of FIG. 8 during operation after assembly.

Referring to FIG. 9(D), upper housing portion 110A-2 is mounted onto lower housing portion 110A-1 to complete the assembly process. In particular, upper housing portion 110A-2 is mounted onto lower housing portion 110A-1 such that push-button structure 165A extends through actuator opening 118A-2, and such that the various snap-coupling structures (e.g., locking pawls 114A-21 and 114A-22 are snap-coupled into locking slots 114A-11 and 114A-12). FIG. 10 is a rear-top perspective view showing swivel-type USB device 100A in the fully assembled state, with upper housing portion 110A-2 mounted onto lower housing portion 110A-1 such that push button 165A extends through actuator opening 118A-2. Note that rear wall portion 114A-1 of lower housing portion 110A-1 aligns with and rear wall portion 114A-2 of upper housing portion 110A-2 to form a wall that closes the rear side surface of housing 110A. Similarly, rear end wall sections 116A-1 and 116A-2 combine to form a closed wall covering the rear end of USB device 100A. Optional keychain holes K are defined at the seam between rear end wall sections 116A-1 and 116A-2 to facilitate attachment of a key chain or other useful transportation structure. Front side views of swivel-type USB device 100A are essentially identical to the structures shown in FIG. 1(A).

FIGS. 11(A) to 11(D) are simplified cross-sectional side view showing USB device 100A during operation.

Figure 11A:
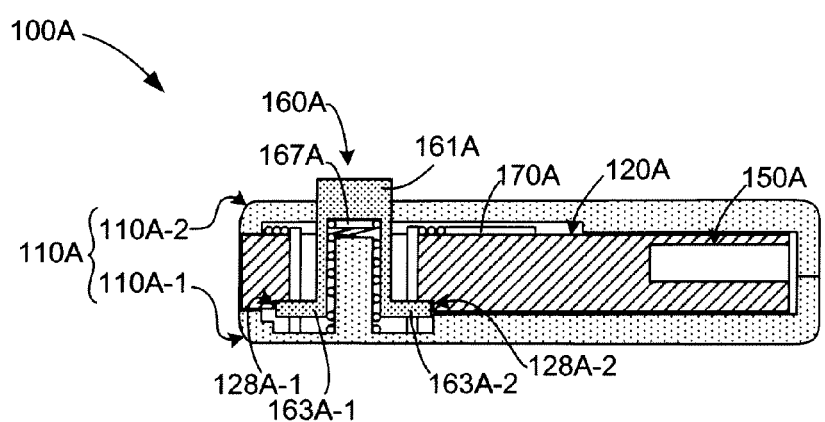
FIGS. 11(A), 11(B), 11(C) and 11(D) are simplified cross-sectional side views showing the USB device of FIG. 8 during operation.

FIG. 11(A) shows USB device 100A in the fully retracted position, where swivel rack assembly 120A is in the fully retracted position inside housing 110A, and torsion spring 170A applies a non-zero torque on swivel rack assembly 120A. According to the present embodiment, the torque applied by torsion spring 170A is resisted by spring-loaded locking mechanism 160A until an external pressing force (e.g., by a user's finger) is applied to push button 165A. In particular, coil-type actuating spring 167A pushes actuating structure 161A upward (i.e., away from lower housing portion 110A-1 and toward upper housing portion 110A-2) such that locking tabs 163A-1 and 163A-2 respectively engage locking slots 128A-1 and 128A-2, thereby preventing rotation of swivel rack assembly 120A relative to housing 110A due to the applied torque generated by torsion spring 170A.

Figure 11B:
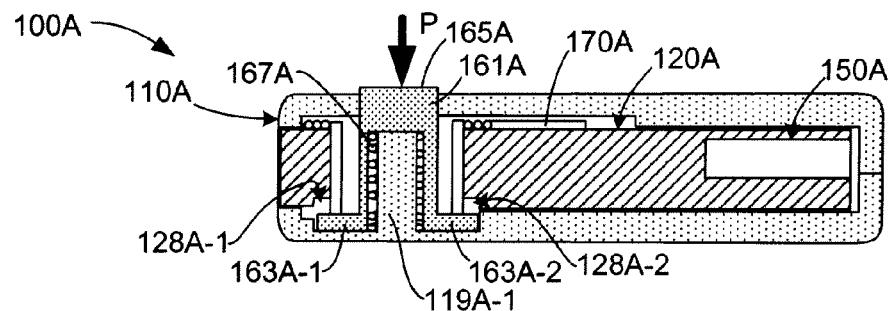
Figure 11C:
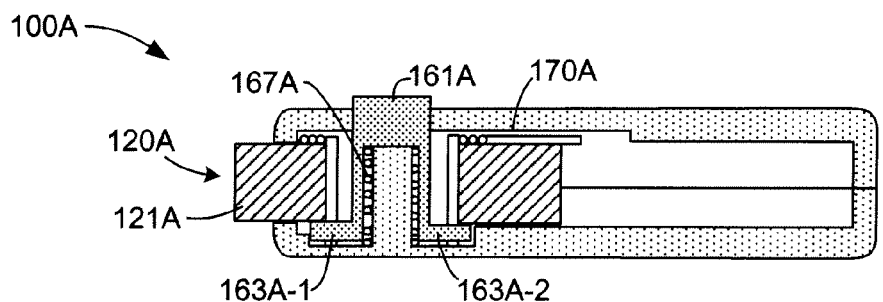

FIG. 11(B) shows USB device 100A during the application of a pressing force P applied to push button 165A, where pressing force P is sufficient to compress coil-type actuating spring 167A and push actuating structure 161A into housing 110A. The downward travel of actuating structure 161A is limited, e.g., by lower housing portion 110B-1, but is sufficient to disengage locking tabs 163A-1 and 163A-2 from locking slots 128A-1 and 128A-2, respectively. When this event occurs, the torque applied by torsion spring 170A is no longer resisted, and swivel rack assembly 120A begins to rotate out of housing 110A, as indicated in FIG. 11(C) (the intermediate stage depicted in FIG. 11(C) is consistent with that of device 100(t2) in FIG. 1(A)). Note that, during the pivoting process, even if the applied pressing force is removed and actuating spring 167A again pushes actuating structure 161A upward, rotation of swivel rack assembly 120A continues because disengaged locking tabs 163A-1 and 163A-2 slide against the flat lower surface of swivel arm 121A.

Figure 11D:
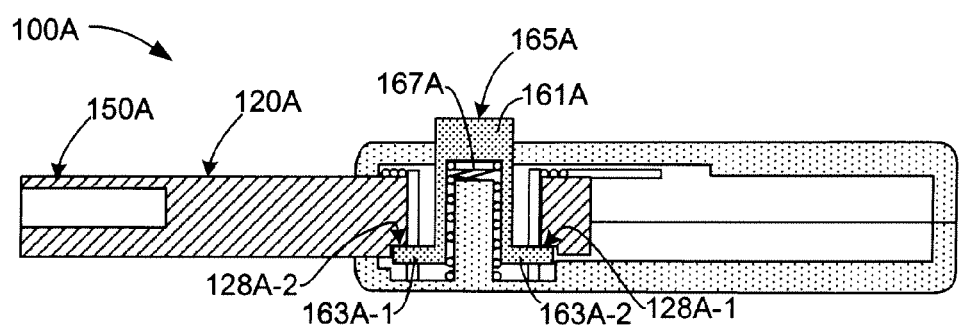

FIG. 11(D) shows USB device 100A when swivel rack assembly 120A has completed its (e.g., 180°) rotation into the fully deployed position, thereby positioning metal plug 150A for insertion into the female USB socket of a host computer (not shown). Upon completing the rotation, locking tabs 163A-1 and 163A-2 align with locking slots 128A-2 and 128A-1, respectively, thereby allowing actuating structure 161A to move upward due to the bias of actuating spring 167A, thereby locking actuating structure 161A in the fully deployed position. Subsequent return to the retracted position requires manually pressing push button 165A downward to unlock the locking tabs 163A-1 and 163A-2 out of locking slots 128A-2 and 128A-1, respectively, while manually swinging swivel rack assembly 120A back into the retracted position until locking tabs 163A-1 and 163A-2 engage locking slots 128A-1 and 128A-2, respectively, as indicated in FIG. 11(A).

Figure 12:
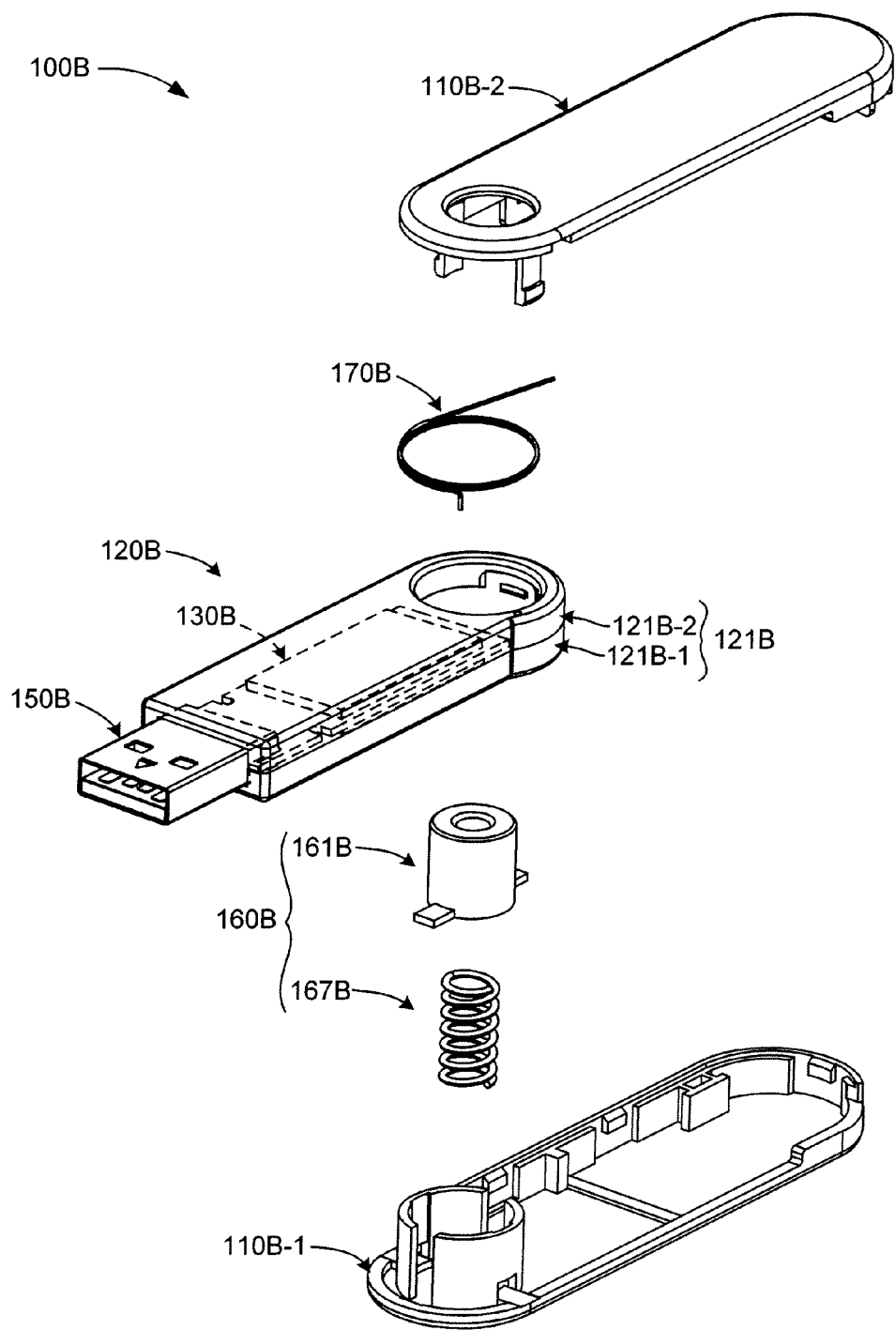
FIG. 12 is an exploded perspective view showing a swivel-type USB device according to another specific embodiment of the present invention.

FIG. 12 is an exploded perspective view showing a swivel-type USB device 100B according to a second top-push embodiment of the present invention. USB device 100B generally includes a two-part housing including a lower housing portion 100B-1 and an upper housing portion 100B-2, a swivel rack assembly 120B, a spring-loaded locking mechanism 160B, and a torsion spring 170B.

Lower and upper housing portions 110B-1 and 110B-2 are molded plastic structures that fit together to form a housing in a manner similar to that described above with reference to USB device 100A, wherein lower housing portion 110B-1 and upper housing structure 110B-2 include corresponding male and female snap-coupling structures that cooperate to facilitate snap-coupling of lower housing portion 110B-1 to upper housing portion 110B-2.

Figure 13A:
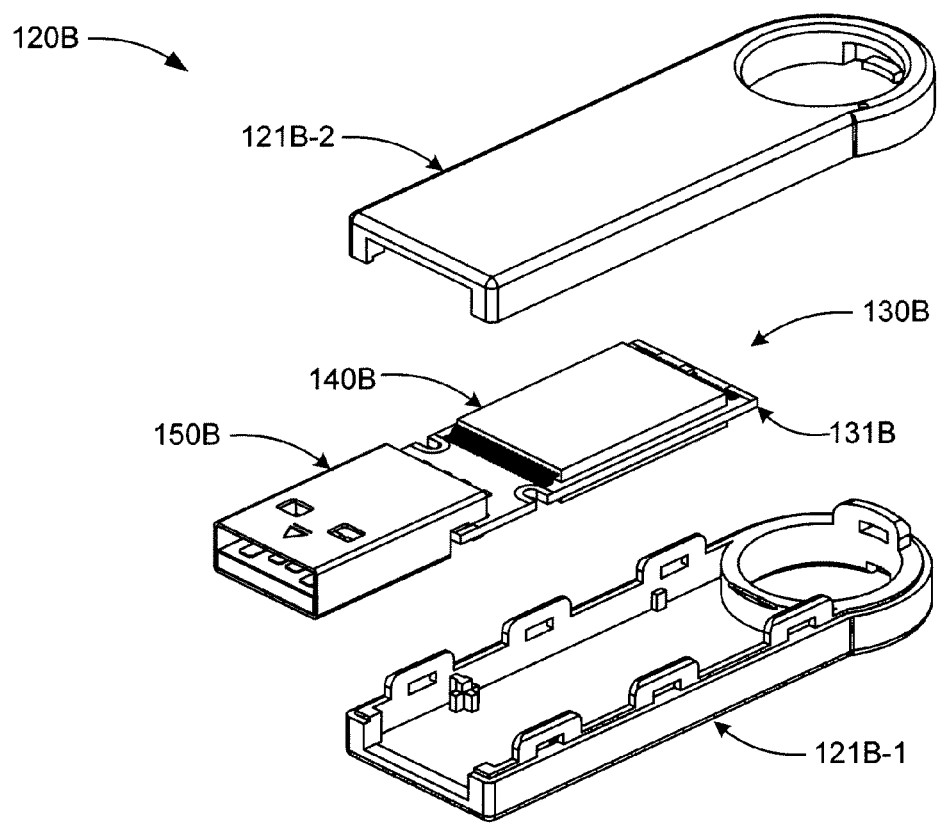
FIGS. 13A) and 13(B) are exploded and assembled perspective views, respectively, showing a swivel rack assembly of the USB device of FIG. 12 during assembly.
Figure 13B:
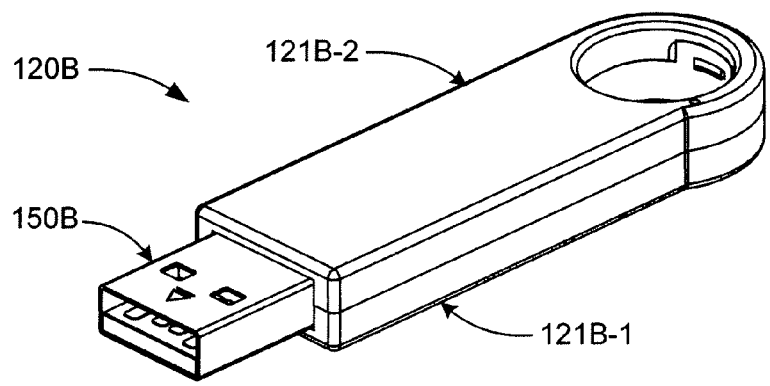

Referring to the center of FIG. 12 and to FIGS. 13(A) and 13(B), swivel rack assembly 120B generally includes a swivel aim 121B including a bottom cover 121B-1 and a top cover 121B-2 that collectively form a casing for enclosing PCBA 130B, and a plug connector 150B that extends from a front end of the swivel arm 121B. As indicated in FIGS. 13(A)

and 13(B), bottom cover 121B-1 and top cover 121B-2 are assembled by snap-coupling and/or ultrasonic welding methods after positioning a rear section of PCBA 130B therein. As shown in FIG. 13(A), PCBA 130B includes a printed circuit board 131B having one or more MLC based flash memory devices 140B mounted thereon, and plug connector 150B includes a standard metal plug shell attached to a front end of PCB 131B such that it extends from a front end of swivel arm 121B.

Swivel arm 121B includes pivot and locking structures similar to those described above with reference to USB device 100A, and locking mechanism 160B includes a torsion spring 170B and an actuating structure 161B and a coil-type actuating spring 167B that are essentially identical to those described above with reference to USB device 100A in both form and function.

Figure 14A:
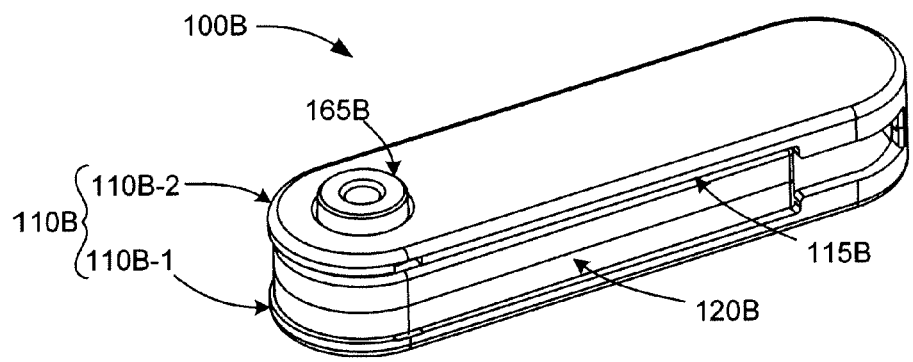
FIGS. 14(A) and 14(B) are front perspective views showing the USB device of FIG. 12 during operation after assembly.
Figure 14B:
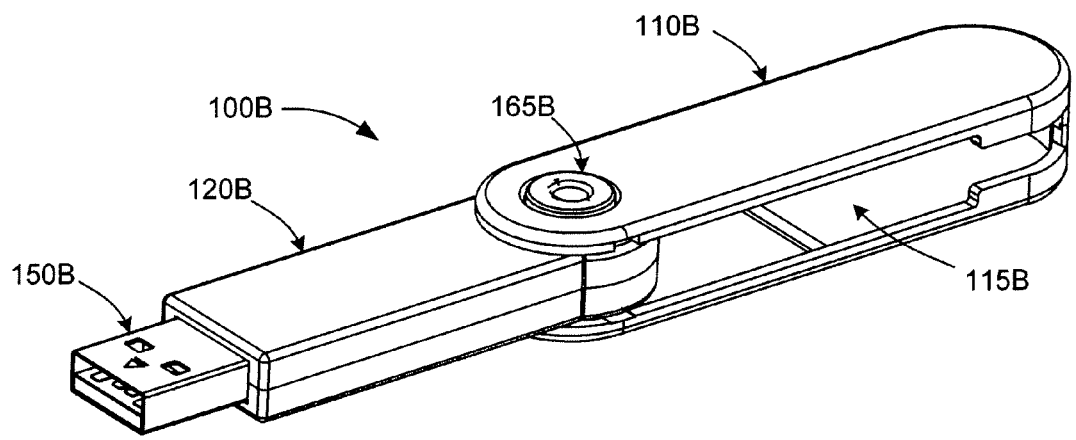

FIGS. 14(A) and 14(B) show USB device 100B after assembly, and respectively show swivel rack assembly 120B in the retracted position inside elongated slot 115B defined by housing 110B, and in the deployed position in which swivel rack assembly 120B is rotated out of elongated slot 115B. Note that housing 110B, which is formed by assembling lower housing portion 110B-1 and upper housing portion 110B-2, encloses swivel rack assembly 120B in substantially the same manner as described above, and a push button 165B extends through upper housing portion 110B-2 to facilitate moving swivel rack assembly 120B between the retracted and deployed positions. Other than the assembly differences mentioned above associated with swivel rack assembly 120B and structural differences that are evident in FIGS. 12-14, the assembly and operation of USB device 100B are essentially identical to that described above with reference to USB device 100A.

Figure 15:
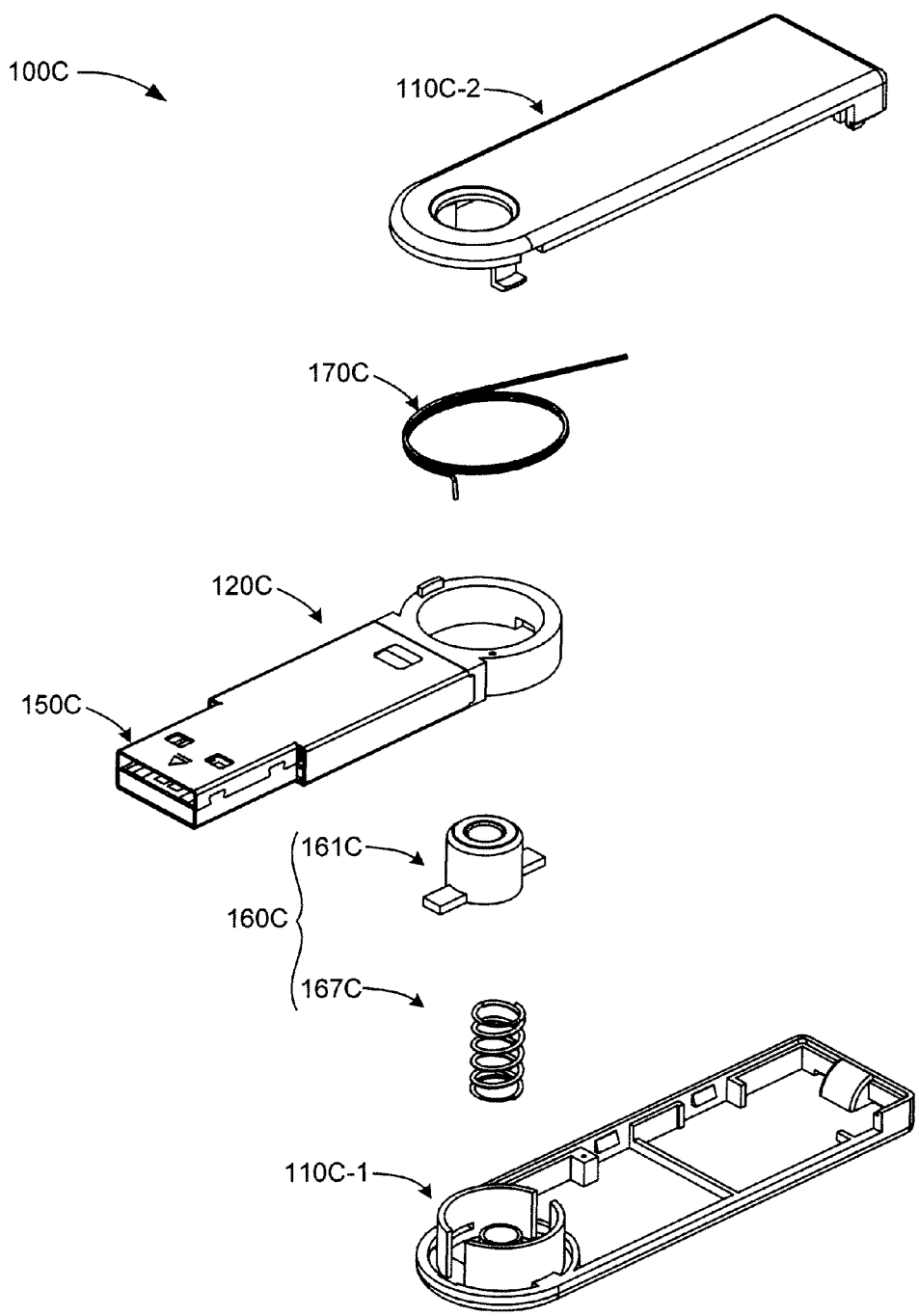
FIG. 15 is an exploded perspective view showing a swivel-type USB device according to another specific embodiment of the present invention.

FIG. 15 is an exploded perspective view showing a swivel-type USB device 100C according to a third top-push embodiment of the present invention. USB device 100C generally includes a two-part housing including a lower housing portion 100C-1 and an upper housing portion 100C-2, a swivel rack assembly 120C, a spring-loaded locking mechanism 160C, and a torsion spring 170C.

Lower and upper housing portions 110C-1 and 110C-2 are molded plastic structures that fit together to form a housing in a manner similar to that described above with reference to USB device 100A, wherein lower housing portion 110C-1 and upper housing structure 110C-2 include corresponding male and female snap-coupling structures that cooperate to facilitate snap-coupling of lower housing portion 110C-1 to upper housing portion 110C-2.

Figure 16A:
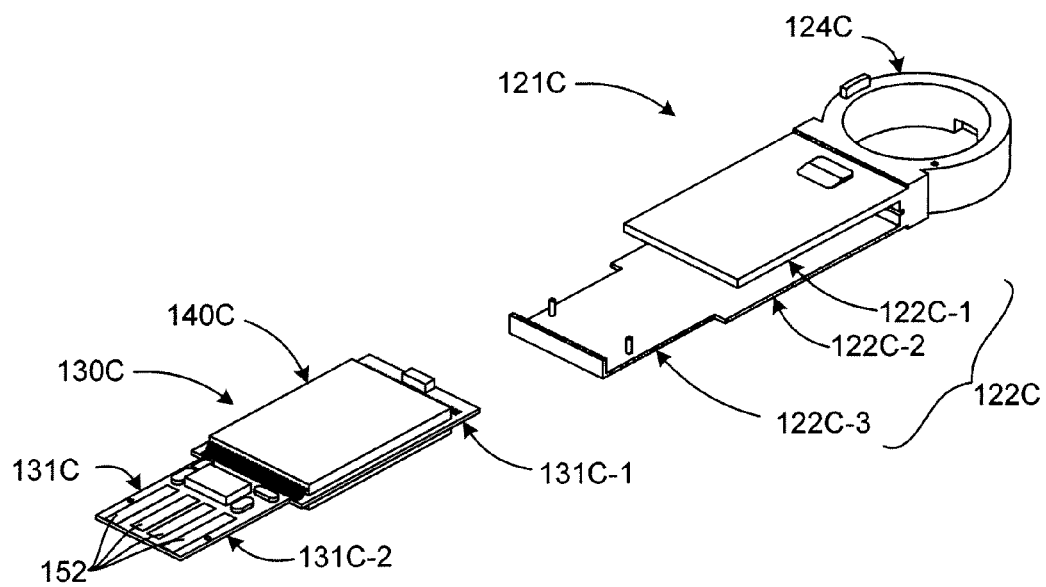
FIGS. 16A) and 16(B) are exploded perspective views showing a swivel rack assembly of the USB device of FIG. 15 during assembly.
Figure 16B:
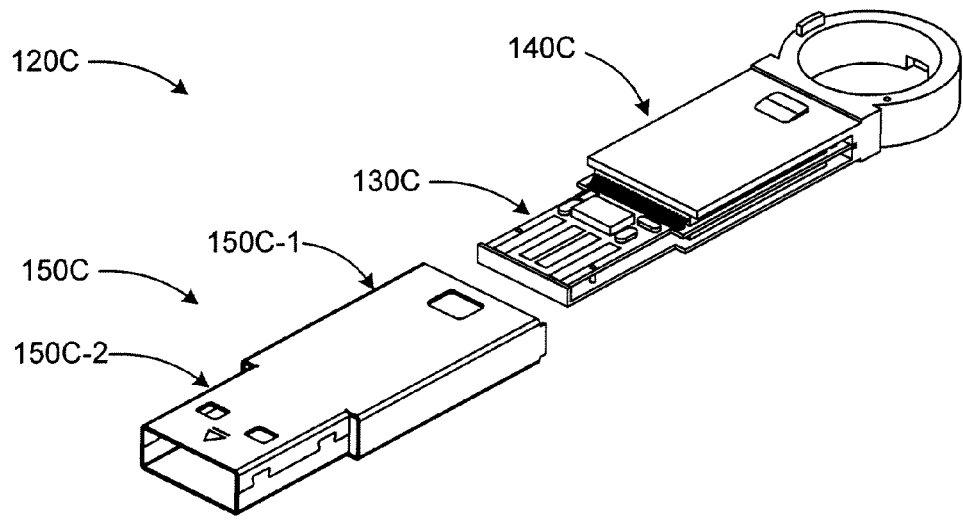

Referring to the center of FIG. 15 and to FIGS. 16(A) and 16(B), swivel rack assembly 120C generally includes a swivel arm 121C including an annular pivot ring 124C, a carrier tray 122C having an upper tray portion 122C-1 and a lower tray portion 122C-2 that form a clip-like structure, and a narrow tray portion 122C-3 extending from the lower tray portion 122C-2. According to the present embodiment, PCBA 130C is a Slim Printed Circuit Board Assembly (Slim PCBA) package including a printed circuit board (PCB) 131C having a rear PCB section 131C-1 mounted between upper tray portion 122C-1 and lower tray portion 122C-2, and a front PCB section 131C-1 extending from the rear PCB section, the front PCB section having a narrower width than the rear PCB section and being mounted on the narrow tray portion 122C-3. Finally, plug connector 150C is an elongated metal box-like structure including a rear plug section 150C-1 mounted over rear PCB section 131C-1, and a relatively narrow front plug section 150C-2 mounted over front PCB section 131C-1.

Swivel arm 121C includes pivot and locking structures similar to those described above with reference to USB device 100A, and locking mechanism 160C includes a torsion spring 170C and an actuating structure 161C and a coil-type actuating spring 167C that are essentially identical to those described above with reference to USB device 100A in both form and function.

Figure 17A:
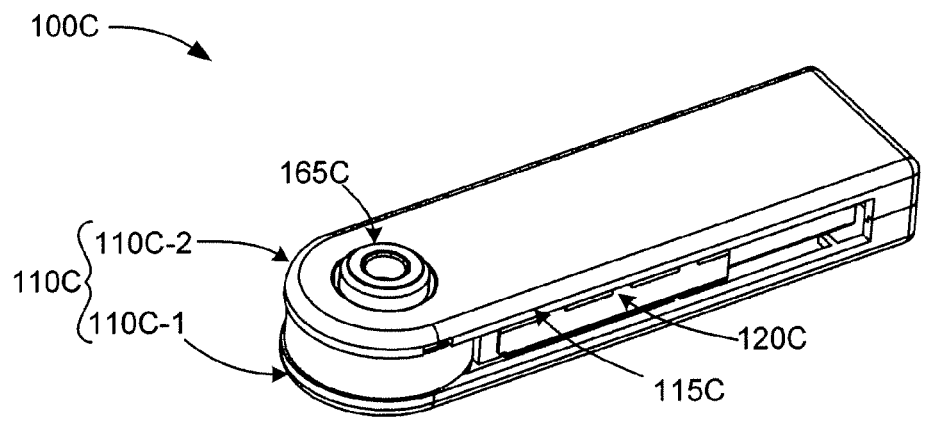
FIGS. 17(A) and 17(B) are front perspective views showing the USB device of FIG. 15 during operation after assembly.
Figure 17B:
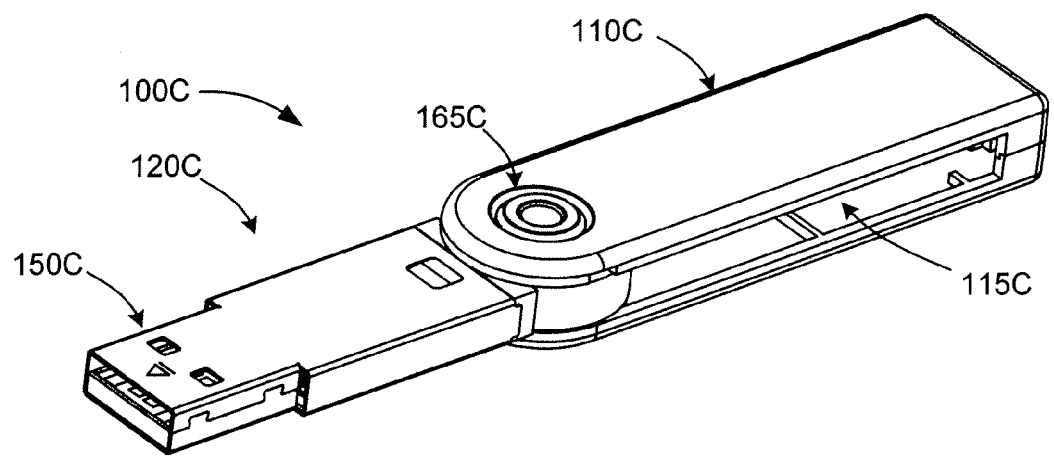

FIGS. 17(A) and 17(B) show USB device 100C after assembly, and respectively show swivel rack assembly 120C in the retracted position inside elongated slot 115C defined by housing 110C, and in the deployed position in which swivel rack assembly 120C is rotated out of elongated slot 115C. Note that housing 110C, which is formed by assembling lower housing portion 110C-1 and upper housing portion 110C-2, encloses swivel rack assembly 120C in substantially the same manner as described above, and a push button 165C extends through upper housing portion 110C-2 to facilitate moving swivel rack assembly 120C between the retracted and deployed positions. Other than the assembly differences mentioned above associated with swivel rack assembly 120C and structural differences that are evident in FIGS. 15-17, the assembly and operation of USB device 100C are essentially identical to that described above with reference to USB device 100A.

Although the present invention is described above with reference to top push button-type locking mechanisms, the spirit and scope of the present invention may be implemented using other types of locking structures as well.

Figure 18:
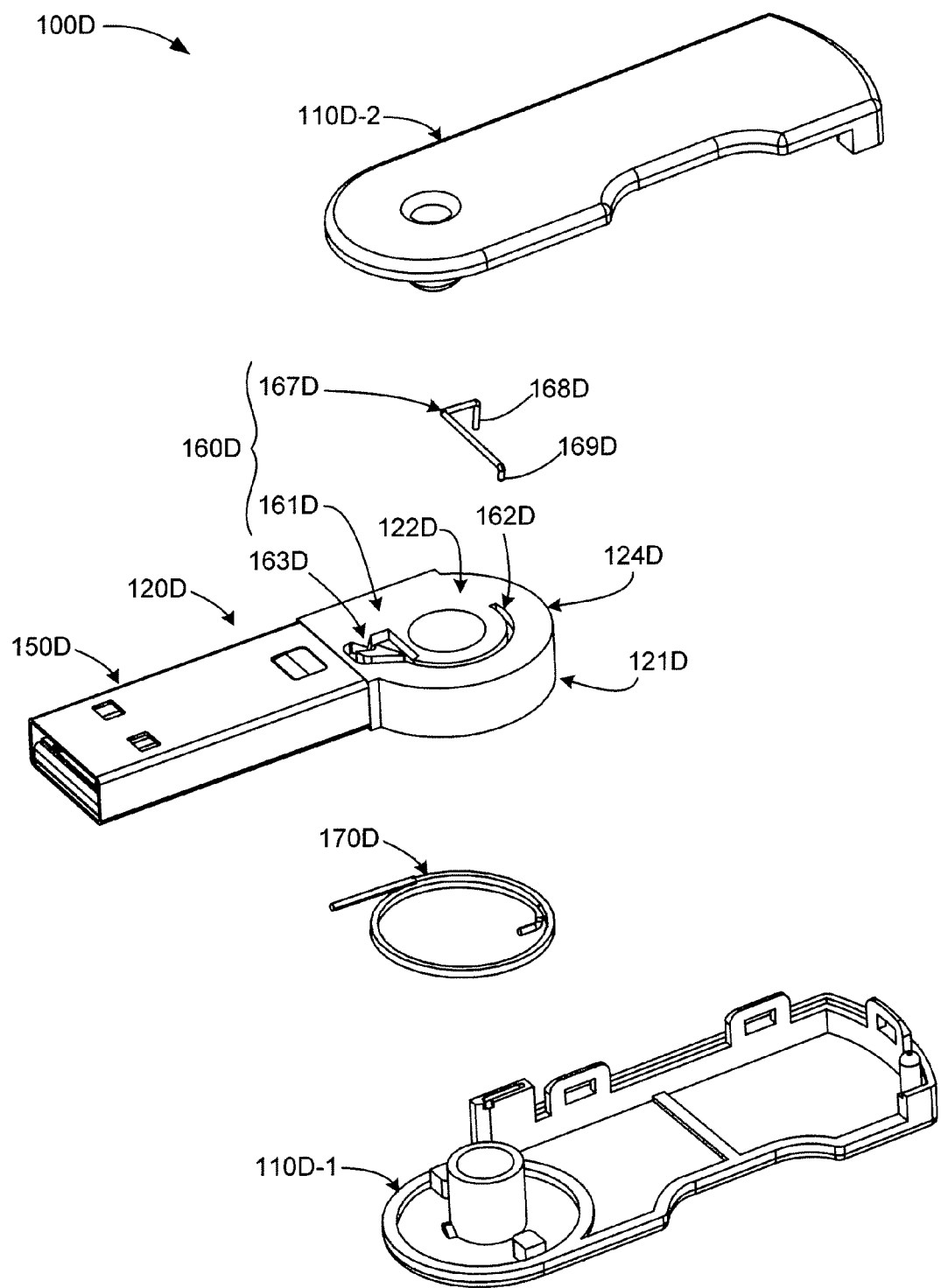
FIG. 18 is an exploded perspective view showing a swivel-type USB device according to another specific embodiment of the present invention.

FIG. 18 is an exploded perspective view showing a side-push-type swivel-type USB device 100D according to an alternative embodiment of the present invention. Similar to the top push button-type devices, USB device 100D generally includes a two-part housing including a lower housing portion 100D-1 and an upper housing portion 100D-2, a swivel rack assembly 120D including a swivel arm 121D and a plug connector 150D, and a torsion spring 170D. However, as set forth below, USB device 100D differs from previous embodiments by utilizing a locking mechanism 160D that includes a guide structure 161D including a guide groove 162D and a V-shaped notch 163D that are integrally molded into a top surface 122D of an annular pivot ring 124D of swivel arm 121D, and a guide hook 167D that is connected between lower housing portion 110D-1 and guide groove 162D that includes a V-shaped locking notch 163D.

Referring to FIG. 18, lower and upper housing portions 110D-1 and 110D-2 are molded plastic structures that fit together to form a housing in a manner similar to that described above with reference to USB device 100A, wherein lower housing portion 110D-1 and upper housing structure 110D-2 include corresponding male and female snap-coupling structures that cooperate to facilitate snap-coupling of lower housing portion 110D-1 to upper housing portion 110D-2.

Figure 19A:
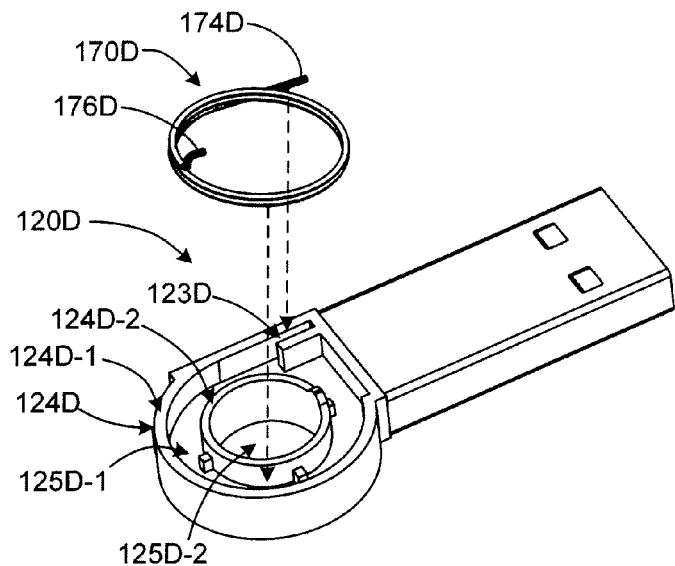
FIGS. 19A) and 19(B) are bottom and top exploded perspective views, respectively, showing a torsion spring mounted onto a swivel rack assembly of the USB device of FIG. 18.
Figure 19B:
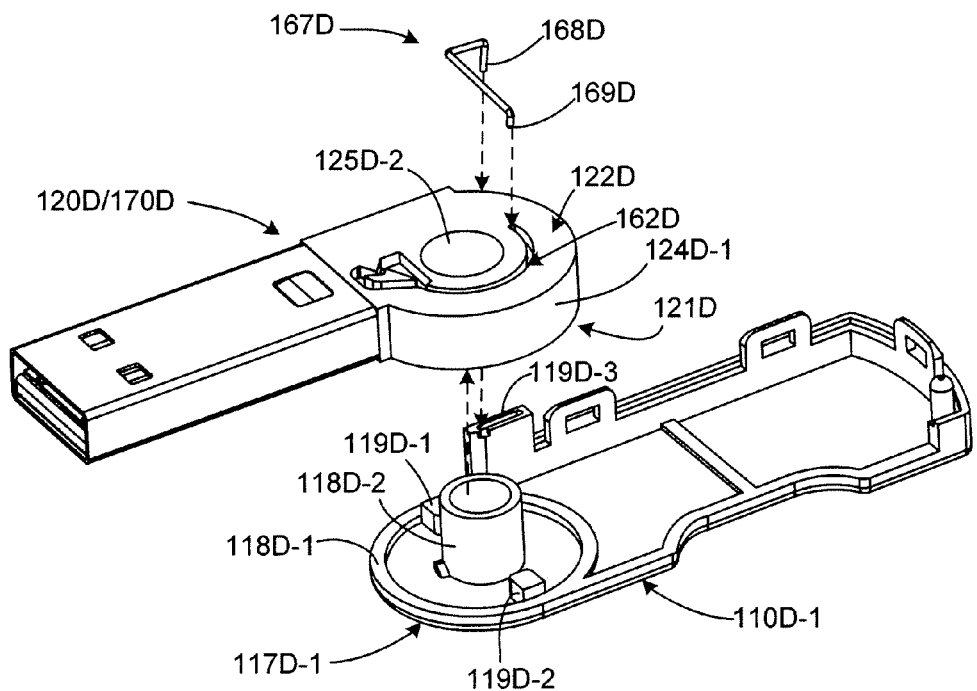

Referring to the center of FIG. 18 and to FIGS. 19(A) and 19(B), swivel rack assembly 120D generally includes swivel arm 121D including a carrier tray and a molded, single piece COB type PCBA similar to those described above with reference to FIG. 8, and an elongated metal connector plug shell 150A. As in indicated in FIG. 19(A), which shows a bottom view of swivel rack assembly 120D, annular pivot ring 124D of swivel arm 121D including an outer cylindrical wall 124D-1 and an inner cylindrical wall 124D-2 that define an annular cavity 125D-1 including a spring slot 123D. A central opening 125D-2 is defined inside inner cylindrical wall 124D-2.

As indicated in FIG. 19(A), torsion spring 170D is a wire bent to include a coil spring body 172D having a straight (first) end portion 174D and a bent (second) end portion 176D. As indicated by the vertical dashed-line arrows in FIG. 19(A), torsion spring 170D is mounted into annular cavity 125D-1 such that straight end 174D is inserted into spring slot 123D.

Referring to FIG. 19(B), the sub-assembly including swivel rack assembly 120D and torsion spring 170D is then rotatably mounted onto lower housing portion 110D-1. As indicated, front end section 117D-1 of lower housing portion 110D-1 includes an outer circular wall 118D-1 and an inner cylindrical wall 118D-2. As indicated by the upward-pointing arrow, when sub-assembly including swivel rack assembly 120D and torsion spring 170D is mounted, inner cylindrical wall 118D-2 is inserted into central opening 125D-2, and outer cylindrical wall 124D-1 is mounted onto outer circular wall 118D-1. Note that bend end 176D (shown in FIG. 19(A)) engages one of two blocks 119D-1 and 119D-2 when swivel rack assembly 120D is rotated relative to lower housing portion 110D-1, thereby storing potential energy. As also indicated in FIG. 19(B), guide hook 167D is then connected to lower housing portion 110D-1 and swivel rack assembly 120D by inserting a head end 168D into an opening formed in raised post 119D-3, and by inserting tail end 169D into guide groove 162D.

Figure 20A:
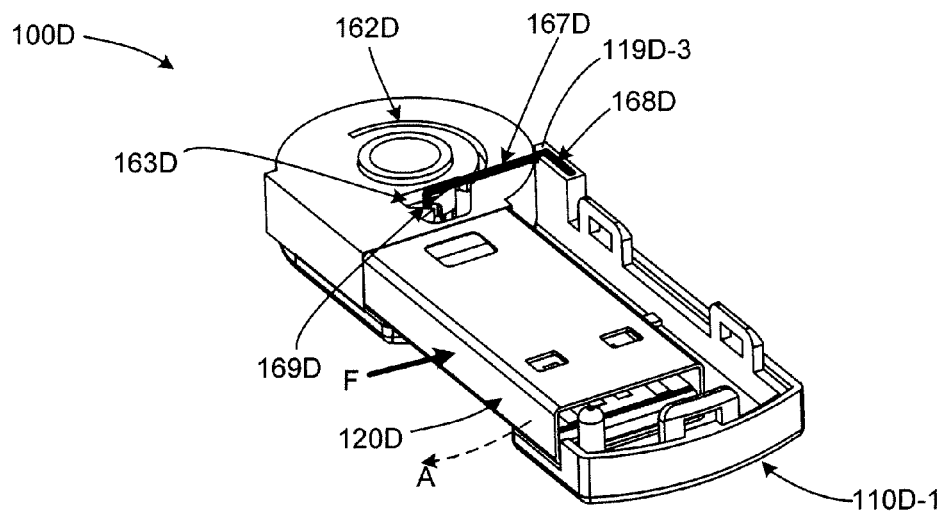
FIGS. 20(A) and 20(B) are top perspective views showing the USB device of FIG. 18 without an upper housing portion during operation.
Figure 20B:
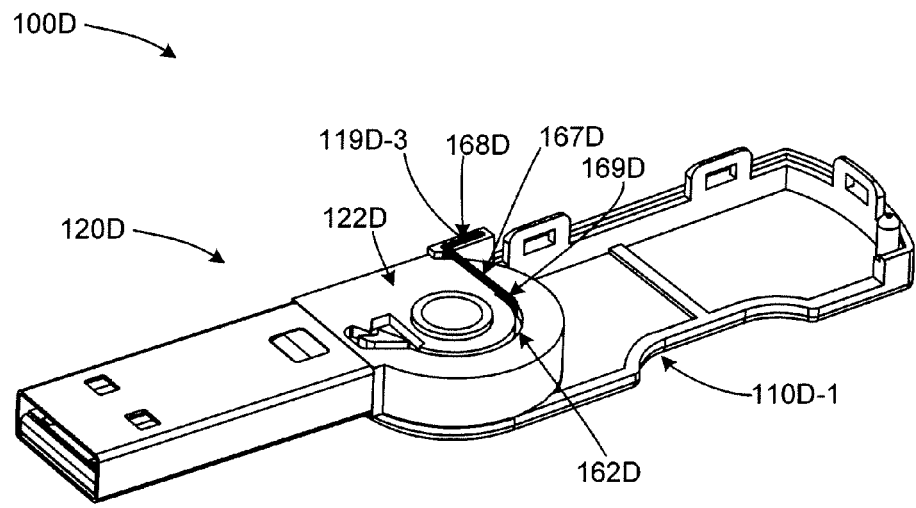

FIGS. 20(A) and 20(B) show portions of USB device 100D with the upper housing portion removed in order to better illustrate operation of the push slide locking mechanism. FIG. 20(A) shows swivel rack assembly 120D in the retracted position, with guide hook 167D mounted such that head (fixed) end 168D is fixedly inserted into an opening formed in raised post 119D-3, and tail (sliding) end 169D is slidably inserted into V-shaped locking notch 163D, which is shaped such that rotation of swivel rack assembly 120D in the directed of arrow A is resisted. That is, with tail end 169D rigidly held in V-shaped locking notch 163D and head end 168D held by raised post 119D-3, guide hook 167D acts as a brace to resist rotation of swivel rack assembly 120D in the direction of arrow A. In order to release tail end 169D from V-shaped locking notch 163D, a user applied a pressing force F against the side of swivel rack assembly 120D such that swivel rack assembly 120D is pushed into lower housing portion 110D-1 against the bias of torsion spring 170D (not shown). With tail end 169D release from V-shaped locking notch 163D in this way, tail end 169D enters curved guide groove 162D, which provides little resistance to the bias force applied by torsion spring 170D (not shown), thereby causing swivel rack assembly 120D to swing into the deployed position shown in FIG. 20(B). When tail end 169D of guide hook 167D reaches the end of curved guide groove 162D, swivel rack assembly 120D is in the fully deployed position. Returning from the deployed position to the retracted position involves pushing swivel rack assembly 120D toward housing portion 110B-1, causing tail (sliding) end 169D of guide hook 167D to slide along curved guide groove 162D until guide hook 167D re-engages V-shaped locking notch 163D.

Figure 21A:
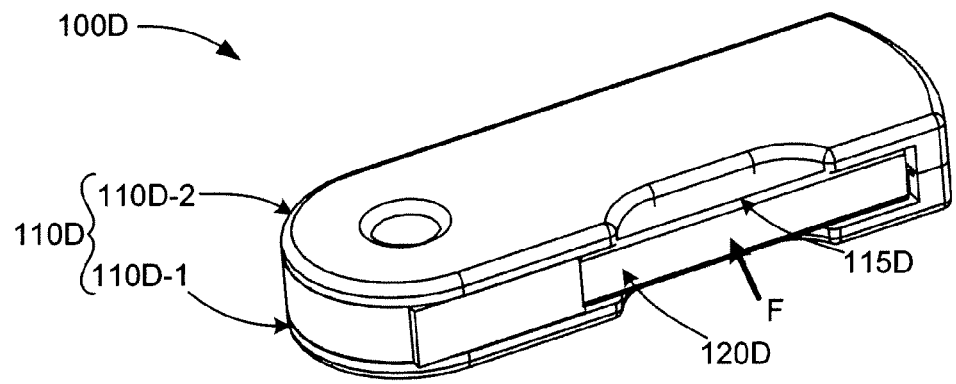
FIGS. 21(A) and 21(B) are front perspective views showing the USB device of FIG. 18 during operation after assembly.
Figure 21B:
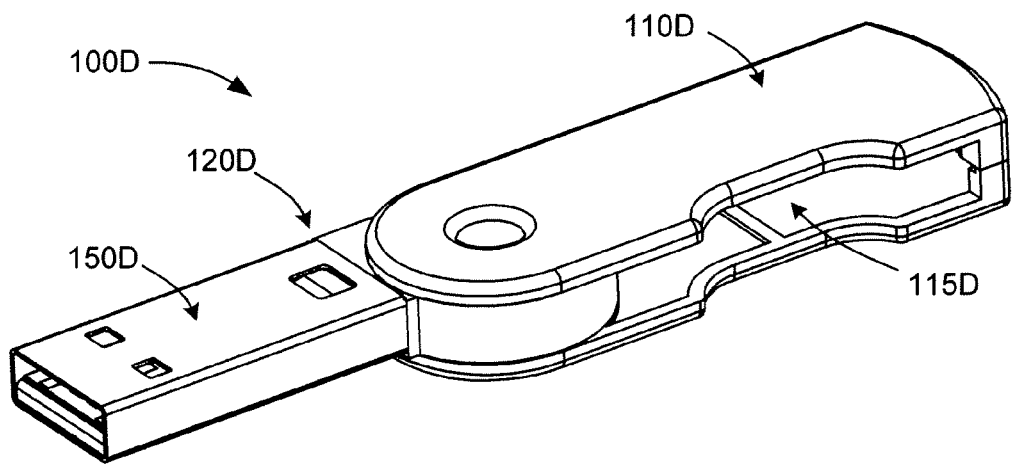

FIGS. 21(A) and 21(D) show USB device 100D after assembly, and respectively show swivel rack assembly 120D in the retracted position inside elongated slot 115D defined by housing 110D, and in the deployed position in which swivel rack assembly 120D is rotated out of elongated slot 115D. Note that housing 110D, which is formed by assembling lower housing portion 110D-1 and upper housing portion 110D-2, encloses swivel rack assembly 120D in a manner similar to that described above, but that moving swivel rack assembly 120D between the retracted and deployed positions involves applying a push force F against swivel rack assembly 120D.

Figure 22A:
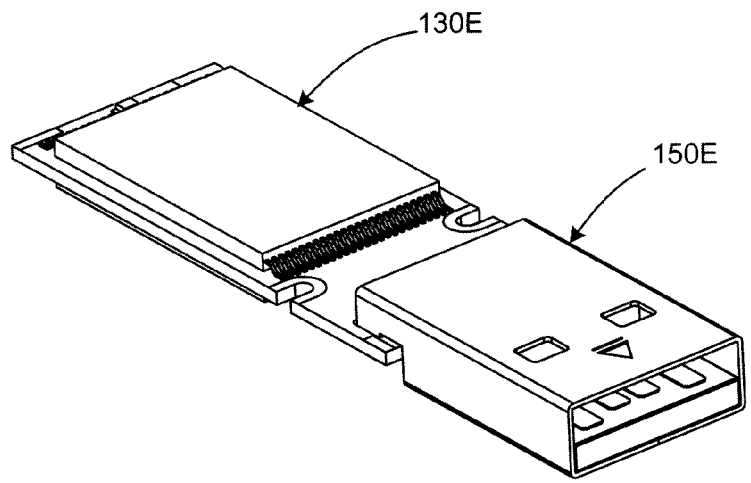
FIGS. 22(A) and 22(B) are perspective views showing alternative USB plug arrangements utilized in USB device of the present invention.
Figure 22B:
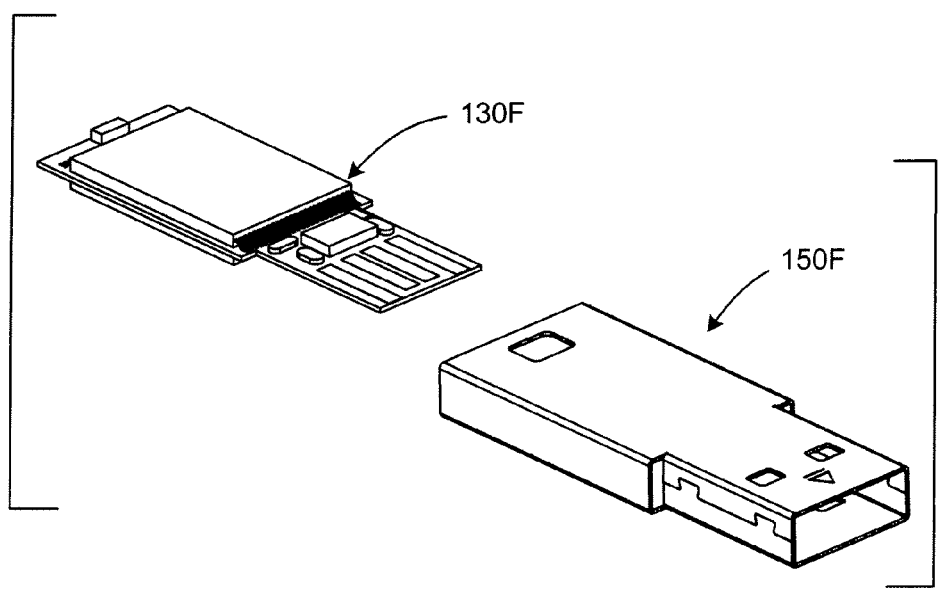

FIGS. 22(A) and 22(B) show alternatives PCBA and alternative USB plug connectors that can be utilized in place of PCBA 130D according to alternative embodiments of the invention. As described previously, a swinging rack assembly includes a core unit and a carrier. The core unit is comprised of two parts, a Chip-On-Board (COB) PCB and a metal plug. Similar arrangements are described above with reference to the various additional embodiments. In accordance with additional alternative embodiments of the present invention, the core units the various embodiments may be replaced by alternative PCBA 130E and USB plug connector 150E shown in FIG. 22(A), or by PCBA 130F and USB plug connector 150F shown in FIG. 22(B). In particular, FIG. 22(A) shows an alternative arrangement in which PCBA 130E includes a standard USB metal plug 150E mounted over the front portion of printed circuit board substrate. Similarly, FIG. 22(B) shows a Slim Printed Circuit Board Assembly (Slim PCBA) 130F and a modified metal USB plug shell 150F that is mounted over PCBA 130F during assembly.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas a USB connector has been shown and described, other types of connectors such as a Secure Digital (SD) interface circuit, a Micro SD interface circuit, a Multi Media Card (MMC) interface circuit, a Compact Flash (CF) interface circuit, a Memory Stick (MS) interface circuit, a PCI-Express interface circuit, an Integrated Drive Electronics (IDE) interface circuit, a Serial Advanced technology Attachment (SATA) interface circuit, an external SATA interface circuit, a Radio Frequency Identification (RFID) interface circuit, a fiber channel interface circuit, and an optical connection interface circuit may be used to achieve the same function. Additionally, whereas the size of the data area of a page has been shown to hold four sectors of 512-data, a page holds other number of sectors such as eight may be used. In summary, the scope of the invention should not be restricted to the specific exemplary embodiments disclosed herein, and all modifications that are readily suggested to those of ordinary skill in the art should be included within the spirit and purview of this application and scope of the appended claims.

The invention claimed is:

1. A swivel-type portable computer peripheral apparatus comprising:
   an elongated housing defining an elongated side opening extending between a rear end portion and a front end portion;
   a swivel rack assembly comprising:
   a swivel arm having a fixed end pivotably connected to the front end portion of the housing, a free end, and a central section extending from the fixed end to the free end;
   a printed circuit board assembly (PCBA) mounted on the central section of the swivel arm, the PCBA including at least one MLC based flash memory device mounted thereon; and
   a plug connector fixedly connected to the free end of the swivel arm and electronically connected to the PCBA;
   a locking mechanism for securing the plug connector in one of a first position, in which the swivel arm is disposed in the elongated side opening such that the plug connector is positioned inside of the housing, and a second position in which the swivel arm is disposed out of the elongated side opening such that the plug connector is exposed outside of the housing; and a resilient torsion member connected to at least one of the elongated housing and the swivel rack assembly for biasing, upon manual deactivation of the locking mechanism, the swivel rack assembly to rotate relative to the housing such that the plug connector is moved between the first position and the second position, wherein the resilient torsion member comprises a coil spring having a first end connected to the swivel arm a second end disposed inside the housing, and wherein the coil spring is arranged such that the resilient torsion member stores potential energy when the plug connector is in the first position, whereby manual deactivation of the locking mechanism causes the coil spring to rotate the swivel arm relative to the housing until the plug connector is in the second position.

2. A swivel-type portable computer peripheral apparatus comprising:

an elongated housing defining an elongated side opening extending between a rear end portion and a front end portion;

a swivel rack assembly comprising:

a swivel arm having a fixed end pivotably connected to the front end portion of the housing, a free end, and a central section extending from the fixed end to the free end;

a printed circuit board assembly (PCBA) mounted on the central section of the swivel arm, the PCBA including at least one MLC based flash memory device mounted thereon; and a plug connector fixedly connected to the free end of the swivel arm and electronically connected to the PCBA;

a locking mechanism for securing the plug connector in one of a first position, in which the swivel arm is disposed in the elongated side opening such that the plug connector is positioned inside of the housing, and a second position in which the swivel arm is disposed out of the elongated side opening such that the plug connector is exposed outside of the housing; and a resilient torsion member connected to at least one of the elongated housing and the swivel rack assembly for biasing, upon manual deactivation of the locking mechanism, the swivel rack assembly to rotate relative to the housing such that the plug connector is moved between the first position and the second position, wherein the resilient torsion member comprises a coil spring having a first end connected to the swivel arm a second end disposed inside the housing, and wherein the coil spring is arranged such that the resilient torsion member stores potential energy when the plug connector is in the second position, whereby manual deactivation of the locking mechanism causes the coil spring to rotate the swivel arm relative to the housing until the plug connector is in the first position.

3. A swivel-type portable computer peripheral apparatus comprising:

an elongated housing defining an elongated side opening extending between a rear end portion and a front end portion;

a swivel rack assembly comprising:

a swivel arm having a fixed end pivotably connected to the front end portion of the housing, a free end, and a central section extending from the fixed end to the free end;

a printed circuit board assembly (PCBA) mounted on the central section of the swivel arm, the PCBA including at least one MLC based flash memory device mounted thereon; and a plug connector fixedly connected to the free end of the swivel arm and electronically connected to the PCBA;

a locking mechanism for securing the plug connector in one of a first position, in which the swivel arm is disposed in the elongated side opening such that the plug connector is positioned inside of the housing, and a second position in which the swivel arm is disposed out of the elongated side opening such that the plug connector is exposed outside of the housing; and a resilient torsion member connected to at least one of the elongated housing and the swivel rack assembly for biasing, upon manual deactivation of the locking mechanism, the swivel rack assembly to rotate relative to the housing such that the plug connector is moved between the first position and the second position, wherein the elongated housing comprises:

a lower housing portion including a lower wall extending between a first open side wall portion and a first closed side wall portion, and between a first rear end wall section and a first front end wall section, the lower housing portion also including a cylindrical mounting structure integrally molded onto the lower wall adjacent to the first front wall section; and an upper housing portion includes an upper wall that extends between a second open side wall portion and a second closed side wall portion, and between a second rear end wall section and a second end front wall section, wherein the upper housing portion is mounted on the lower housing portion such that the first and second open side wall portions are spaced apart to form the elongated side opening, the first and second closed side wall portions combine to form a closed wall structure extending along a closed side of the apparatus, the first and second rear end wall sections form a closed wall structure covering a rear end of the apparatus, and wherein the fixed end of the swivel arm is pivotably mounted on the cylindrical mounting structure.

4. The portable computer peripheral apparatus according to claim 3, wherein the upper housing portion also includes an actuator opening defined in the upper wall adjacent to the second front wall section, and wherein the locking mechanism comprises:

an actuating structure having a hollow cylindrical body including a push-button structure disposed on an upper end thereof and locking tabs extending outwardly from a lower end thereof, and a coil-type actuating spring disposed inside the hollow cylindrical body, wherein the actuating structure is mounted in the housing such that the push-button structure extends through the actuator opening and the coil-type actuating spring biases the actuating structure toward the upper housing portion such that the locking tabs disposed on the actuating structure engage locking slots locking slots defined on the fixed end of the swivel arm when the plug connector is in one of the first position and the second position.

5. The portable computer peripheral apparatus according to claim 4, wherein the swivel arm includes a carrier tray having an upper tray portion and a lower tray portion that form a clip-like structure, wherein said PCBA comprises a Chip-On-Board (COB) package mounted between the upper tray portion and the lower tray portion, and wherein the plug connector comprises an elongated metal box-like structure mounted onto the swivel arm over the PCBA.

6. The portable computer peripheral apparatus according to claim 4,
wherein the swivel arm includes a bottom cover and a top cover that collectively form a casing,
wherein the PCBA includes a printed circuit board having said at least one MLC based flash memory device mounted thereon, the PCBA being mounted inside the casing formed by the top and bottom covers, and
wherein the plug connector comprises a metal plug shell attached to a front end of the printed circuit board and extending from a front end of the casing formed by the top and bottom covers.

7. The portable computer peripheral apparatus according to claim 4,
wherein the swivel arm includes a carrier tray having a lower tray portion and an upper tray portion that form a clip-like structure, and a narrow tray portion extending from the lower tray portion
wherein said PCBA comprises a Slim Printed Circuit Board Assembly (Slim PCBA) package including a printed circuit board (PCB) having a rear PCB section mounted between the upper tray portion and the lower tray portion, and a front PCB section extending from the rear PCB section, the front PCB section having a narrower width than the rear PCB section and being mounted on the narrow tray portion, and
wherein the plug connector comprises an elongated metal box-like structure including a rear plug section mounted over the rear PCB section, and a front plug section mounted over the front PCB section, the front plug section having a narrower width than the rear plug section.

8. The portable computer peripheral apparatus according to claim 3,
wherein the swivel arm includes an annular pivot ring having a top surface, and
wherein the locking mechanism comprises:
a guide structure including a guide groove and a V-shaped locking notch defined in the top surface,
a guide hook having a tail end slidably engaged in one of the guide groove and the V-shaped locking notch, and a head end fixedly connected to the housing,
wherein the guide hook is mounted in the housing such that the tail end is disposed in the V-shaped locking notch when the plug connector is in the first position, and the tail end is disposed in the guide groove when the plug connector is disposed between the first position and the second position.

9. The portable computer peripheral apparatus according to claim 8,
wherein the swivel arm includes a carrier tray having an upper tray portion and a lower tray portion that form a clip-like structure,
wherein said PCBA comprises a Chip-On-Board (COB) package mounted between the upper tray portion and the lower tray portion, and
wherein the plug connector comprises an elongated metal box-like structure mounted onto the swivel arm over the PCBA.

10. The portable computer peripheral apparatus according to claim 8,
wherein the swivel arm includes a bottom cover and a top cover that collectively form a casing,
wherein the PCBA includes a printed circuit board having said at least one MLC based flash memory device mounted thereon, the PCBA being mounted inside the casing formed by the top and bottom covers, and
wherein the plug connector comprises a metal plug shell attached to a front end of the printed circuit board and extending from a front end of the casing formed by the top and bottom covers.

11. The portable computer peripheral apparatus according to claim 8,
wherein the swivel arm includes a carrier tray having a lower tray portion and an upper tray portion that form a clip-like structure, and a narrow tray portion extending from the lower tray portion
wherein said PCBA comprises a Slim Printed Circuit Board Assembly (Slim PCBA) package including a printed circuit board (PCB) having a rear PCB section mounted between the upper tray portion and the lower tray portion, and a front PCB section extending from the rear PCB section, the front PCB section having a narrower width than the rear PCB section and being mounted on the narrow tray portion, and
wherein the plug connector comprises an elongated metal box-like structure including a rear plug section mounted over the rear PCB section, and a front plug section mounted over the front PCB section, the front plug section having a narrower width than the rear plug section.

12. The apparatus of claim 1, wherein said at least one electronic device disposed in a Slim Printed Circuit Board Assembly (Slim PCBA) package.

13. The apparatus of claim 1, wherein the plug connector comprises a Universal Serial Bus (USB) plug.

14. A swivel-type portable computer peripheral apparatus comprising:
an elongated housing defining an elongated side opening extending between a rear end portion and a front end portion;
a swivel rack assembly comprising:
a swivel arm having a fixed end pivotably connected to the front end portion of the housing, a free end, and a central section extending from the fixed end to the free end;
a printed circuit board assembly (PCBA) mounted on the central section of the swivel arm, the PCBA including at least one MLC based flash memory device mounted thereon; and
a plug connector fixedly connected to the free end of the swivel arm and electronically connected to the PCBA;
a locking mechanism for securing the plug connector in one of a first position, in which the swivel arm is disposed in the elongated side opening such that the plug connector is positioned inside of the housing, and a second position in which the swivel arm is disposed out of the elongated side opening such that the plug connector is exposed outside of the housing; and
a resilient torsion member connected to at least one of the elongated housing and the swivel rack assembly for biasing, upon manual deactivation of the locking mechanism, the swivel rack assembly to rotate relative to the housing such that the plug connector is moved between the first position and the second position,
wherein the at least one electronic device comprises
an input/output interface circuit, coupling to a processing unit, configured for receiving a logical sector address (LSA) along with a data transfer request from a host computing device, said processing unit is configured for extracting set, entry, page and sector numbers from the LSA with an indexing scheme;
wherein said processing unit further comprises a page buffer, an address correlation page usage memory (ACPUM), a partial logical-to-physical address and page usage information (PLTPPUI) tracking table, a wear leveling counter and bad block indicator (WL/BB) tracking table; and a flash memory that includes a reserved area for a plurality of first physical blocks and a plurality of second physical blocks, the first physical blocks is referenced by a plurality of first special logical addresses while the second physical blocks by a plurality of second special logical addresses;

wherein the plurality of first physical blocks is configured for storing PLTPPUI and the plurality of second physical blocks for storing wear leveling and bad block indicator, ACPUM is configured to keep one set, corresponding to the set number, of PLTPPUI, the PLTPPUI tracking table is configured to hold correlation between the first special logical addresses and the first physical blocks and the WL/BB tracking table is configured to hold correlation between the second special logical addresses and the second physical blocks.

15. A swivel-type portable computer peripheral apparatus comprising:

an elongated housing defining an elongated side opening extending between a rear end portion and a front end portion;

a swivel rack assembly comprising:

a swivel arm having a fixed end pivotably connected to the front end portion of the housing, a free end, and a central section extending from the fixed end to the free end;

a printed circuit board assembly (PCBA) mounted on the central section of the swivel arm, the PCBA including at least one MLC based flash memory device mounted thereon; and a plug connector fixedly connected to the free end of the swivel arm and electronically connected to the PCBA;

a locking mechanism for securing the plug connector in one of a first position, in which the swivel arm is disposed in the elongated side opening such that the plug connector is positioned inside of the housing, and a second position in which the swivel arm is disposed out of the elongated side opening such that the plug connector is exposed outside of the housing; and a resilient torsion member connected to at least one of the elongated housing and the swivel rack assembly for biasing, upon manual deactivation of the locking mechanism, the swivel rack assembly to rotate relative to the housing such that the plug connector is moved between the first position and the second position, wherein the at least one electronic device comprises:

at least one MLC based flash memory chip and a flash memory controller mounted thereon, wherein the flash memory controller is configured for managing memory address of the flash memory device with following operations:

receiving, in the MLC based flash memory device, a logical sector address (LSA) along with a data transfer request from a host computing device;

extracting set, entry, page and sector numbers from the LSA with an indexing scheme;

loading a set, corresponding to the set number, of partial logical-to-physical address and page usage information (PLTPPUI) into an address correlation page usage memory (ACPUM);

reading a physical block number of flash memory of the MLC based flash memory device, the physical block number corresponds to the entry number in the ACPUM; and when the data transfer request is a read request, reading data from a physical page corresponding to the page number of the physical block number of the flash memory to a page buffer, and sending a request data sector from the page buffer in accordance with the sector number;

when the data transfer request is a write request, writing page buffer contents to the physical page corresponding to the page number of the physical block number of the flash memory if the page buffer contents have been modified, writing a received data sector to the page buffer in accordance with the sector number and setting corresponding one of a plurality of sector update flags reflecting data sector just written to the page buffer.

16. The apparatus of claim 15, wherein said plug connector includes an interface circuit of one of Universal Serial Bus (USB), Secure Digital (SD), Micro SD, Multi-Media Card (MMC), Compact Flash (CF), Memory Stick (MS), PCI-Express, a Integrated Drive Electronics (IDE), Serial Advanced Technology Attachment (SATA), external SATA, Radio Frequency Identification (RFID), fiber channel and optical connection.

* * * * *